United States Patent [19]

Uemura et al.

[11] Patent Number: 5,200,636
[45] Date of Patent: Apr. 6, 1993

[54] SEMICONDUCTOR DEVICE HAVING E²PROM AND EPROM IN ONE CHIP

[75] Inventors: Teruo Uemura, Kawasaki; Takahide Mizutani; Naoki Hanada, both of Yokohama; Tatsuo Mori, Katsuta; Kazuyoshi Shinada, Yokohama, all of Japan

[73] Assignee: Kabushiki Kaisha Toshiba, Kawasaki, Japan

[21] Appl. No.: 594,173

[22] Filed: Oct. 10, 1990

[30] Foreign Application Priority Data

Oct. 11, 1989 [JP] Japan ................. 1-264453

[51] Int. Cl.⁵ ............... H01L 29/68; G11C 11/34
[52] U.S. Cl. ............................ 257/315; 365/185
[58] Field of Search ............ 357/23.5, 59, 54; 365/185

[56] References Cited

U.S. PATENT DOCUMENTS

| | | | |
|---|---|---|---|
| 4,393,474 | 7/1983 | McElroy | 365/200 |
| 4,597,159 | 7/1986 | Usami et al. | 29/571 |
| 4,613,956 | 9/1986 | Paterson et al. | 365/185 |
| 4,833,096 | 5/1989 | Huang et al. | 437/29 |
| 4,868,619 | 9/1989 | Mukherjee et al. | 357/23.4 |
| 4,990,979 | 2/1991 | Otto | 357/23.5 |
| 5,099,451 | 3/1992 | Sourgen et al. | 357/23.5 |

FOREIGN PATENT DOCUMENTS 58-166596 10/1983 Japan.
1-293569 11/1989 Japan.

*Primary Examiner*—Mark V. Prenty
*Attorney, Agent, or Firm*—Finnegan, Henderson, Farabow, Garrett & Dunner

[57] ABSTRACT

An E²PROM and an EPROM are formed on the same substrate. An E²PROM memory cell has a floating gate and a control gate. A tunnel insulating film is formed between the floating gate and source/drain regions, thereby constituting a memory cell of an "FLOTOX" type. An EPROM memory cell has a floating gate and a control gate, thus constituting a memory cell of an "SAMOS" type.

27 Claims, 49 Drawing Sheets

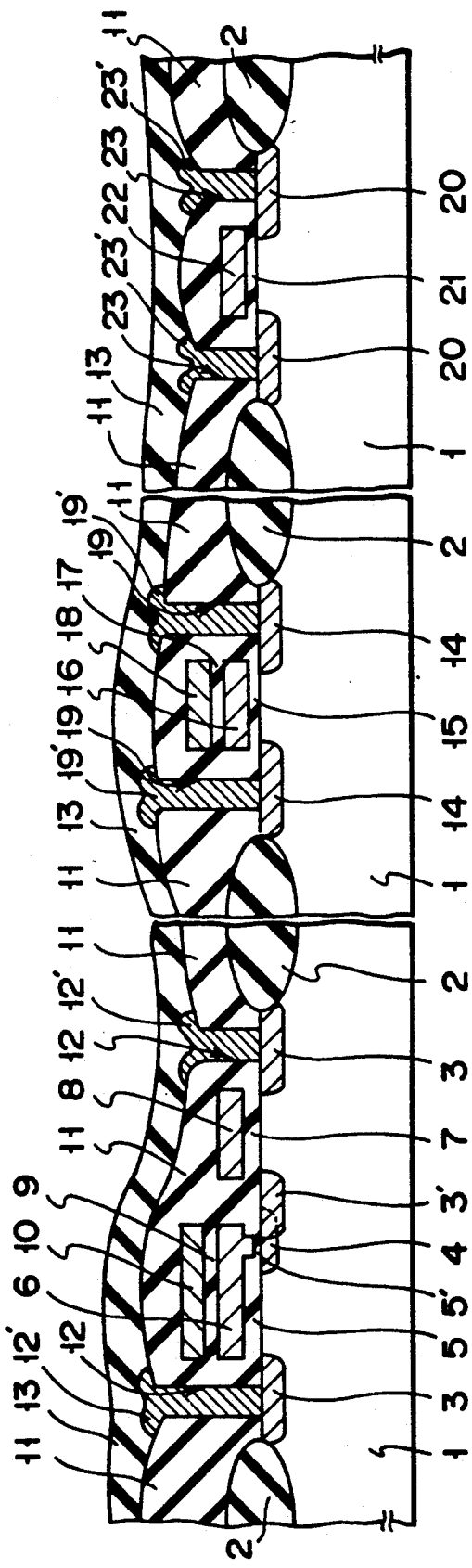
F I G. 1

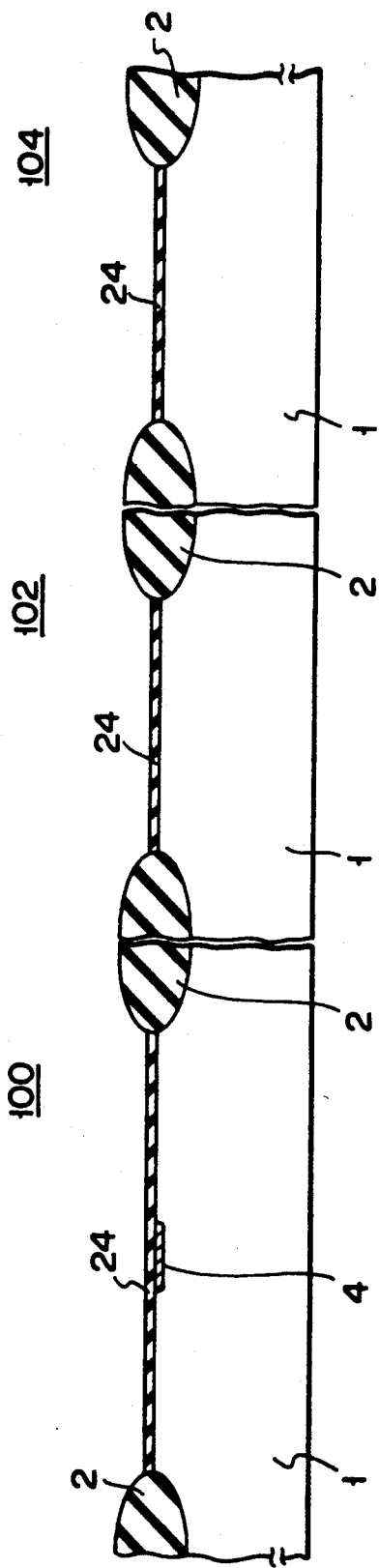
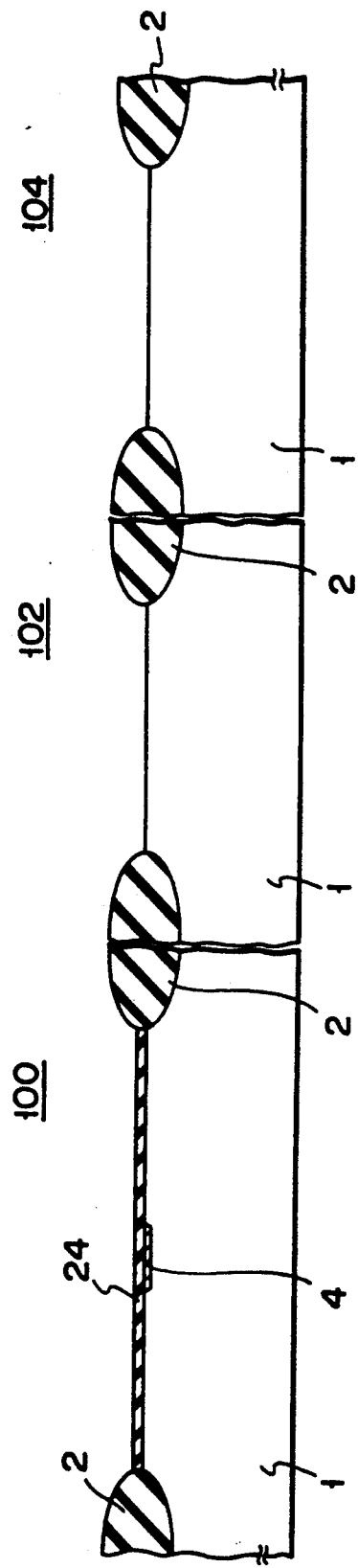
FIG. 2A
FIG. 2B

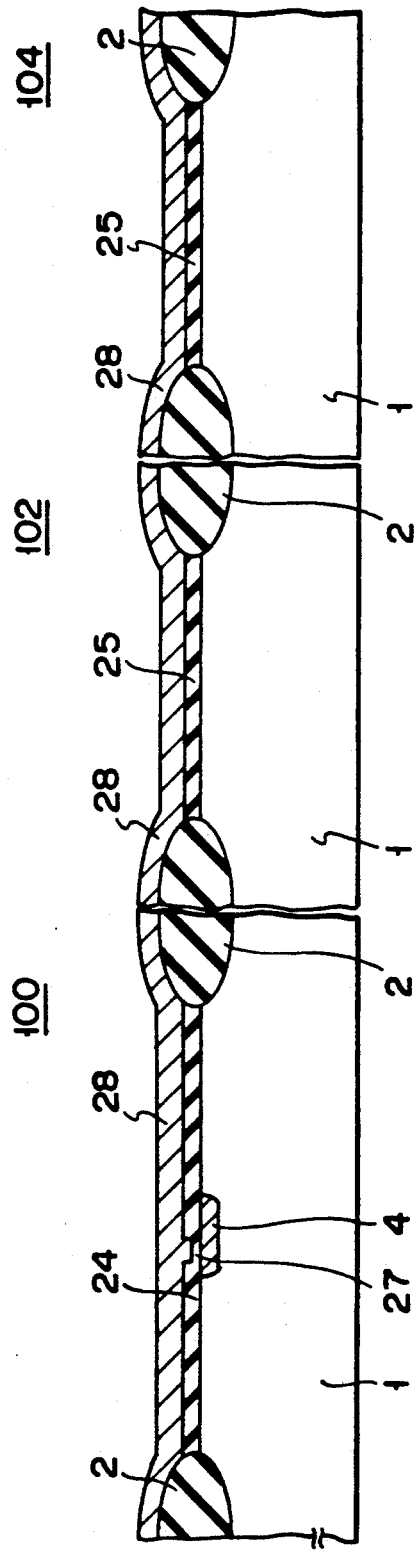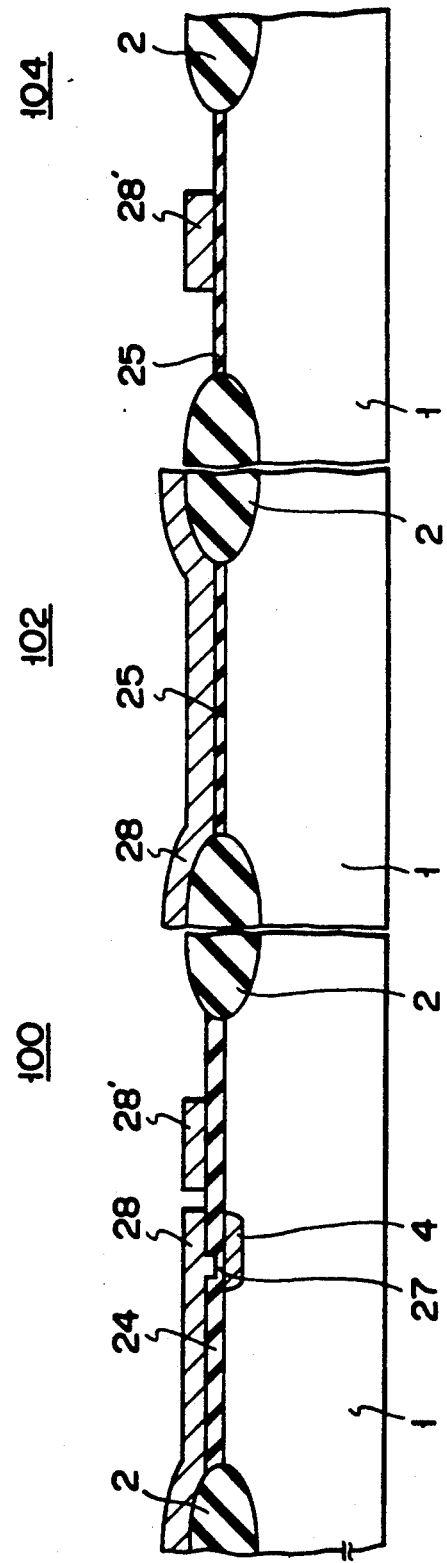

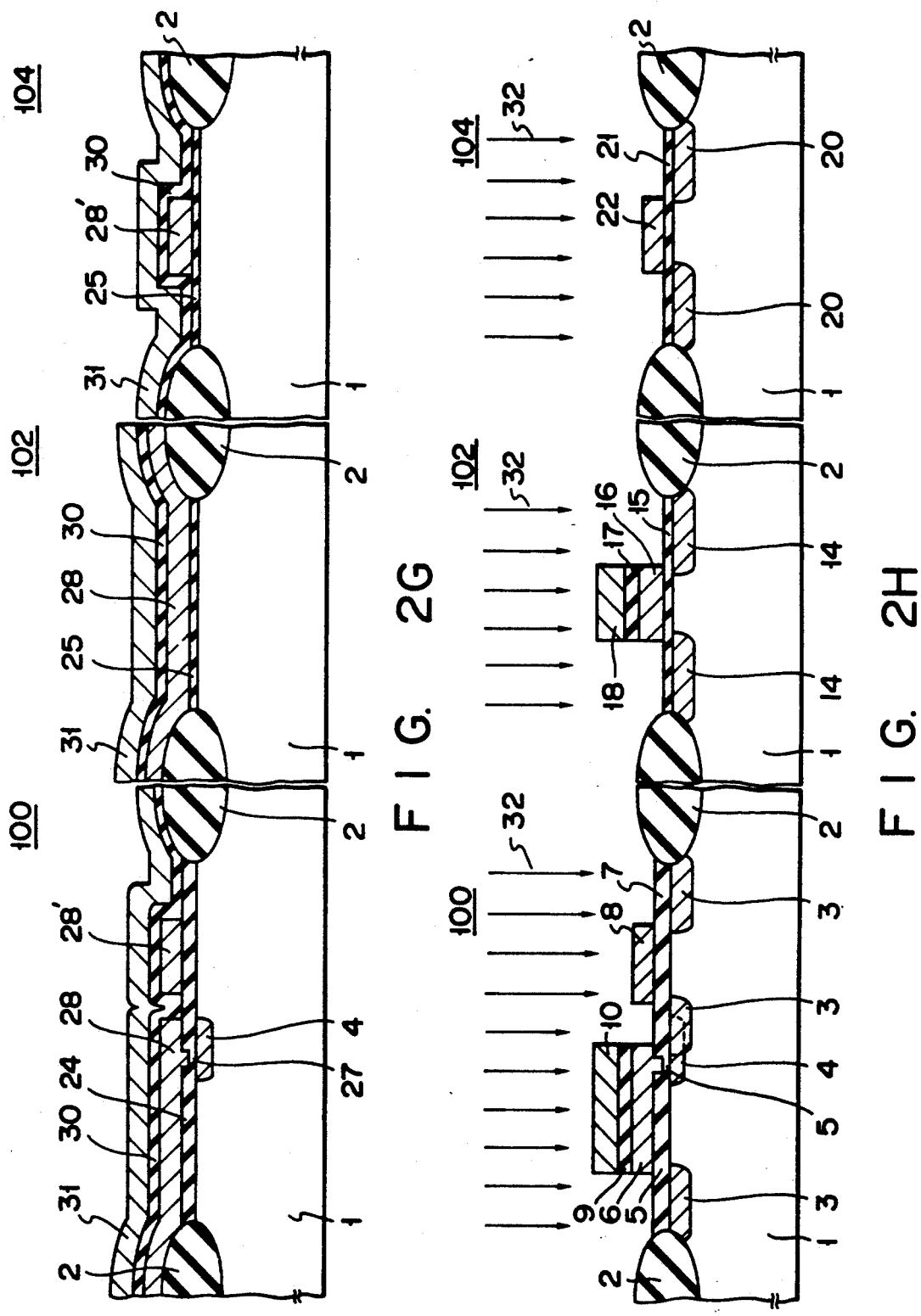

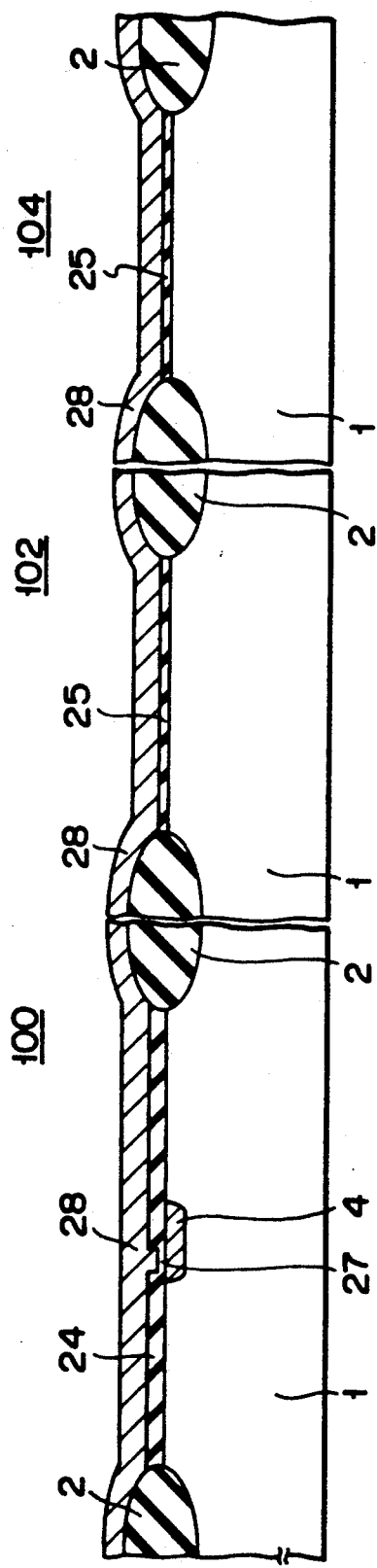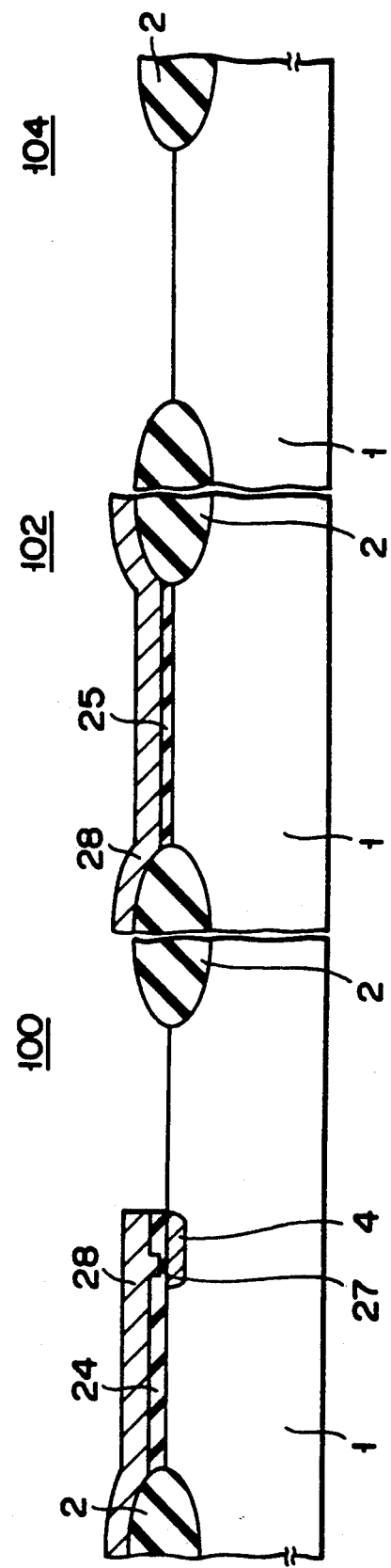

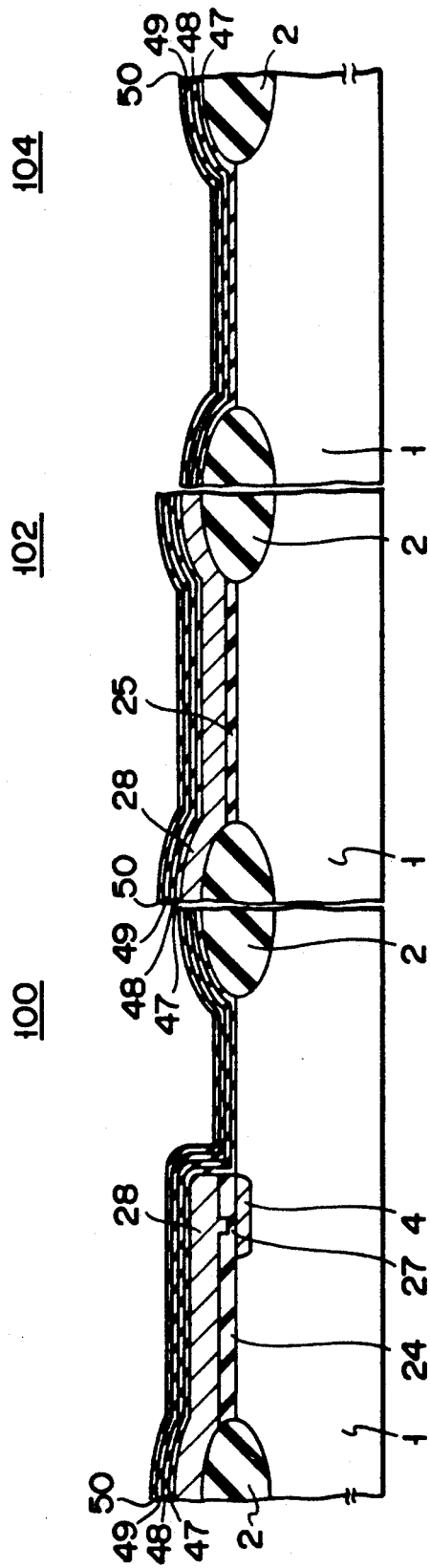
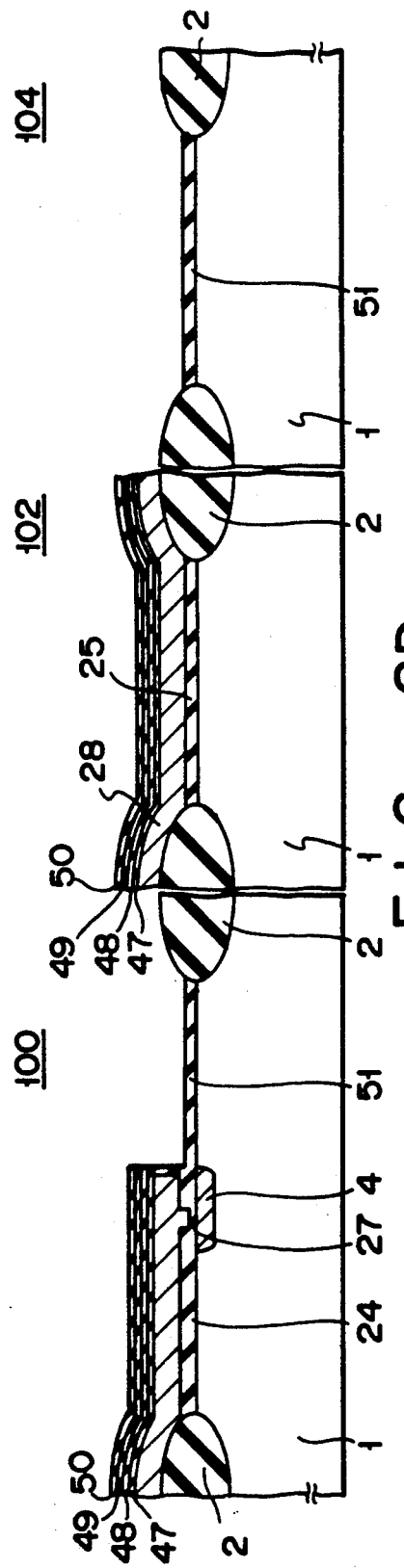

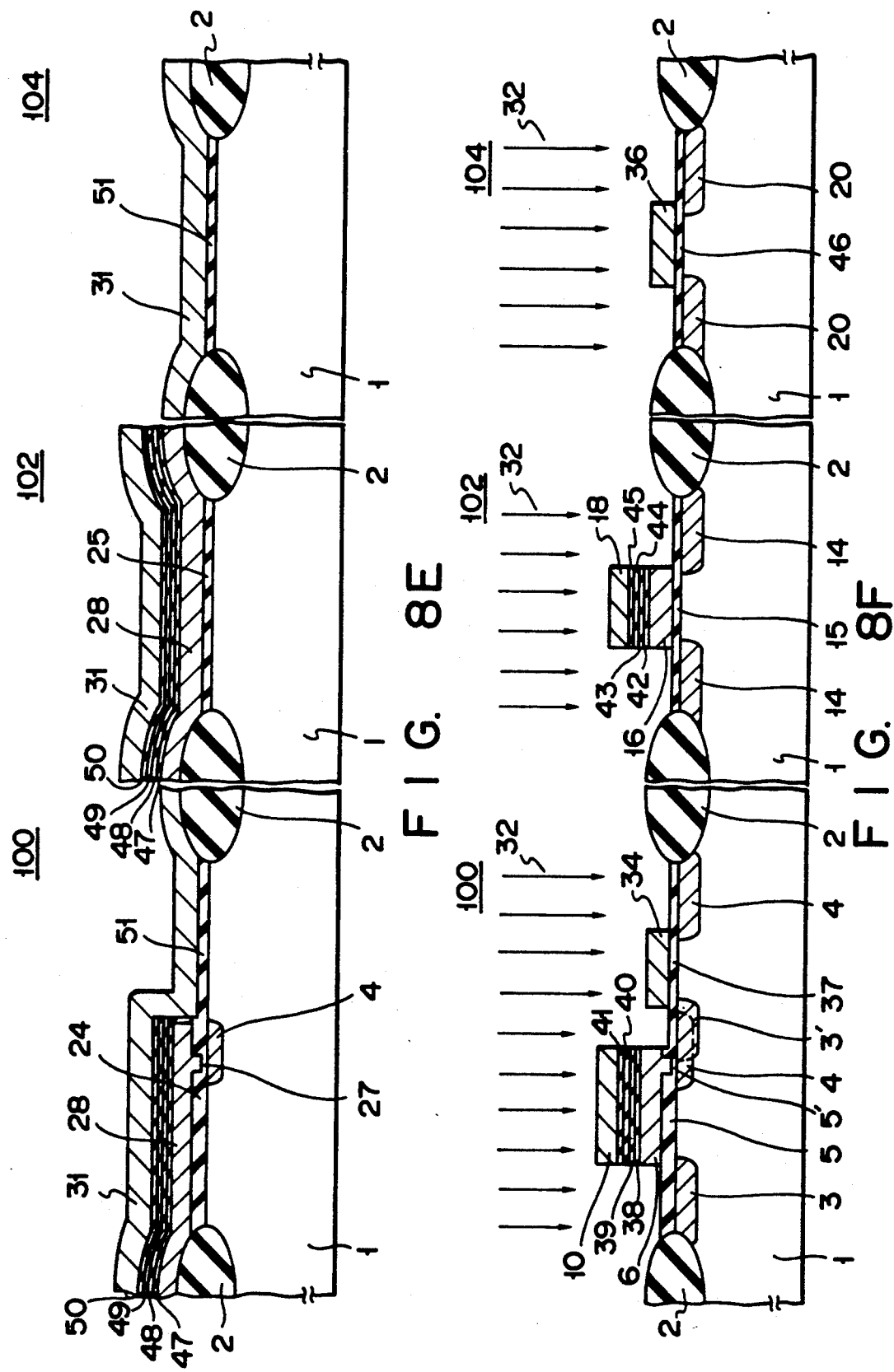

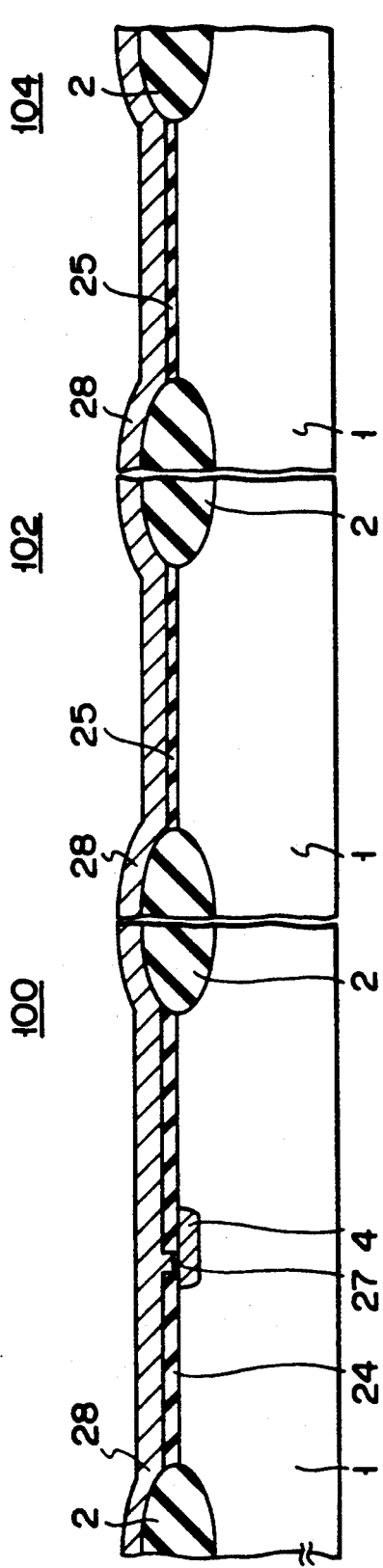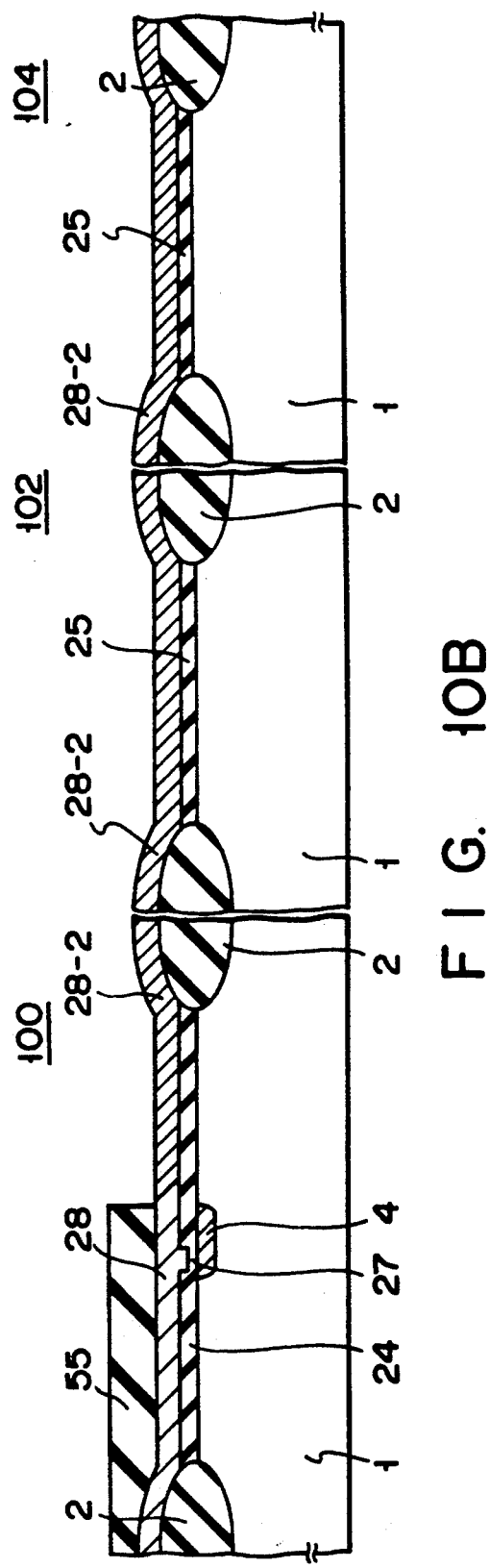

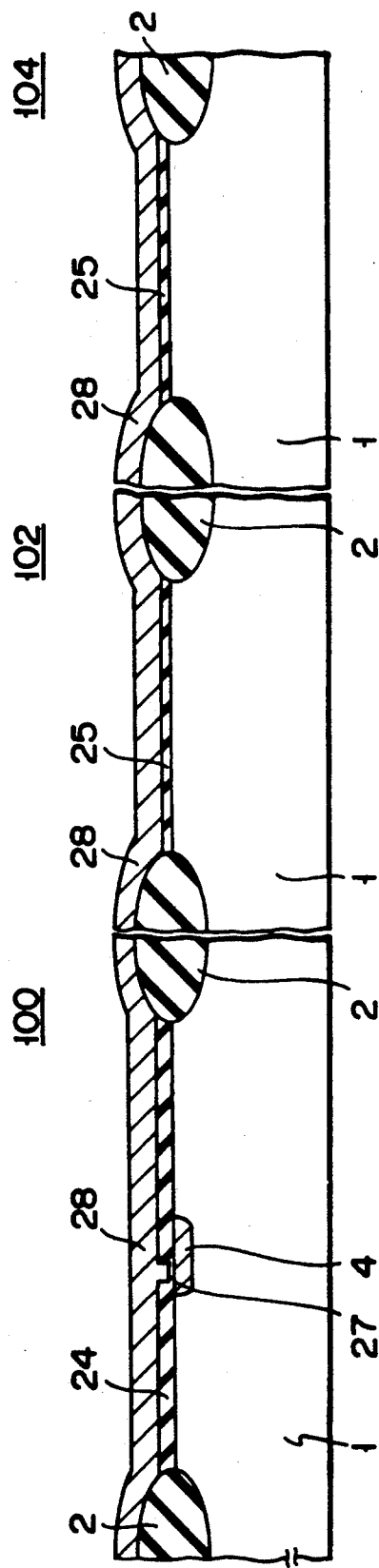
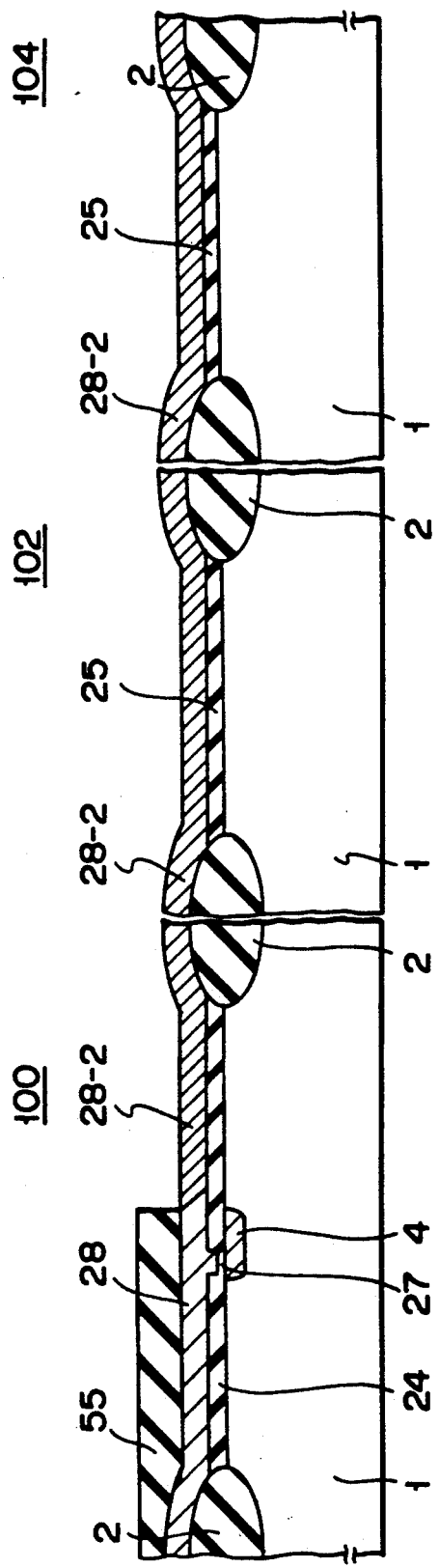

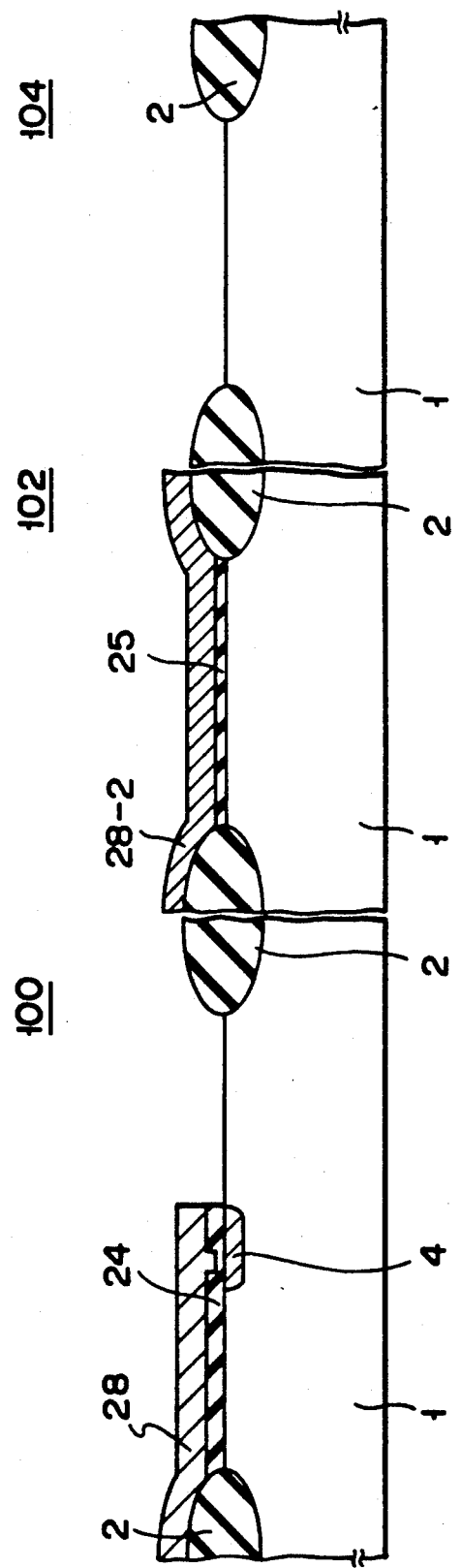
F I G. 13C

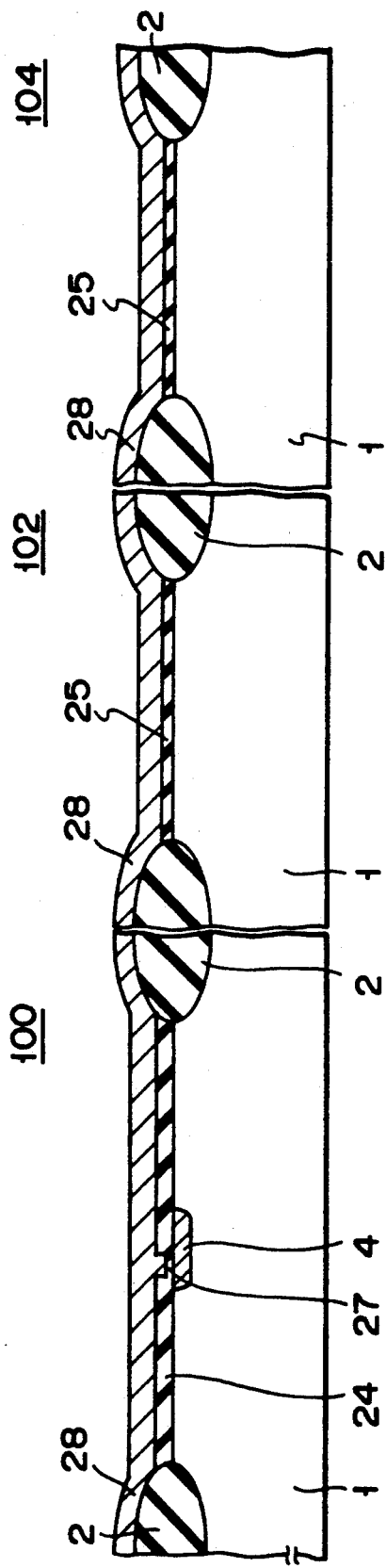
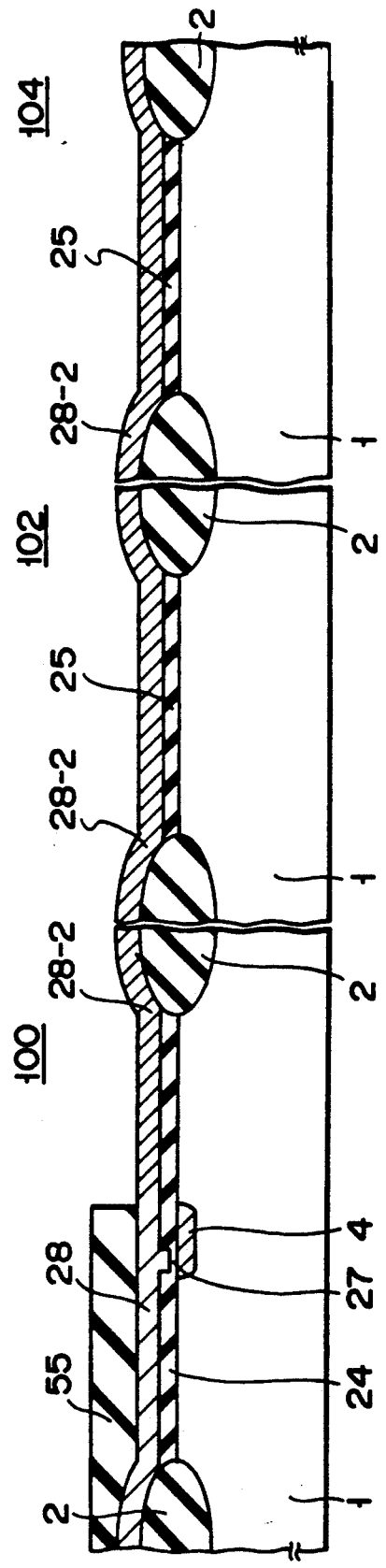
FIG. 16A
FIG. 16B

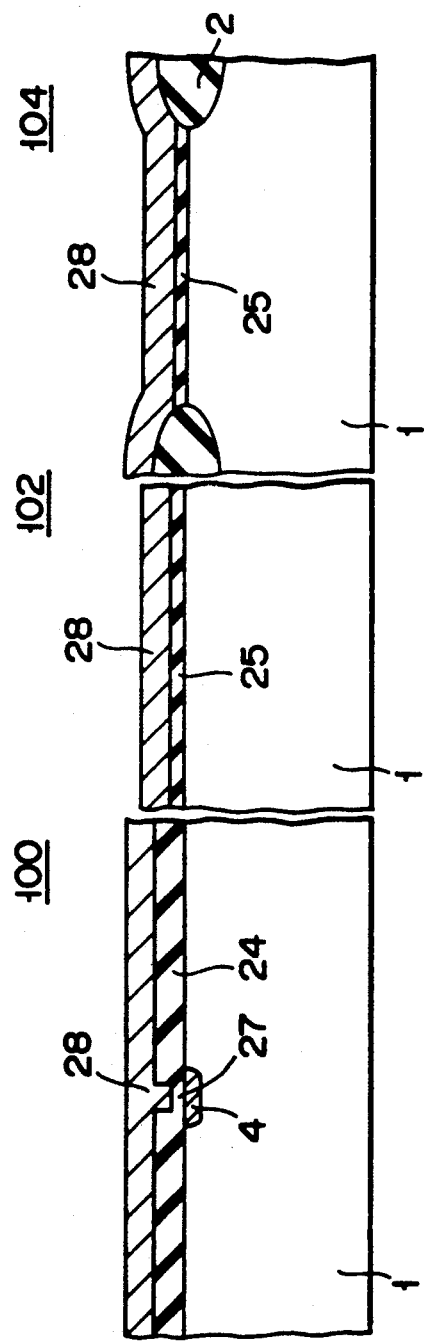
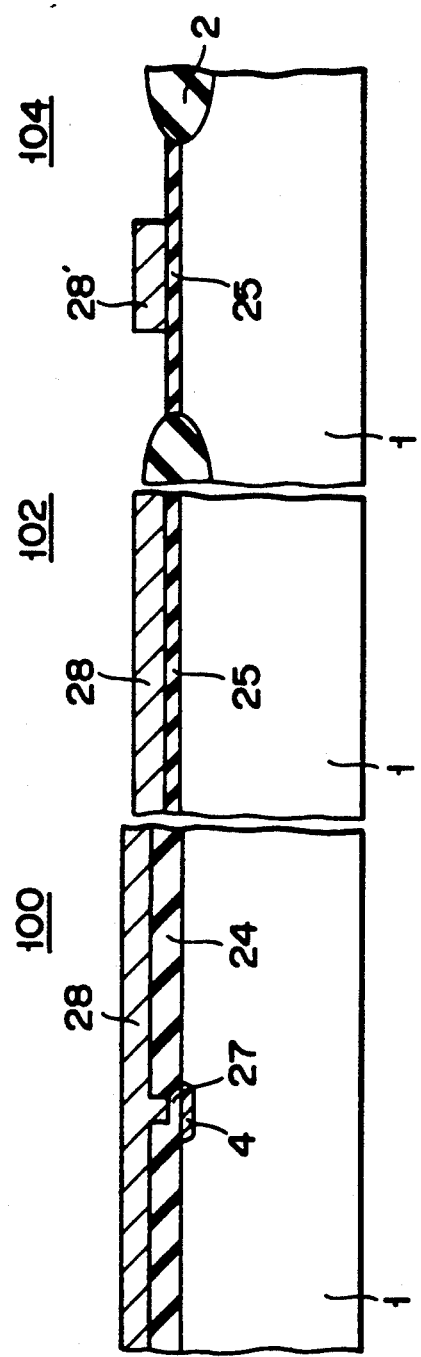
FIG. 18A
FIG. 18B

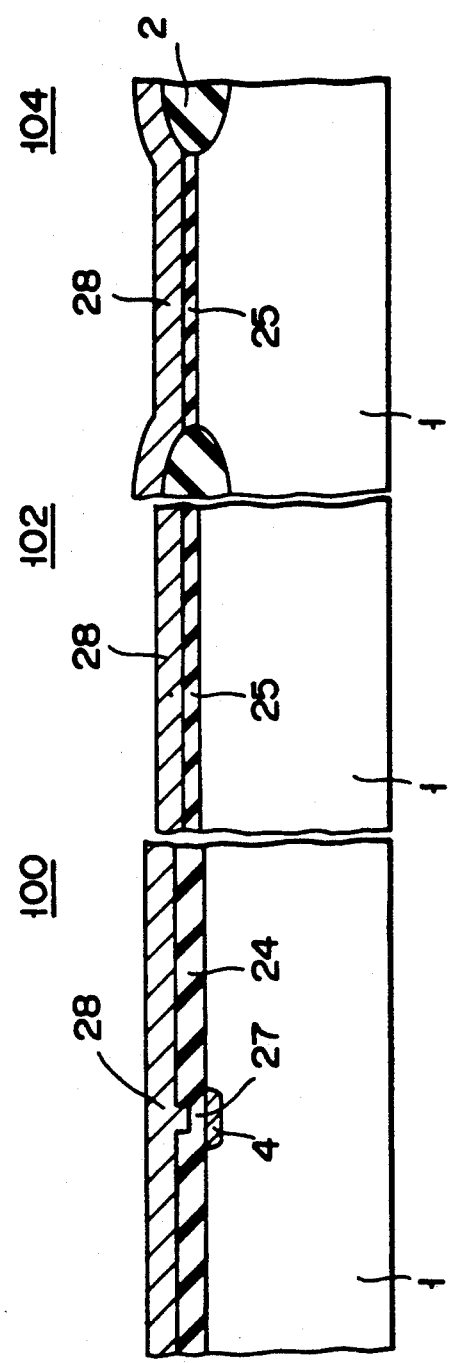
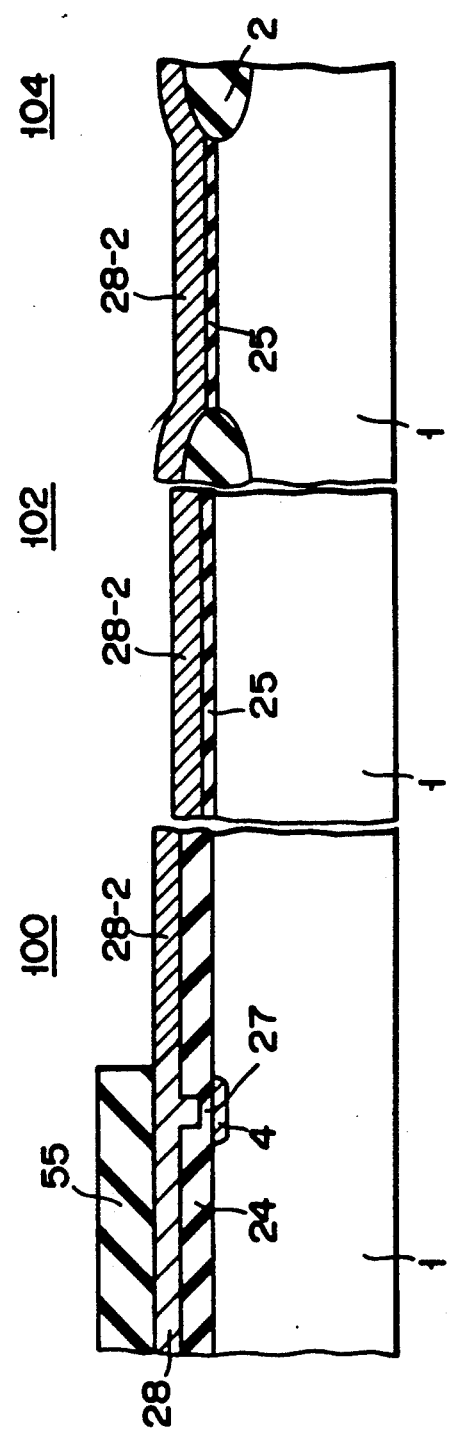
FIG. 21A
FIG. 21B

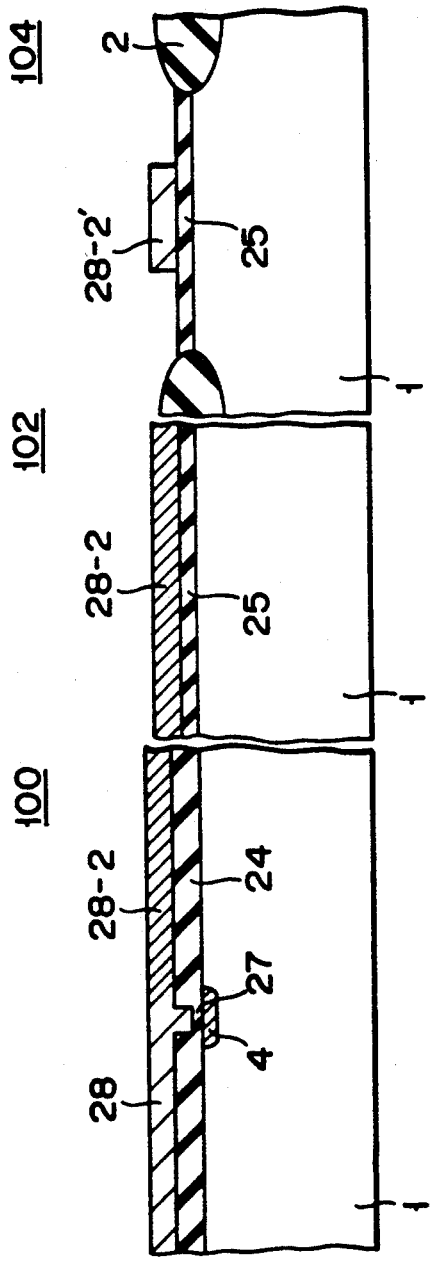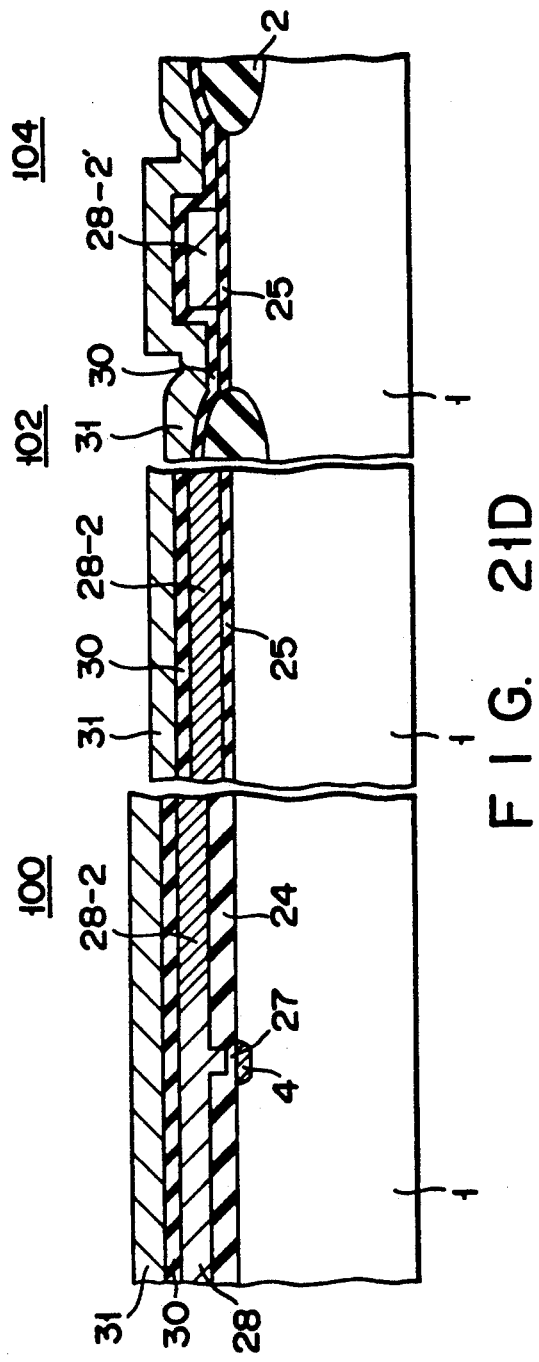

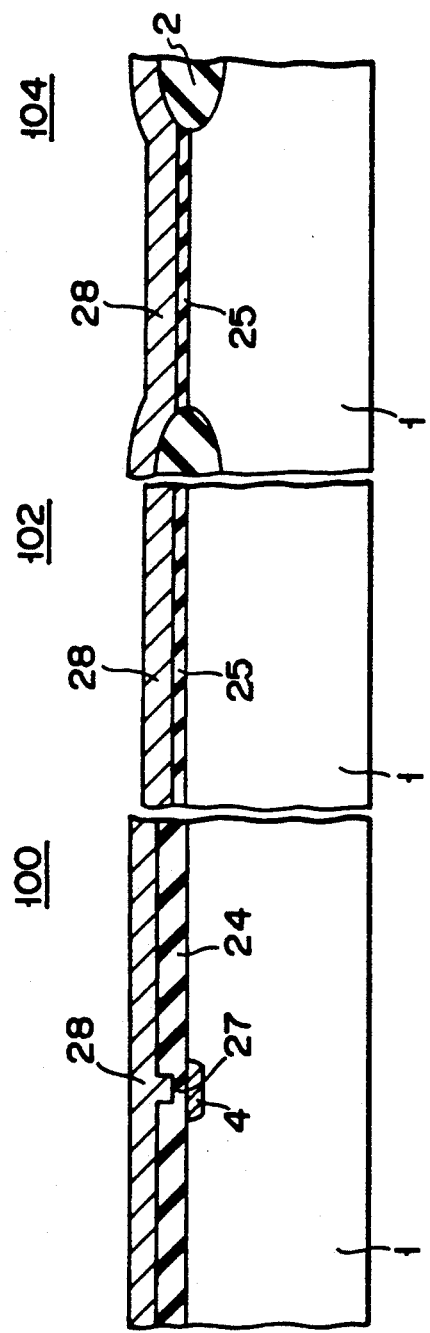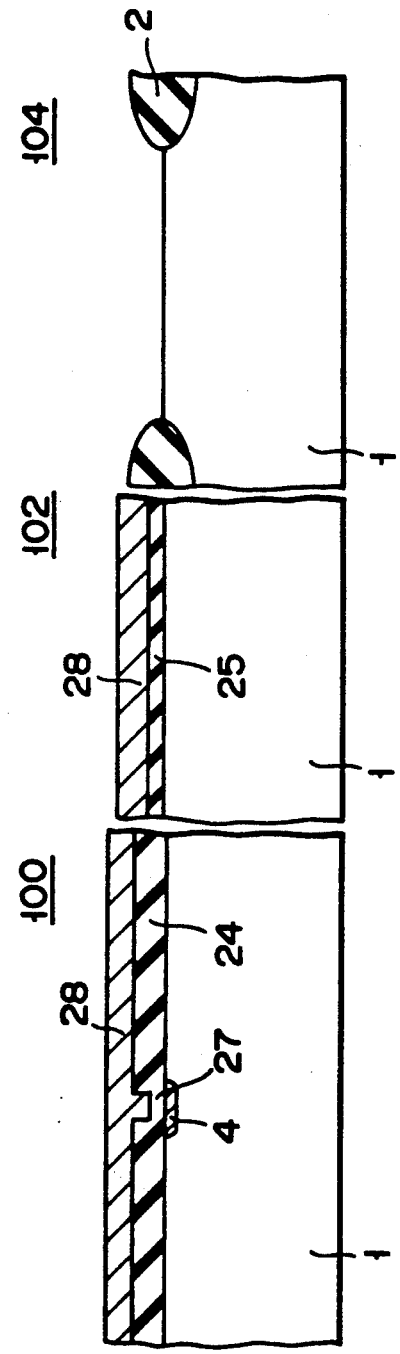
FIG. 24A
FIG. 24B

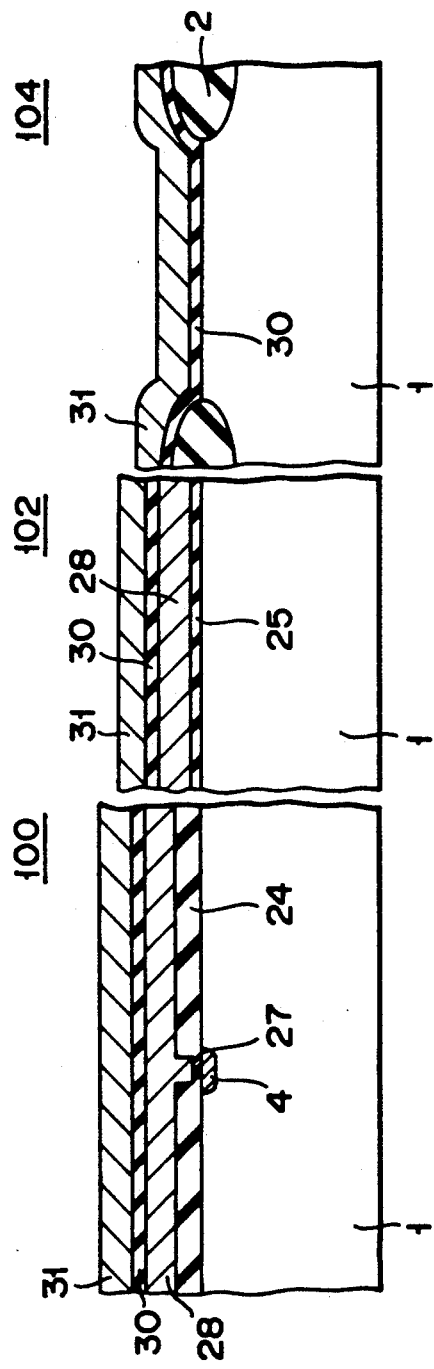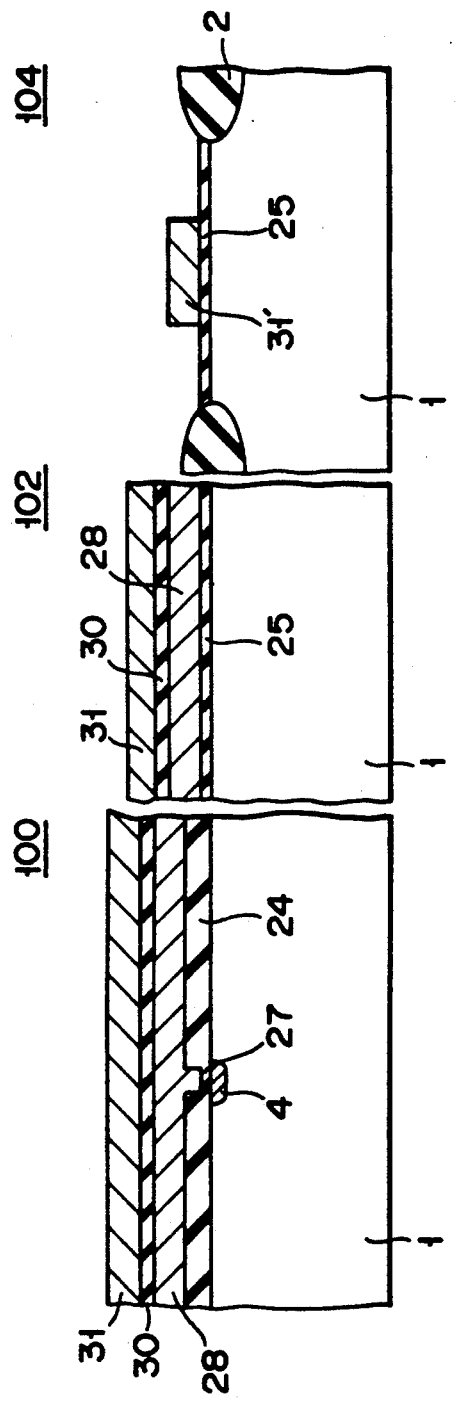

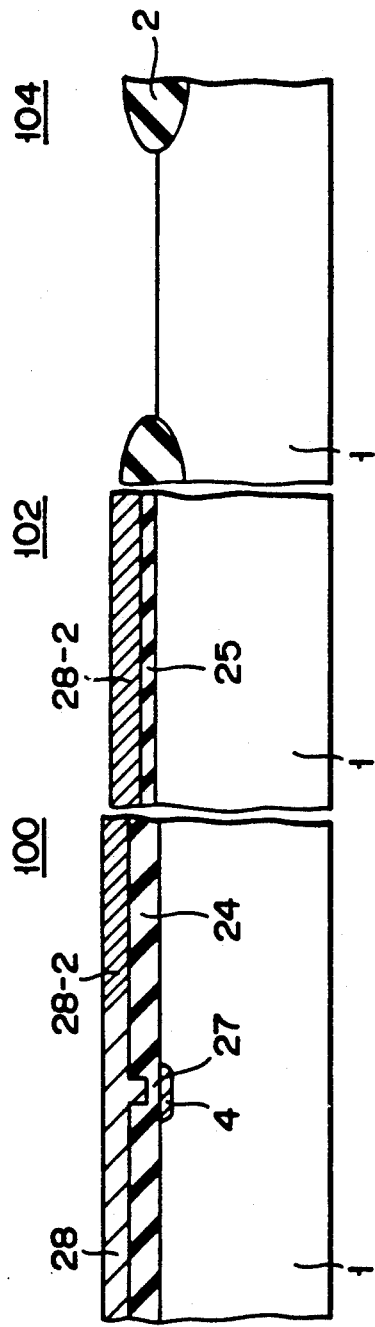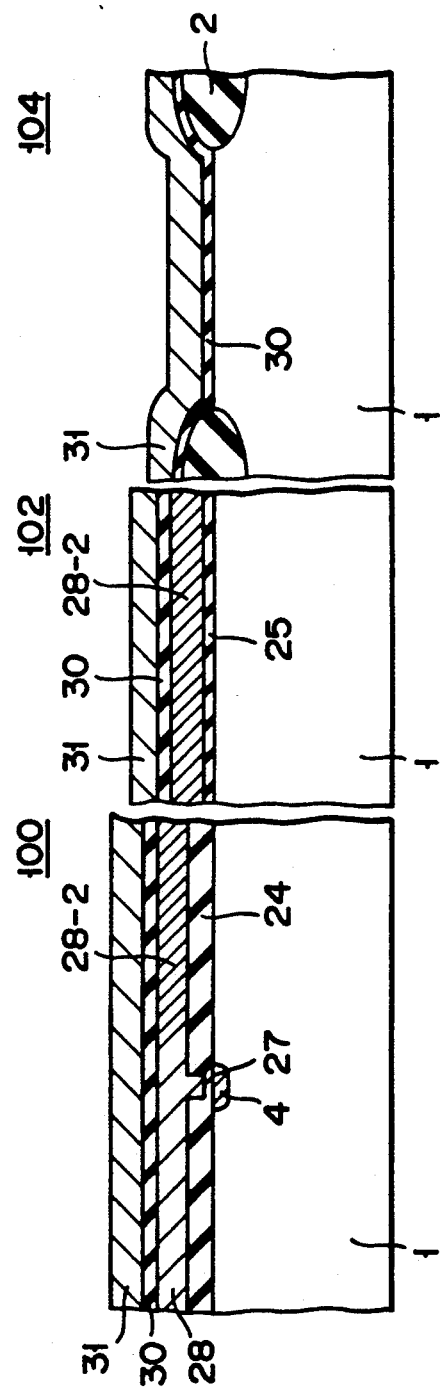

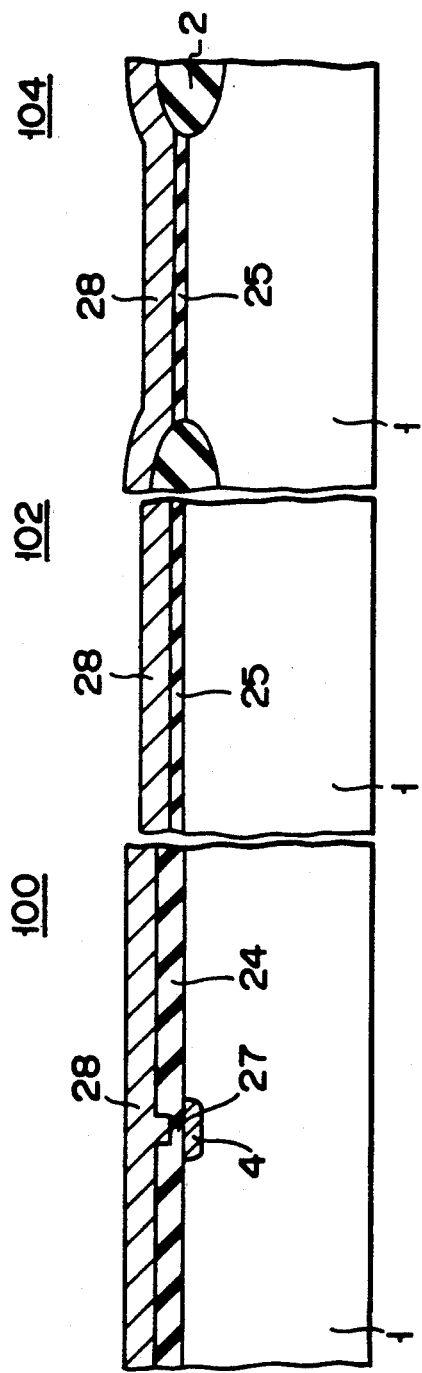
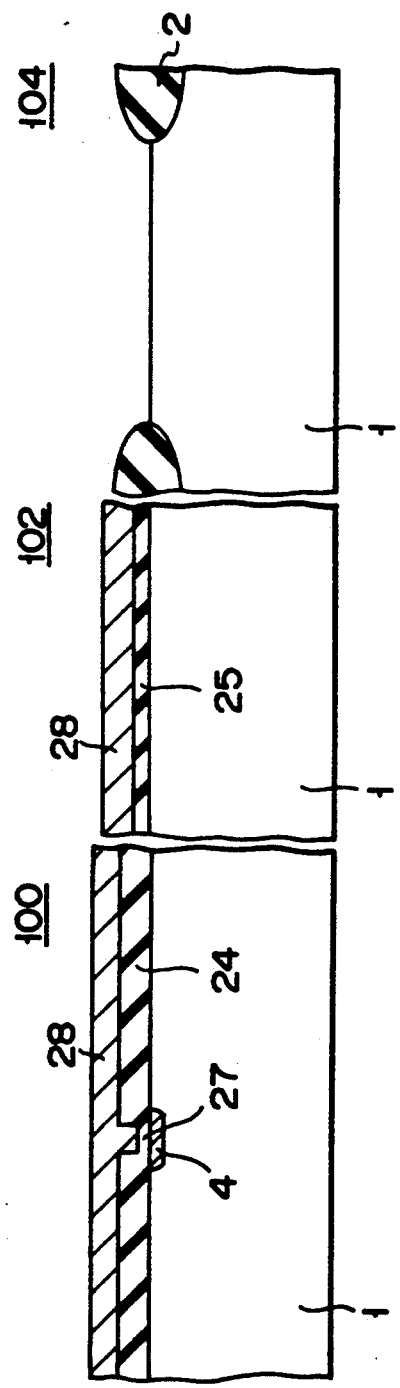
F I G. 30A
F I G. 30B

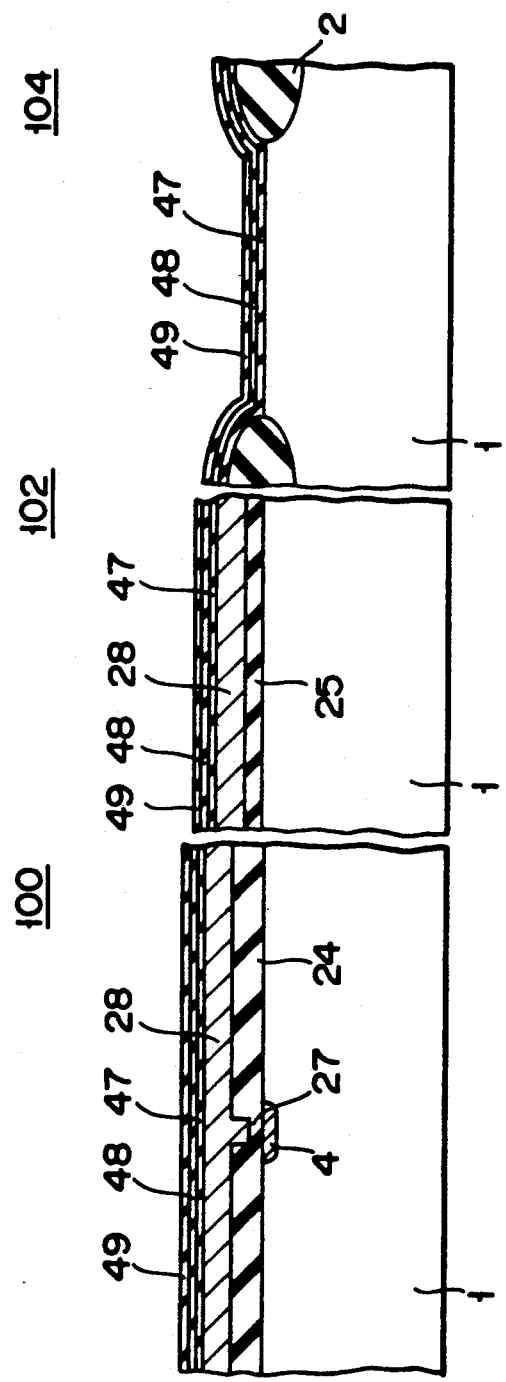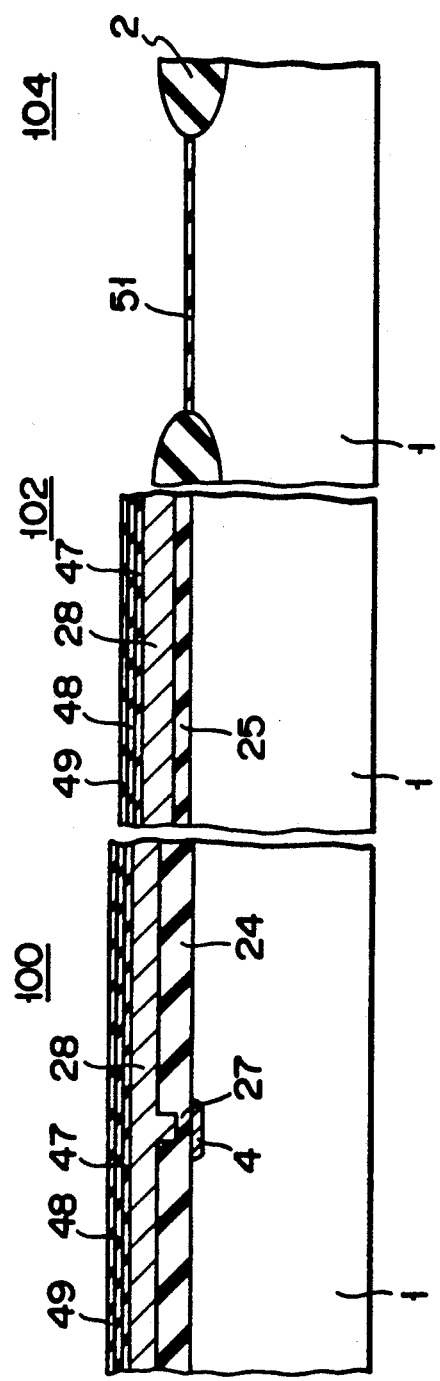
FIG. 30C
FIG. 30D

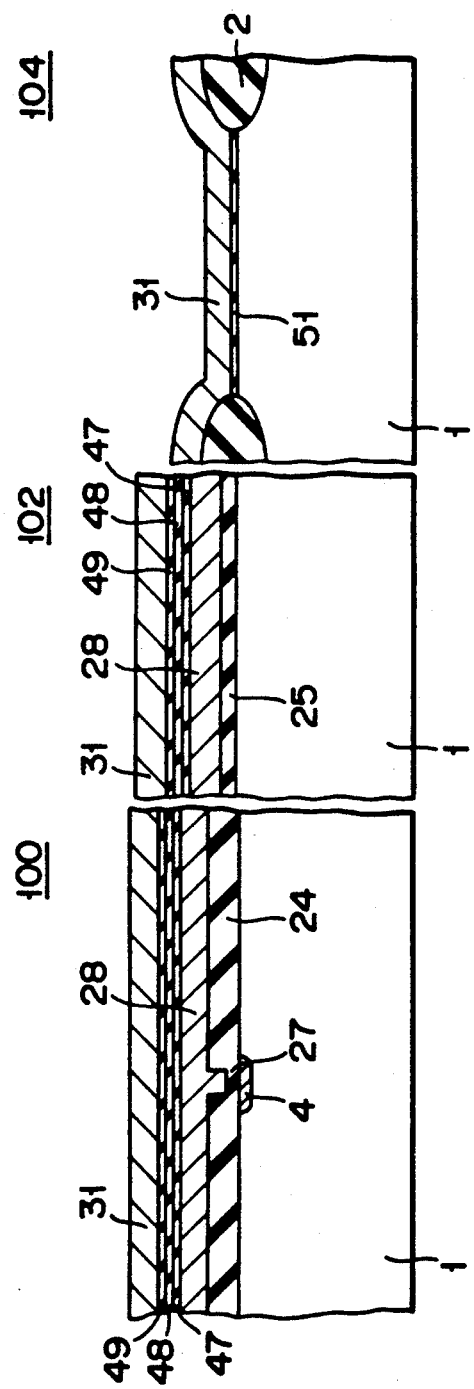
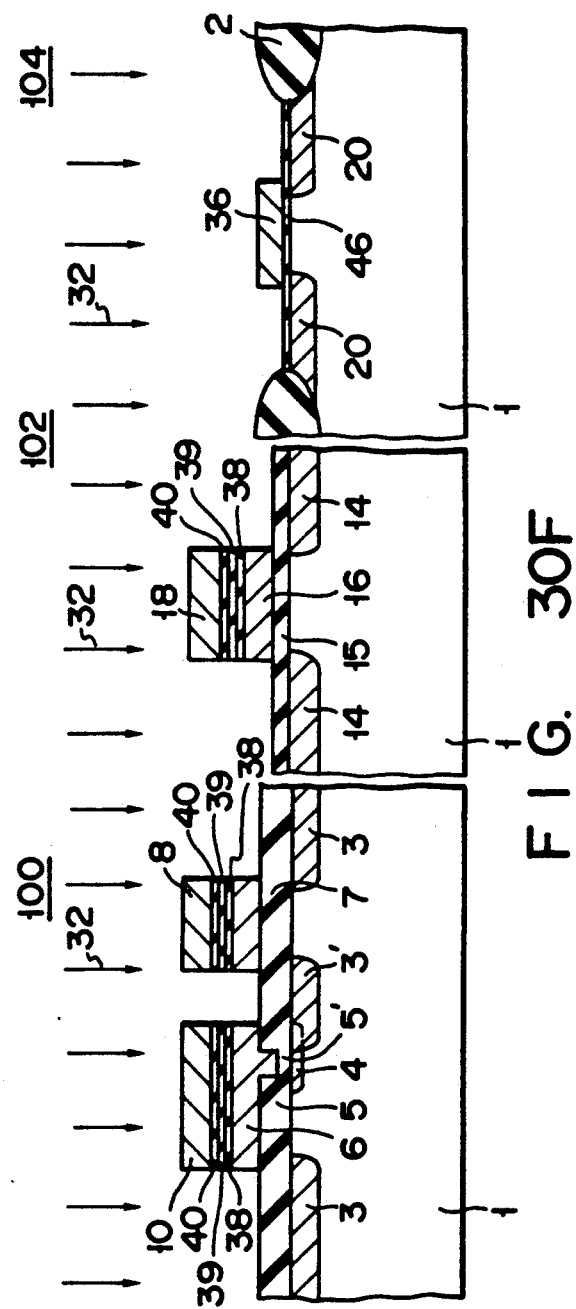
FIG. 30E
FIG. 30F

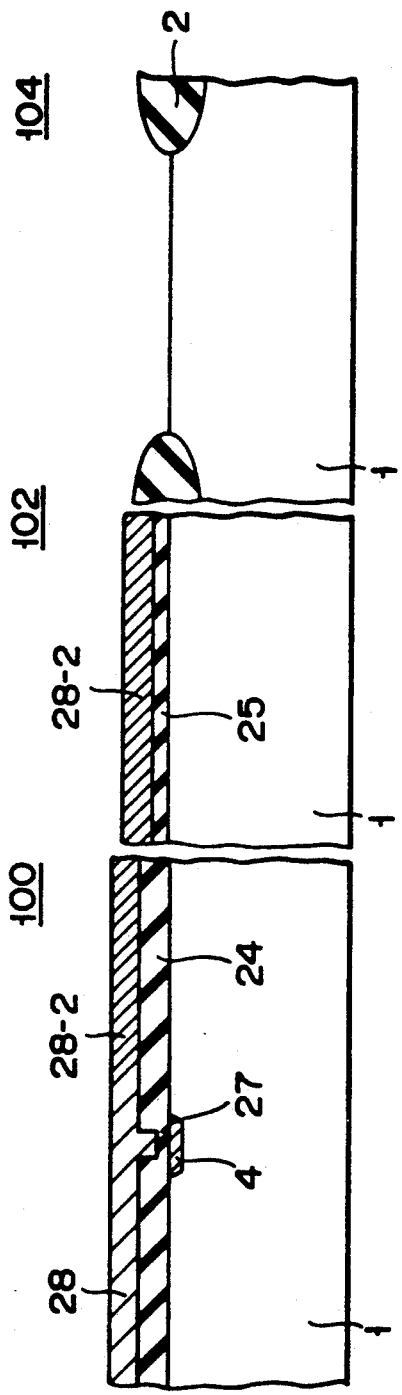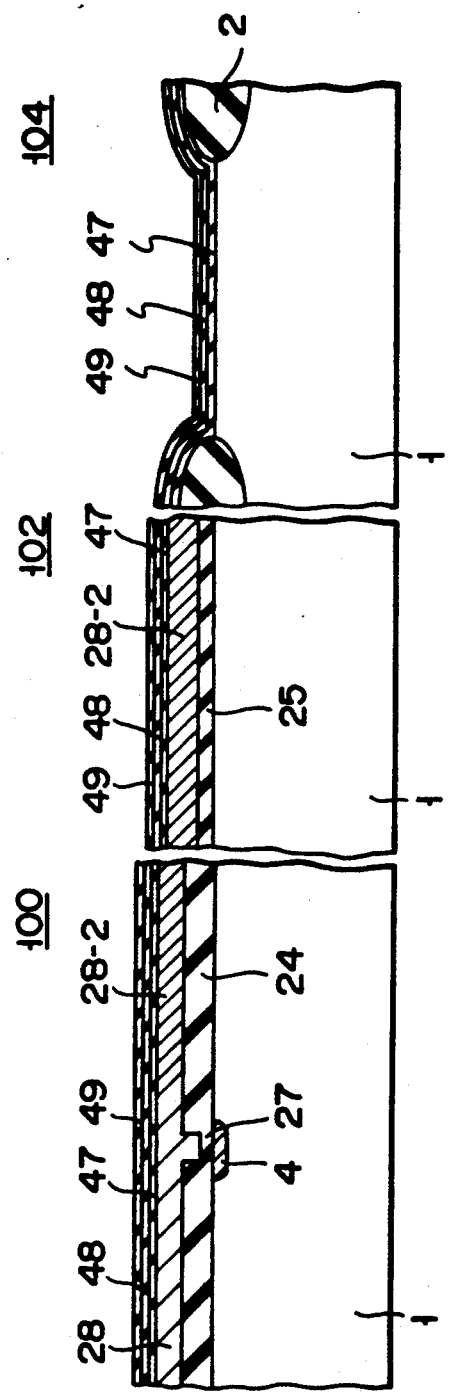
FIG. 32C
FIG. 32D

SEMICONDUCTOR DEVICE HAVING E²PROM AND EPROM IN ONE CHIP

BACKGROUND OF THE INVENTION

1. Field of the Invention

The present invention relates to a semiconductor and, more particularly, to a semiconductor device having an E²PROM and an EPROM in one chip.

2. Description of the Related Art

In a known conventional one-chip microcomputer, a RAM and a ROM are formed on one chip. In such a one-chip microcomputer having both RAM and ROM mounted on one chip, the RAM is constituted by an SRAM, and the ROM is constituted by an EPROM or the like.

The area per SRAM memory cell, however, is very large. For this reason, if the RAM is constituted by an SRAM, the area occupied by the RAM in one chip is increased, or the storage capacity of the RAM is undesirably decreased.

SUMMARY OF THE INVENTION

It is an object of the present invention to decrease the area occupied by a RAM in one chip and to increase the storage capacity of the RAM.

In order to achieve the above object, according to the present invention, there is provided a semiconductor device characterized by comprising a semiconductor substrate of a first conductivity type having a major surface, first, second, third, and fourth semiconductor regions of a second conductivity type which are separately formed in a major surface region of the substrate, first carrier storage means, formed above the substrate between the first and second semiconductor regions, for storing carriers, first insulating means, formed between the first carrier storage means and the substrate, for electrically insulating the first carrier storage means from the substrate, a first conductive layer formed above the first carrier storage means and having a sheet resistance of ρsA, second insulating means, formed between the first conductive layer and the first carrier storage means, for insulating the first conductive layer from the first carrier storage means, second carrier storage means, formed above the substrate between the third and fourth semiconductor regions and formed above the fourth region so as to partly overlap the fourth region, for storing carriers, third insulating means, formed between the second carrier storage means, the substrate, and the fourth semiconductor region, for electrically insulating the second carrier storage means from the substrate and the fourth semiconductor region, a second conductive layer formed above the second carrier storage means and having a sheet resistance of ρsB, fourth insulating means, formed between the second conductivity layer and the second carrier storage means, for insulating the second conductivity layer from the second carrier storage means, and tunneling means, formed in the third insulating means between the fourth semiconductor region and the second carrier storage means, for causing carriers to tunnel between the second carrier storage means and the fourth semiconductor region.

According to the semiconductor device having the above-described arrangement, first and second carrier storage layers are arranged. A tunnel insulating film is formed on a third insulating layer between the second carrier storage layer and a fourth semiconductor region serving as a source/drain region. With this arrangement, carriers can be electrically injected and extracted in and from the second carrier storage layer. That is, the second carrier storage layer serves as a floating gate of an E²PROM memory cell. The E²PROM capable of electrically writing and erasing data is used as a RAM. The area of one E²PROM memory cell is smaller than that of one SRAM memory cell. Therefore, if the RAM is constituted by E²PROM memory cells, the area occupied by the RAM in one chip can be decreased, and the storage capacity of the RAM can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing a semiconductor device according to the first embodiment of the present invention;

FIGS. 2A to 2H are sectional views showing the steps in manufacturing the semiconductor device according to the first embodiment of the present invention;

FIGS. 8A to 8F are sectional views showing the steps in manufacturing the semiconductor device according to the third embodiment of the present invention;

FIGS. 10A to 10C are sectional views showing the steps in manufacturing the semiconductor device according to the fourth embodiment of the present invention;

FIGS. 13A to 13C are sectional views showing the steps in manufacturing the semiconductor device according to the fifth embodiment of the present invention;

FIGS. 16A to 16D are sectional views showing the steps in manufacturing the semiconductor device according to the sixth embodiment of &:he present invention;

FIGS. 18A to 18E are sectional views showing the steps in manufacturing the semiconductor device according to the seventh embodiment of the present invention;

FIGS. 21A to 21D are sectional views showing the steps in manufacturing the semiconductor device according to the eighth embodiment of the present invention;

FIGS. 24A to 24E are sectional views showing the steps in manufacturing the semiconductor device according to the ninth embodiment of the present invention;

FIGS. 27A to 27D are sectional views showing the steps in manufacturing the semiconductor device according to the tenth embodiment of the present invention;

FIGS. 30A to 30F are sectional views showing the steps in manufacturing the semiconductor device according to the eleventh embodiment of the present invention;

FIG. 32A to 32D are sectional views showing the steps in manufacturing the semiconductor device according to the twelfth embodiment of the present invention.

DETAILED DESCRIPTION OF THE PREFERRED EMBODIMENTS

Figure 2C:
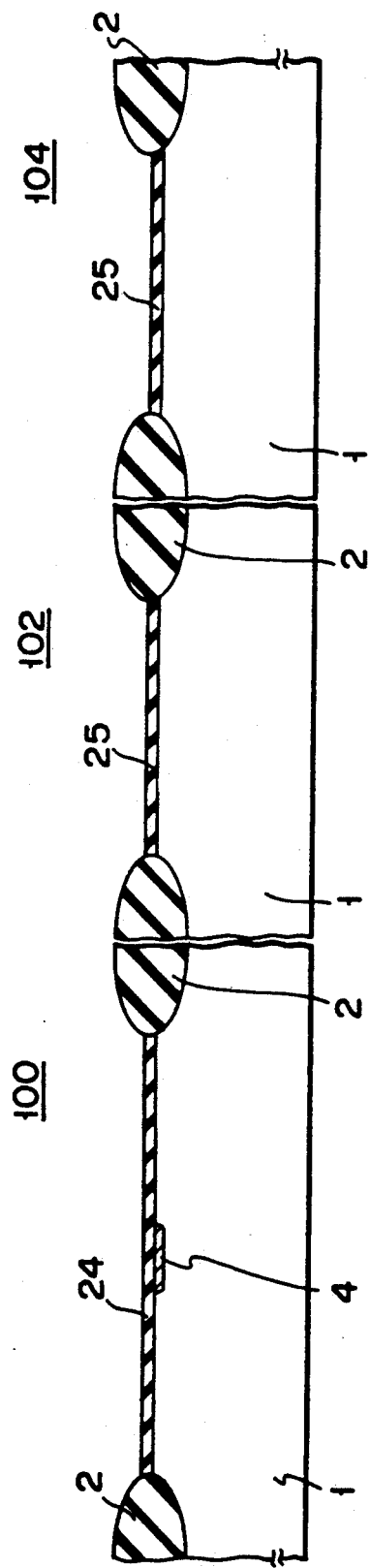

Semiconductor devices each having an E$^2$PROM and an EPROM in one chip according to embodiments of the present invention will be described below with reference to the accompanying drawings.

FIG. 1 is a sectional view showing a semiconductor device according to the first embodiment of the present invention.

As shown in FIG. 1, field oxide films 2 are formed on a semiconductor substrate, e.g., a silicon substrate 1. With this arrangement, element isolation is performed.

An element structure in an EPROM memory cell region will be described first. In the upper surface region of the substrate 1, source/drain regions 3 and 3' each having a conductivity type opposite to that of the substrate 1, and an impurity layer 4 are formed. The impurity layer 4 is in contact with the source/drain region 3'. The impurity layer 4 and the source/drain region 3' constitute an integral diffusion region. A first gate insulating film 5 is formed on the substrate 1 between one of the source/drain regions 3 and the source/drain region 3'. The first gate insulating film 5 consists of, e.g., a silicon oxide film, and has a thickness of, e.g., about 430 Å. A tunnel insulating film 5' is formed on the impurity layer 4. The tunnel insulating film 5' consists of, e.g. a silicon oxide film having a thickness of about 100 Å. A floating gate 6 consisting of a first polysilicon layer is formed on the first gate insulating film 5 and the tunnel insulating film 5'. A gate insulating film 7 is formed on the substrate 1 between another source/drain region 3 and the source/drain region 3'. The gate insulating film 7 consists of, e.g., a silicon oxide film and has a thickness of, e.g., about 430 Å. The thickness of the film 7 is almost the same as that of the first gate insulating film 5. A gate 8 consisting of the first polysilicon layer is formed on the gate insulating film 7. A transistor which has this gate 8 is a select transistor for selecting an E$^2$PROM memory cell. In this specification, a transistor having the gate 8 will be respectively referred to as a "select transistor" and a "select gate" hereinafter. In addition, a transistor which has the floating gate 6 and a control gate 10 will be referred to as a "memory cell transistor" hereinafter. A second gate insulating film 9 consisting of, e.g., a silicon oxide film is formed on the floating gate 6. The control gate 10 consisting of a second polysilicon layer is formed on the second gate insulating film 9. An insulating interlayer 11 is formed on the entire upper surface of the device. Contact holes 12 are formed in the insulating interlayer 11 so as to communicate with the source/drain regions 3. Wires 12' consisting of, e.g., aluminum are respectively formed in the contact holes 12. A surface protective film 13 is formed on the insulating interlayer 11.

An element structure in an EPROM memory cell region will be described below. In the upper surface of the substrate 1, source/drain regions 14 each having a conductivity type opposite to that of the substrate 1 are formed. A first gate insulating film 15 is formed on the substrate 1 between the source/drain regions 14. A first gate insulating film 15 consists of, e.g., a silicon oxide film and has a thickness of about 250 Å. A floating gate 16 consisting of a first polysilicon layer is formed on the first gate insulating film 15. A second gate insulating film 17 consisting of, e.g., a silicon oxide film is formed on the floating gate 16. A control gate 18 consisting of a second polysilicon layer is formed on the second gate insulting film 17. The insulating interlayer 11 is formed on the upper entire surface of the device. Contact holes 19 are formed in the insulating interlayer 11 to communicate with the source/drain regions 14. Wires 19' consisting of, e.g., aluminum are respectively formed in the contact holes 19. The surface protective film 13 is formed on the insulating interlayer 11.

Note that each of the E²PROM and the EPROM shown in FIG. 1 is of a so-called "two-bus scheme" in which the wires are respectively connected to the source and drain.

An element structure in a MOSFET region will be described below. In the upper surface of the substrate 1, source/drain regions 20 each having a conductivity type opposite to that of the substrate 1 are formed. A gate insulating film 21 is formed on the substrate 1 between the source/drain regions 20. This gate insulating film 21 consists of, e.g., a silicon oxide film and has a thickness of, e.g., about 250 Å. A gate 22 of a MOSFET constituting a peripheral circuit (e.g., various types of decoders), a logic circuit, or the like is formed on the gate insulating film 21. The gate 22 consists of a first polysilicon layer. An insulating interlayer 11 is formed on the entire upper surface of the device. Contact holes 23 consisting of, e.g., aluminum are in the insulating interlayer 11 so as to communicate with the source/drain regions 20. Wires 23' consisting of, e.g., aluminum are respectively formed in the contact holes 23. The surface protective film 13 is formed on the insulating interlayer 11.

In the semiconductor device having the above-described arrangement, a memory cell having the floating gate 6, which is formed above the impurity layer 4 such that they partly overlap each other, is formed. The tunnel insulating film 5' having a thickness of about 100 Å is formed between the floating gate 6 and the impurity layer 4 to constitute a nonvolatile memory cell called a "FLOTOX (floating-gate tunnel oxide)". Data is stored depending on whether the memory cell transistor is turned on in accordance with the charge state of the floating gate 6. Carriers (electrons) are injected into the floating gate 6 by, e.g., applying a positive potential to the control gate 10 and grounding the source/drain region 3'. With this operation, the electrons from the source/drain region 3' tunnel through the tunnel insulating film 5' and are injected into the floating gate 6.

Carriers (electrons) are extracted from the floating gate 6 by, e.g., applying a positive potential to the source/drain region 3' and grounding the control gate 10. With this operation, the electrons tunnel through the tunnel insulating film 5' and are injected into the source/drain region 3'.

The memory cell having the floating gate 6, therefore, can electrically write and erase data In addition, the semiconductor device having the above-described arrangement includes a memory cell having a floating gate 16 formed between the control gate 18 and the substrate 1 and having no tunnel insulating film. A memory cell of this type is a nonvolatile memory cell called an "SAMOS (Stacked-gate Avalanche-injection MOS)". The memory cell has no tunnel insulating film. For this reason, injection of carriers (electrons) into the floating gate 16 is performed by, e.g., generating hot electrons in the substrate 1 (channel) between the source and the drain, applying a positive potential to the control gate 18, and injecting the hot electrons into the floating gate 16. Extraction of carriers (electrons) from the floating gate 16 is performed by, e.g., exciting electrons in the floating gate 16 upon radiation of ultraviolet rays, and causing the electrons to escape to the source/drain regions 14 and the like over the barrier of the gate insulating film 15.

The memory cell having the floating gate 16, therefore, can electrically write data and can erase data by an erase method other than an electrical method, e.g., a method using ultraviolet rays or the like.

According to such a semiconductor device, an E²PROM capable of electrically erasing data and an EPROM capable of erasing data by an erase method other than an electrical method are formed on the same substrate 1. That is, a semiconductor device having an E²PROM and an EPROM in one chip can be obtained.

The above-described semiconductor device can be applied to, e.g., a one-chip microcomputer in which a RAM and a ROM are mounted together.

Since an E²PROM is capable of electrically erasing data, it is used as a RAM, and an EPROM is used as a ROM. If a RAM is constituted by E²PROM memory cells each having the above-described arrangement, the area occupied by the RAM in one chip is decreased, and the packing density of the RAM, i.e., the storage capacity, can be increased. This is because the area of one E²PROM memory cell is about 1/5 that of, e.g., one SRAM memory cell. In addition, a CPU, or the like for accessing the ROM, and the RAM, is constituted by a MOSFET.

Furthermore, an E²PROM has the characteristics of both RAM and ROM. Therefore, even if the power source for the chip is turned off, data can be held. An SRAM cannot perform such a data holding operation after the power source is turned off.

Moreover, since an E²PROM and an EPROM are formed on one chip, if a system constituted by an E²PROM and an EPROM of different chips is constituted by the semiconductor device according to the present invention, these elements can be integrated into one chip. Therefore, a simple, high-performance system can be realized.

A method of manufacturing the semiconductor device according to the first embodiment of the present invention will be described below with reference to FIGS. 2A to 2H. FIGS. 2A to 2H are sectional views showing the steps in manufacturing the semiconductor device according to the first embodiment of the present invention. The same reference numerals in FIGS. 2A to 2H denote the same parts as in FIG. 1.

As shown in FIG. 2A, field oxide films 2 are selectively formed on the upper surface of a silicon substrate 1 of, e.g., a p type by using, e.g., a LOCOS method, thus performing element isolation. First thermal oxide films 24 are formed on the exposed surface portions of the substrate 1 by, e.g., thermal oxidation. An n-type impurity layer 4 is formed at a predetermined position of the substrate 1 in an E²PROM memory cell region 100 by, e.g., photoetching and selective ion implantation of As.

Note that reference numerals 102 and 104 respectively denote an EPROM memory cell and a MOSFET.

As shown in FIG. 2B, the first thermal oxide films 24 formed in the regions 102 and 104 on the upper surface of the substrate 1 are removed to expose the upper surface of the substrate 1.

As shown in FIG. 2C, second thermal oxide films 25 are formed on surface portions of the substrate 1 corresponding to the regions 102 and 104 by, e.g., thermal oxidation. At this time, the first thermal oxide film 24 is also grown to slightly increase due to the heat generated during this thermal oxidation.

Figure 2D:
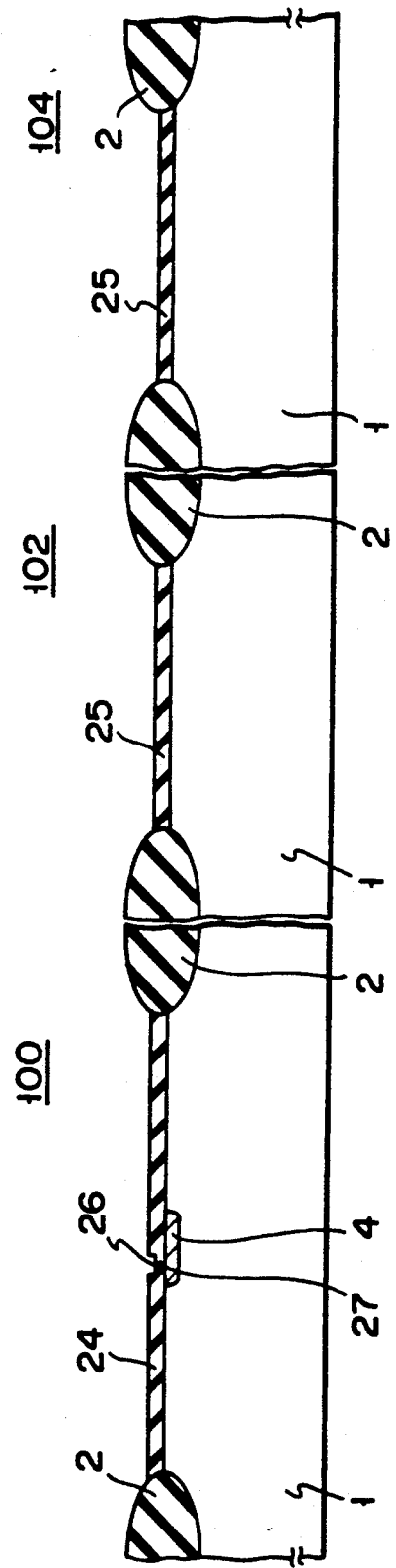

As shown in FIG. 2D, a portion of the first thermal oxide film 24 on the impurity layer 4 is selectively removed by, e.g., photoetching. The portion from which the film 24 is removed is denoted by reference numeral 26. A third thermal oxide film 27 is then formed on a surface portion of the substrate 1 corresponding to the portion 26 by, e.g., thermal oxidation. Owing to the heat during the thermal oxidation, the first and second thermal oxide films 24 and 25 are also grown, and their thicknesses are slightly increased.

As shown in FIG. 2E, a first polysilicon layer 28 is formed on the entire upper surface of the device by, e.g., CVD. When the first polysilicon layer 28 is formed, the growth of the first to third thermal oxide films 24, 25, and 27 is stopped. At this time, the first, second, and third thermal oxide films 24, 25, and 27 respectively have thicknesses of, e.g., about 430 Å, 250 Å, and 100 Å. These thicknesses are not limited to the above values but may be set to be optimal values.respectively. Subsequently, phosphorus is diffused in the first polysilicon layer 28 by, e.g., POCl₃ to render it conductive so as to have a desired sheet resistance $\rho s$. Instead of using the above-mentioned method, ion implantation of an impurity or doping of an impurity into the first polysilicon layer 28 may be performed in advance.

Figure 3:
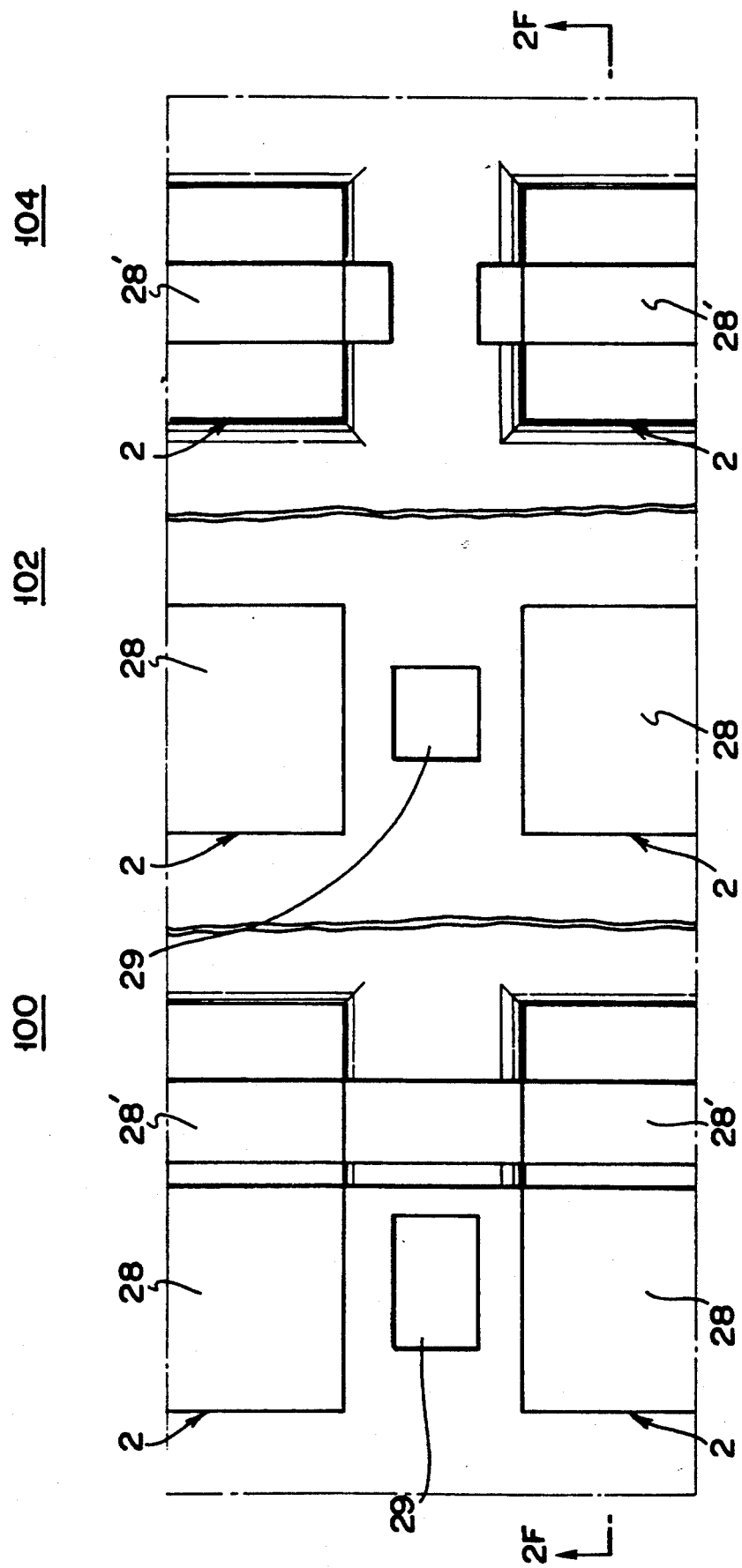
FIG. 3 is a plan view showing the device in the step shown in FIG. 2F.

As shown in FIG. 2F, the first polysilicon layer 28 is selectively etched by, e.g., photoetching. As a result, a select gate pattern 28' and a gate pattern 28' of the MOSFET are formed. FIG. 3 is a plan view showing the device in this step. FIG. 2F is a sectional view taken along a line 2F-2F in FIG. 3. As shown in FIG. 3, the first polysilicon layer 28 is patterned into the respective gate patterns 28'. With the above-mentioned etching, cell slits 29 for isolating the floating gate in units of memory cells are simultaneously formed. These cell slits are formed in the field oxide films 2.

As shown in FIG. 2G, a fourth thermal oxide film 30 is formed on the upper surfaces of the first polysilicon layers 28 and the respective gate patterns 28' by, e.g., thermal oxidation. The fourth thermal oxide film 30 serves as second gate insulating films of the E²PROM memory cell and the EPROM memory cell. For this purpose, the thickness of the fourth thermal oxide film 30 is optimally set in accordance with the characteristics of the E²PROM memory cell and of the EPROM memory cell. A second polysilicon layer 31 is then formed on the entire upper surface of the device by, e.g., CVD. Phosphorus is diffused in the second polysilicon layer 31 to render it conductive so as to have a desired sheet resistance $\rho s$. Instead of using the above-mentioned method, ion implantation of an impurity or doping of an impurity into the second polysilicon layer 31 may be performed in advance.

As shown in FIG. 2H, a photoresist (not shown) is coated on the entire upper surface of the device. Portions of the photoresist (not shown) located on the region 104 and near the select transistor in the region 100 are selectively removed by photoetching. Subsequently, the second polysilicon layer 31 is selectively removed by using the photoresist (not shown) as a mask. The photoresist (not shown) is then peeled off. Another photoresist (not shown) is coated on the entire upper surface of the device. The control gate patterns of the E²PROM and EPROM memory cells are formed by photoetching using the photoresist (not shown). At this time, the upper surfaces of the region 104 and the select transistor are covered with the photoresist. Thereafter, the second polysilicon layer 31, the fourth thermal oxide film 30, and the first polysilicon layer 28 are sequentially etched.

With this process, the following gates and films are formed in the region 100: the first gate insulating film 5 consisting of the first thermal oxide film 544 24; the tunnel insulating film 5' consisting of the third thermal oxide film 27; the floating gate 6 consisting of the first polysilicon layer 28; the second gate insulating film 9 consisting of the fourth thermal oxide film 30; and the control gate 10 consisting of the second polysilicon layer 31. In addition, the gate insulating film consisting of the fourth thermal oxide film 30, and the select gate 8 consisting of the first polysilicon layer 28 are formed.

The following gates and films are formed in the region 102: the gate insulating film 15 consisting of the second thermal oxide film 25; the floating gate 16 of the memory cell, which consists of the first polysilicon layer 28; the second gate insulating film 17 consisting of the fourth thermal oxide film 30; and the control gate 18 consisting of the second polysilicon layer 31.

In the region 104, the gate insulating film 21 consisting of the second thermal oxide film 25, and the gate 22 consisting of the first polysilicon layer 28 are formed.

Subsequently, for example, As ions 32 are implanted into the substrate 1 by using the gates 8, 10, 18, and 22 as masks. As shown in FIG. 1, the insulating interlayer 11 is then formed on the entire upper surface of the device by, e.g., CVD. The insulating interlayer 11 is selectively etched to form the contact holes 12, 19, and 23 communicating with predetermined portions of the device by, e.g., photoetching. An aluminum film is formed on the entire upper surface of the resultant structure by, e.g., sputtering. The aluminum film is selectively etched by, e.g., photoetching to form the metal wires 12', 19', and 23'. Thereafter, the surface protective film 13 is formed on the entire upper surface of the device by, e.g., CVD.

With the above-described steps, the semiconductor device according to the first embodiment is manufactured According to the manufacturing method described above, an E²PROM and an EPROM can be formed together on the same substrate.

Figure 4:
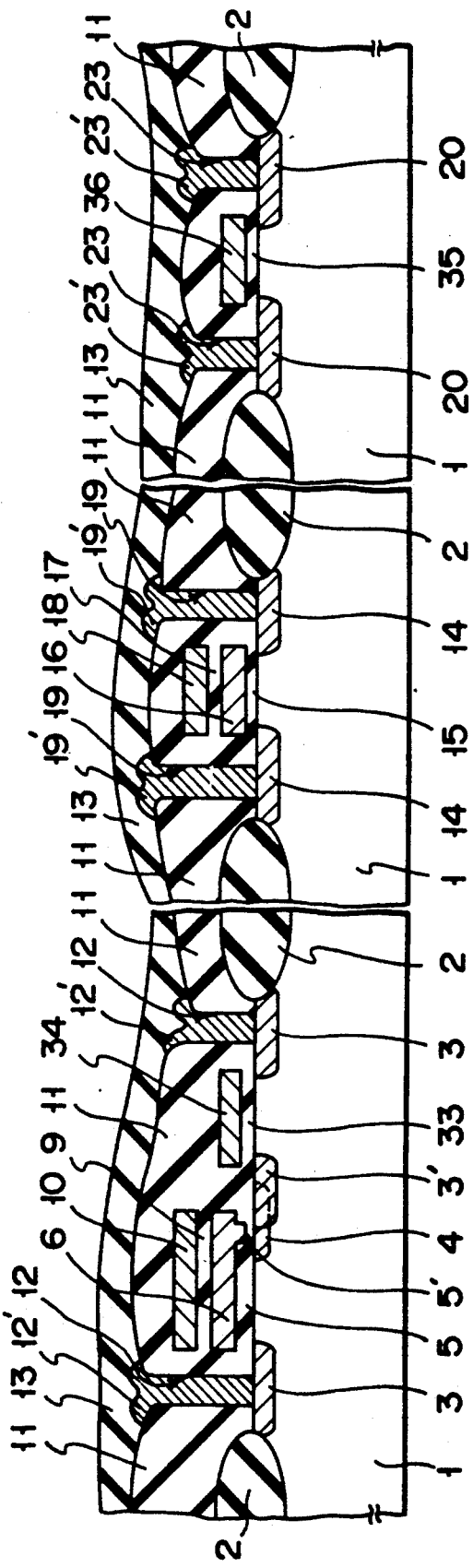
FIG. 4 is a sectional view showing a semiconductor device according to the second embodiment of the present invention.

If the sheet resistances of the first and second polysilicon layers in the first embodiment are respectively represented by $\rho sA$ and $\rho sB$, the sheet resistances of the respective conductive members are given as follows:

floating gate 6: $\rho sA$
control gate 10: $\rho sB$
select gate 8: $\rho sA$
floating gate 16: $\rho sA$
control gate 18: $\rho sB$
gate 22: $\rho sA$ FIG. 4 is a sectional view showing a semiconductor device according to the second embodiment of the present invention. The same reference numerals in FIG. 4 denote the same parts as in FIG. 1, and only different portions will be described below.

As shown in FIG. 4, in the semiconductor device according to the second embodiment, if the sheet resistances of the respective conductive members are given as follows:

floating gate 6: $\rho s1$
floating gate 16: $\rho s2$
select gate 34: $\rho s3$
gate 36: $\rho s4$
control gate 10: $\rho s5$
control gate 18: $\rho s6$ then, the respective sheet resistances have the following relationships:

$$\rho s1 = \rho s2 \tag{1}$$

-continued $$\rho s3 = \rho s4 = \rho s5 = \rho s6 \quad (2)$$

$$\rho s1 \neq \rho s3 \quad (3)$$

According to the semiconductor device having the above-described arrangement, for example, the sheet resistances of the control gate 10, the select gate 34, and the control gates 36 and 18 can be set to be smaller than those of the floating gates 6 and 16. That is, if the resistances of the select gate 34, the gate 36, and the control gates 10 and 18 can be set to be smaller than those of the floating gates 6 and 16, the resistance of each gate wire can be reduced.

A method of manufacturing the semiconductor device according to the second embodiment of the present invention will be describe with reference to FIGS. 5A to 5D. FIGS. 5A to 5D are sectional views showing the steps in manufacturing the semiconductor device according to the second embodiment of the present invention. The same reference numerals in FIGS. 5A to 5D denote the same parts as in FIGS. 2A to 2H, and only different portions will be described below.

Figure 5A:
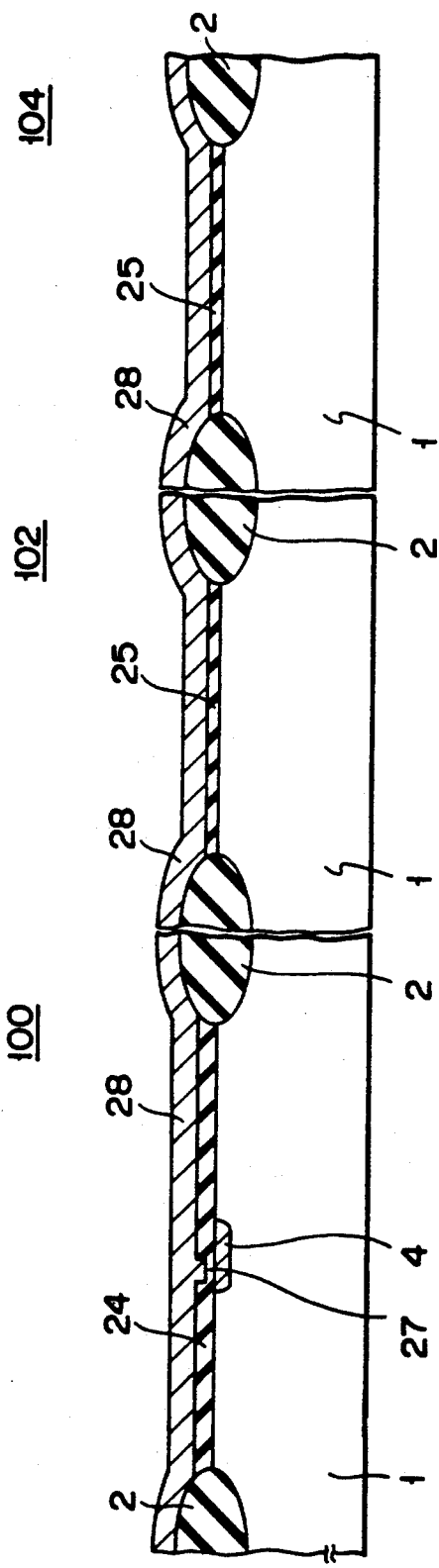
FIGS. 5A to 5D are sectional views showing the steps in manufacturing the semiconductor device according to the second embodiment of the present invention.

The structure shown in FIG. 5A is obtained through the above-described steps shown in FIGS. 2A to 2E. The structure shown in FIG. 5A is identical to that shown in FIG. 2E.

Figure 5B:
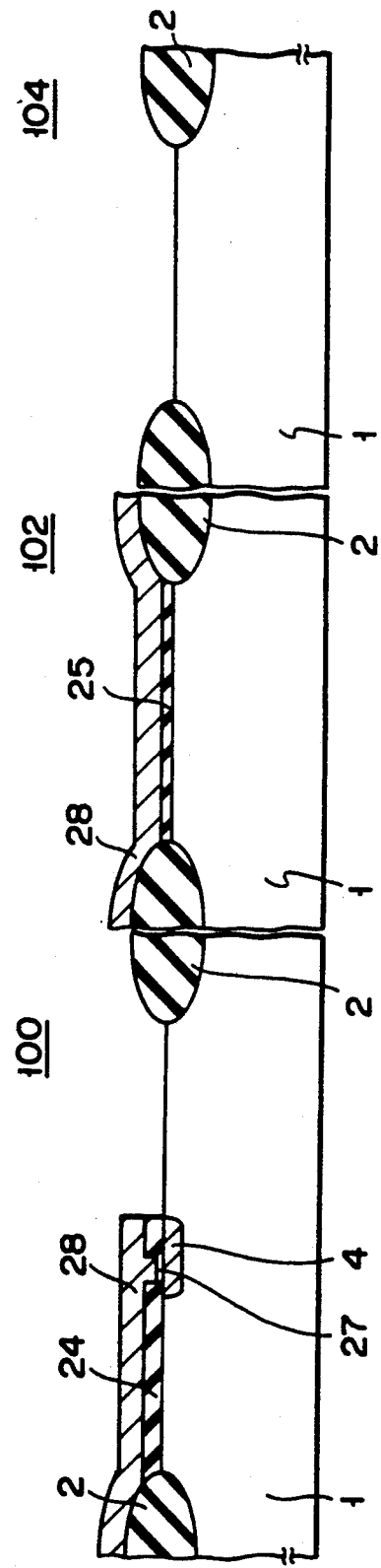
Figure 6:
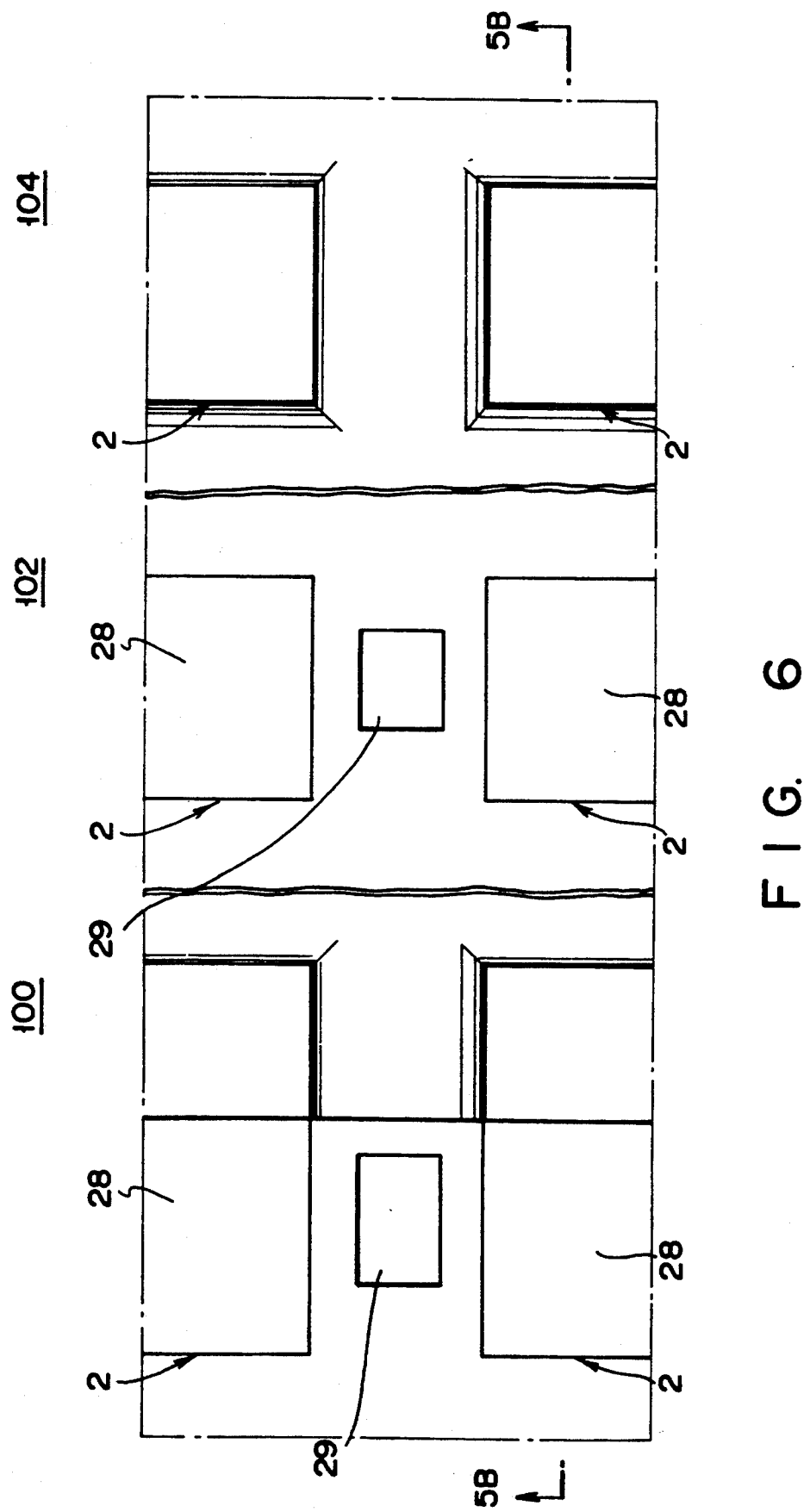
FIG. 6 is a plan view showing the device in the step shown in FIG. 5B.

Subsequently, as shown in FIG. 5B, a first polysilicon layer 28 is selectively etched by, e.g., photoetching. As a result, portions of the first polysilicon layer 28 which are located near the select transistor of the E²PROM and in a region 104 are removed. FIG. 6 is a plan view showing the structure at this time. FIG. 5B is a sectional view taken along a line 5B—5B in FIG. 6. As shown in FIG. 6, when the first polysilicon layer 28 is selectively etched, cell slits 29 are simultaneously formed.

Figure 5C:
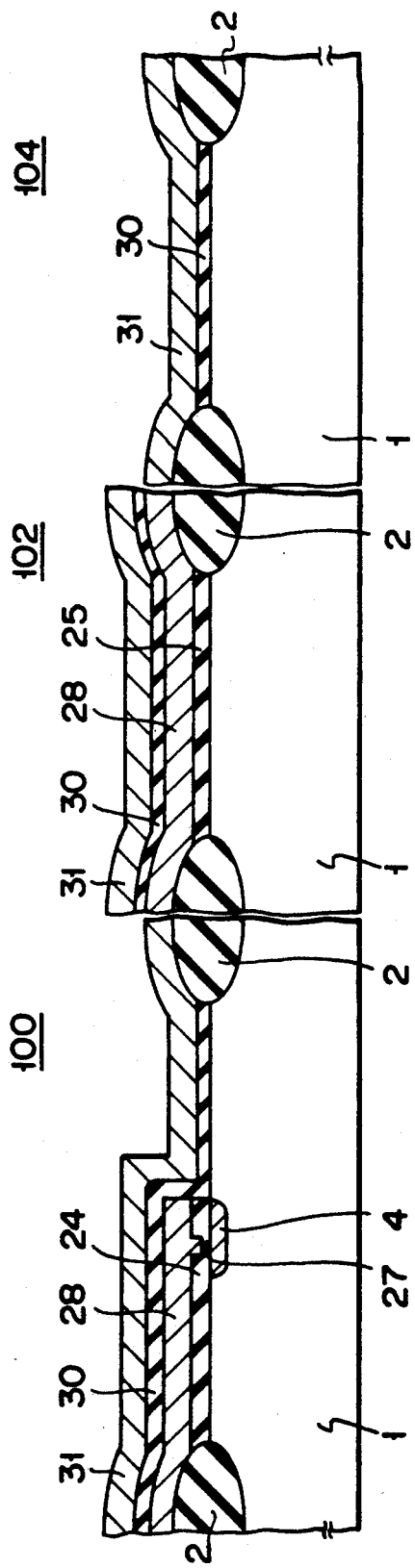

As shown in FIG. 5C, a fourth thermal oxide film 30 is formed on the upper surface of the first polysilicon layer 28 and an exposed surface portion of a first substrate 1. The fourth thermal oxide film 30 serves as the second gate insulating films of the E²PROM and EPROM memory cells and as the gate insulating films of a select transistor and a MOSFET. A second polysilicon layer 31 is formed on the entire upper surface of the device by, e.g., CVD. Phosphorus is then diffused in the second polysilicon layer 31 by, e.g., POCl₃ to render it conductive so as to have a desired sheet resistance ρs.

Figure 5D:
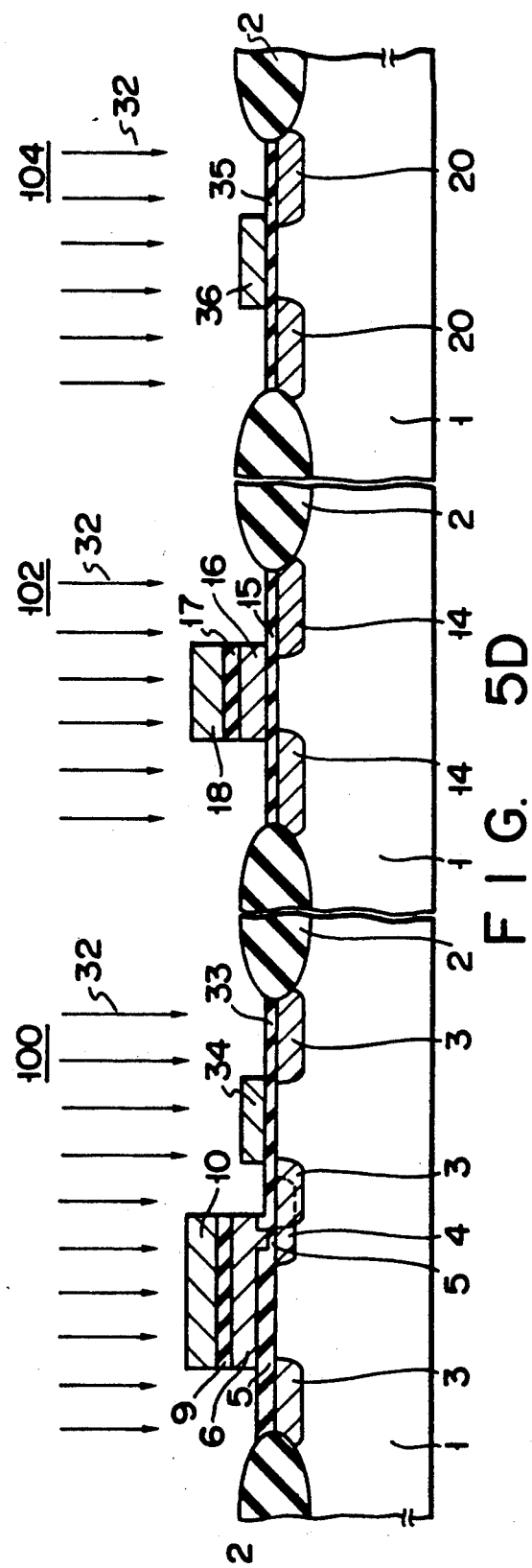

As shown in FIG. 5D, a photoresist (not shown) is coated on the entire upper surface of the device. A select gate pattern and a gate pattern of the MOSFET are formed by photoetching using the photoresist (not shown). At this time, the upper surfaces of a region 102 and the E²PROM memory transistor are covered with this photoresist. The second polysilicon layer 31 is etched by using the photoresist (not shown) as a mask. The photoresist is the peeled off. A photoresist (not shown) is coated on the entire upper surface of the device again. Control gate patterns of the E²PROM and EPROM memory cells are formed by photoetching using the photoresist (not shown). At this time, the upper surfaces of a region 104 and the select transistor are covered with the photoresist. The second polysilicon layer 31, the fourth thermal oxide 30, and the first polysilicon layer 28 are sequentially etched by using the photoresist (not shown).

With this process, the following films and gates are formed in a region 100: a first gate insulating film 5 consisting of a first thermal oxide film 24; a tunnel insulating film 5' consisting of a second thermal oxide film 27; the floating gate 6 consisting of the first polysilicon layer 28; a second gate insulating film 9 consisting of the fourth thermal oxide film 30; and the control gate 10 consisting of the second polysilicon layer 31. In addition, a gate insulating film 33 consisting of the fourth oxide film 30, and the select gate 34 consisting of the second polysilicon layer 31 are formed.

The following films and gates are formed in the region 102: a gate insulating film 15 consisting of the second thermal oxide film 30; the floating gate 16 consisting of the first polysilicon layer 28; a second gate insulating film 17 consisting of the fourth thermal oxide film 30; and the control gate 18 consisting of the second polysilicon layer 31.

A gate insulating film 35 consisting of the fourth thermal oxide film 30, and the gate 36 consisting of the second polysilicon layer 31 are formed in the region 104.

The subsequent steps are the same as those described in the first embodiment and hence a description thereof will be omitted.

With the above-described steps, the semiconductor device according to the second embodiment of the present invention is manufactured.

According to such a manufacturing method, the control gates 10 and 18, the select gate 34, and the gate 36 are set to have sheet resistances different from those of the floating gates 6 and 16, and hence the E²PROM and the EPROM can be formed on the same substrate.

Figure 7:
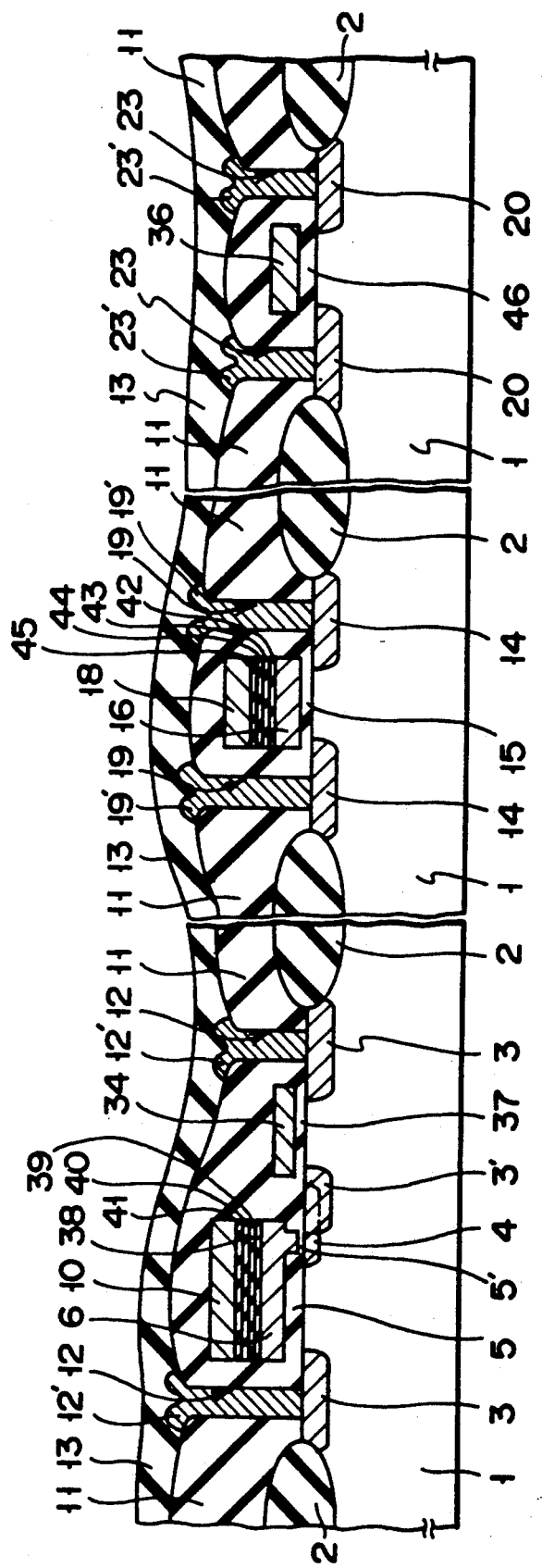
FIG. 7 is a sectional view showing a semiconductor device according to the third embodiment of the present invention.

In the second embodiment, if the sheet resistances of the first and second polysilicon layers are respectively represented by ρsA and ρsB, the sheet resistances of the respective conductive members are given as follows:

floating gate 6: ρsA
control gate 10: ρsB
select gate 8: ρsB
floating gate 16: ρsA
control gate 18: ρsB
gate 22: ρsB FIG. 7 is a sectional view showing a semiconductor device according to the third embodiment of the present invention. The same reference numerals in FIG. 7 denote the same parts as in FIG. 1, and only different portions will be described below.

As shown in FIG. 7, in the semiconductor device according to the third embodiment, the second gate insulating film of a E²PROM is constituted by a four-layered film consisting of an oxide film 38, a nitride film 39, an oxide film 40, and a nitride film 41, and the second gate insulating film of an EPROM is constituted by a four-layered film consisting of an oxide film 42, a nitride film 43, an oxide film 44, and a nitride film 45.

The relationship between the sheet resistances of the respective conductive layers in the semiconductor device according to the third embodiment is the same as that in the second embodiment.

According to the semiconductor device having the above-described arrangement, the capacitance between the control gate and the floating gate can be increased.

A method of manufacturing the semiconductor device according to the third embodiment of the present invention will be described below with reference to FIG. 8A to 8F. FIGS. 8A to 8 are sectional views showing the steps in manufacturing the semiconductor device according to the third embodiment of the present invention. The same reference numerals in FIGS.

8A to 8F denote the same parts as in FIGS. 2A to 2H, and only different portions will be described below.

The structure shown in FIG. 8A is obtained through the above-described steps in FIGS. 2A to 2E. The structure shown in FIG. 8A is identical to that shown in FIG. 2E.

Subsequently, as shown in FIG. 8B, a first polysilicon layer 28 is selectively etched by, e.g., photoetching. As a result, portions of the first polysilicon layer 28 which are located near the select transistor of an E²PROM and on a region 104 are removed. The surface obtained at this time is identical to the surface shown in FIG. 6.

As shown in FIG. 8C, a fifth thermal oxide film 47 is formed on the upper surface of the first polysilicon layer 28 and exposed surface portions of the substrate 1. For example, conditions for thermal oxidation are set such that a thermal oxide film having a thickness of about 350Å is formed the upper surface of the first polysilicon layer 28 in an atmosphere of $N_2$ with a dilution ratio of 20% at a temperature 1,000° C. Subsequently, a first nitride film 48 is formed on the entire upper surface of the device to have a thickness of about 300Å by, e.g., CVD. A sixth thermal oxide film 49 is formed on the upper surface of the first nitride film 48 by, e.g., thermal oxidation. At this time, conditions for the thermal oxidation are set such that a thermal oxide film having a thickness of about 60 Å is formed on the upper surface of the first nitride film 48 in an atmosphere of BOx (boron oxide) at a temperature of 950° C. for 80 minutes. A second nitride film 50 is then formed on the entire upper surface of the device to have a thickness of about 300Å by, e.g., CVD.

As shown in FIG. 8D, the fifth thermal oxide film 47, the first nitride film 48, the sixth thermal oxide film 49, and the second nitride film 50 are selectively and sequentially etched by, e.g., photoetching. As a result, portions of the fifth thermal oxide film 47, the first nitride film 48, the sixth thermal oxide film 49, and the second nitride film 50 which are located near the select transistor of the E²PROM and in region 104 are removed. A seventh thermal oxide film 51 is then formed on exposed surface portions of the substrate 1. The seventh thermal oxide film 51 serves as the gate insulating films of the select transistor and of a MOSFET.

As shown in FIG. 8E, a second polysilicon layer 31 is formed on the entire upper surface of the device by, e.g., CVD. Phosphorus is then diffused in the second polysilicon layer 31 by, e.g., $POCl_3$ to render it conductive so as to have a desired sheet resistance $\rho s$.

As shown in FIG. 8F, the following gates and the like are formed in the respective regions through the same step as that shown in FIG. 5D: a floating gate 6, a control gate 10, a select gate 34, and the like in region 100; a floating gate 16, a control gate 18, and the like in region 102; and a gate 36 in region 104.

At this time, the following films and gates are formed in the region 100: a first gate insulating film 5 consisting of a first thermal oxide film 24; a tunnel insulating film 5' consisting of a third thermal oxide film 27; the floating gate 6 consisting of the first polysilicon layer 28; the second gate insulating film consisting of the four-layered film 39–40; and the control gate 10 consisting of the second polysilicon layer 31. In addition, a gate insulating film 37 consisting of a seventh thermal oxide film 51, and the select gate 34 consisting of the second polysilicon layer 31 are formed.

The following films and gates are formed in the region 102 a gate insulating film 15 consisting of a second thermal oxide film 25; the floating gate 16 consisting of the first polysilicon layer 28; the second gate insulating film consisting of the four-layered film 42–45, and a control gate 18 consisting of the second polysilicon layer 31.

A gate insulating film 46 consisting of the seventh thermal oxide film 51, and a gate 36 of the MOSFET which consists of the second polysilicon layer 31 are formed in the region 104.

The subsequent steps are the same as those in the manufacturing method described in the first embodiment and hence a description thereof will be omitted.

The semiconductor device according to the third embodiment is manufactured in the above-described steps.

According to such a manufacturing method, the second insulating film formed between the control gate and the floating gate is constituted by, e.g., a four-layered film consisting of oxide and nitride films, thereby allowing an E²PROM and an EPROM to be formed on the same substrate.

Figure 9:
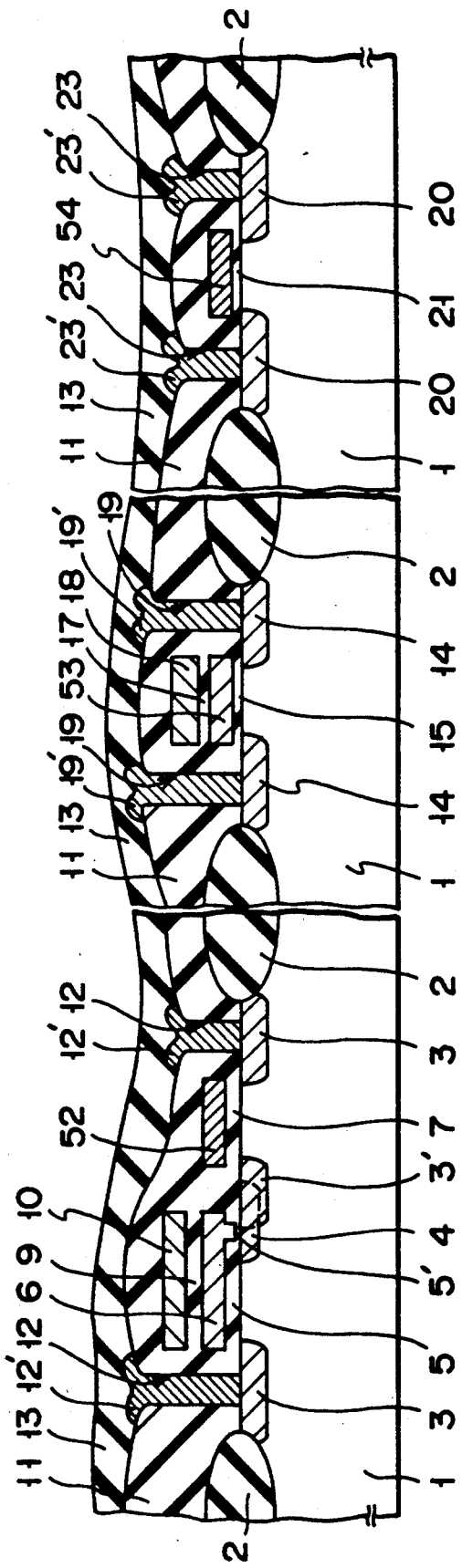
FIG. 9 is a sectional view showing a semiconductor device according to the fourth embodiment of the present invention.

In the third embodiment, if the sheet resistances of the first and second polysilicon layers are respectively represented by $\rho sA$ and $\rho sB$, the sheet resistances of the respective conductive members are given as follows:

floating gate 6: $\rho sA$
control gate 10: $\rho sB$
select gate 8: $\rho sB$
floating gate 16: $\rho sA$
control gate 18: $\rho sB$
gate 22: $\rho sB$ FIG. 9 is a sectional view showing a semiconductor device according to the fourth embodiment of the present invention. The same reference numerals in FIG. 9 denote the same parts as in FIG. 1, and only different portions will be described below.

As shown in FIG. 9, in the semiconductor device according to the fourth embodiment, if the sheet resistances of the following gates are:

floating gate 6: $\rho s1$
floating gate 53: $\rho s2$
select gate 52: $\rho s3$
gate 54: $\rho s4$
control gate 10: $\rho s5$
control gate 18: $\rho s6$ then, the respective sheet resistances have the following relationships:

$$\rho s1 \neq \rho s2 \qquad (4)$$

$$\rho s2 = \rho s3 = \rho s4 \qquad (5)$$

$$\rho s5 = \rho s6 \qquad (6)$$

Furthermore, if the relationship of inequality (4) is defined by $$\rho s1 > \rho s2 \qquad (7)$$

the reliability of the E²PROM memory cell can be improved.

The inequality (7) is established when the impurity concentration of the floating gate 6 of the E²PROM memory cell is lower than that of the floating gate 53 of the EPROM memory cell. If the impurity concentration of the floating gate 6 is set to be low, leakage of carriers (electrons) from the floating gate 6 into an impurity layer 4 through a tunnel insulating film 5' can be prevented. In addition, leakage of an impurity from the floating gate 6 into the impurity layer 4 through the tunnel insulating film 5' can be prevented. Therefore, when the EPROM memory cell and the E²PROM memory cell are formed on the same substrate together, the reliability of the E²PROM memory cell can be improved.

Figure 10C:
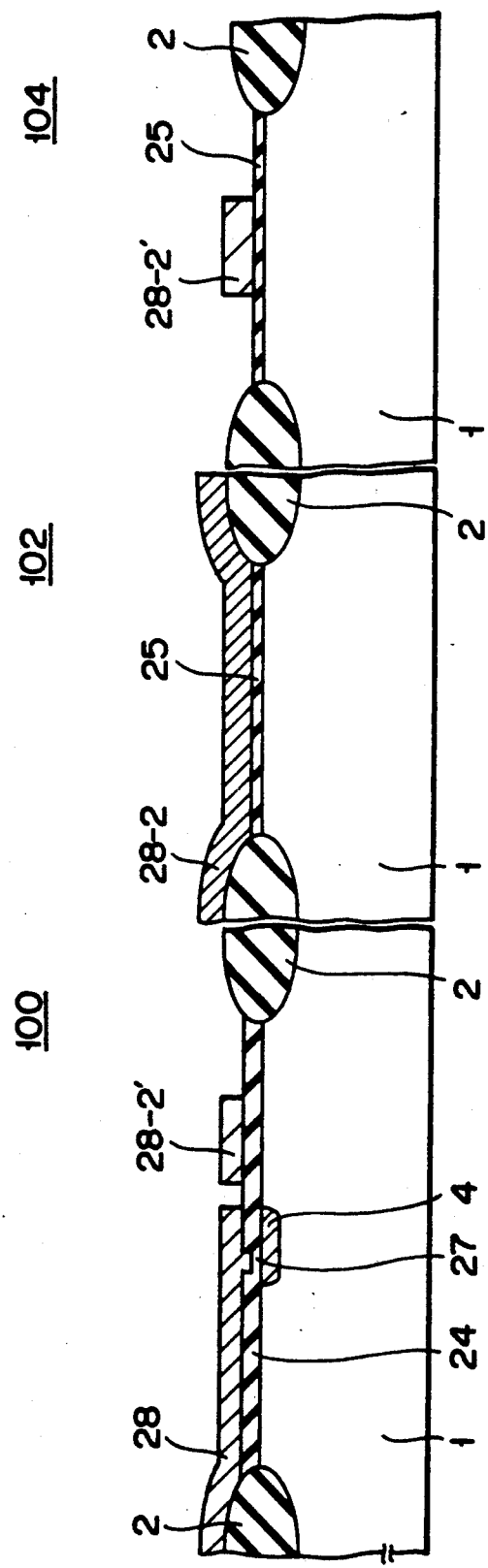

A method of manufacturing the semiconductor device according to the fourth embodiment will be described with reference to FIGS. 10A to 10C. FIGS. 10A to 10C are sectional views showing the steps in manufacturing the semiconductor device according to the fourth embodiment of the present invention. The same reference numerals in FIGS. 10A to 10C denote the same parts as in FIGS. 2A to 2H, and only different portions will be described below.

The structure shown in FIG. 10A is obtained through the above-described steps in FIGS. 2A to 2E. The structure shown in FIG. 10A is identical to that shown in FIG. 2E.

Subsequently, as shown in FIG. 10B, a thermal oxide film 55 is formed on the upper surface of a first polysilicon layer 28 by, e.g., thermal oxidation. The thermal oxide film 55 has a thickness of, e.g., about 400 Å. Subsequently, the thermal oxide film 55 is selectively removed by, e.g., photoetching. As a result, a portion of the thermal oxide film 55 is left on a surface portion of the polysilicon layer 28 serving as a floating gate in a region 100. Phosphorus is diffused in the first polysilicon layer 28 by, e.g., POCl₃ to render it conductive. At this time, almost no phosphorus is diffused in a portion of the polysilicon layer 28 under the thermal oxide film 55 because the thermal oxide film 55 serves a mask for impurity diffusion. With this process, a portion 28-2 having a high impurity concentration and a portion 28 having a low impurity concentration are formed in the first polysilicon layer 28. For example, the portion 28 having the low impurity concentration has an impurity concentration of about 1 to $3 \times 10^{20}$ cm$^{-3}$, and the portion 28-2 having the high impurity concentration has an impurity concentration of about 4 to $6 \times 10^{20}$ cm$^{-3}$. Note that a method of rendering the polysilicon layer 28 conductive is not limited to the above. For example, ion implantation may be employed. A mask for preventing impurity diffusion may be constituted not only by a thermal oxide film 55 but also by a CVD oxide film or a photoresist having an impurity blocking effect.

Figure 11:
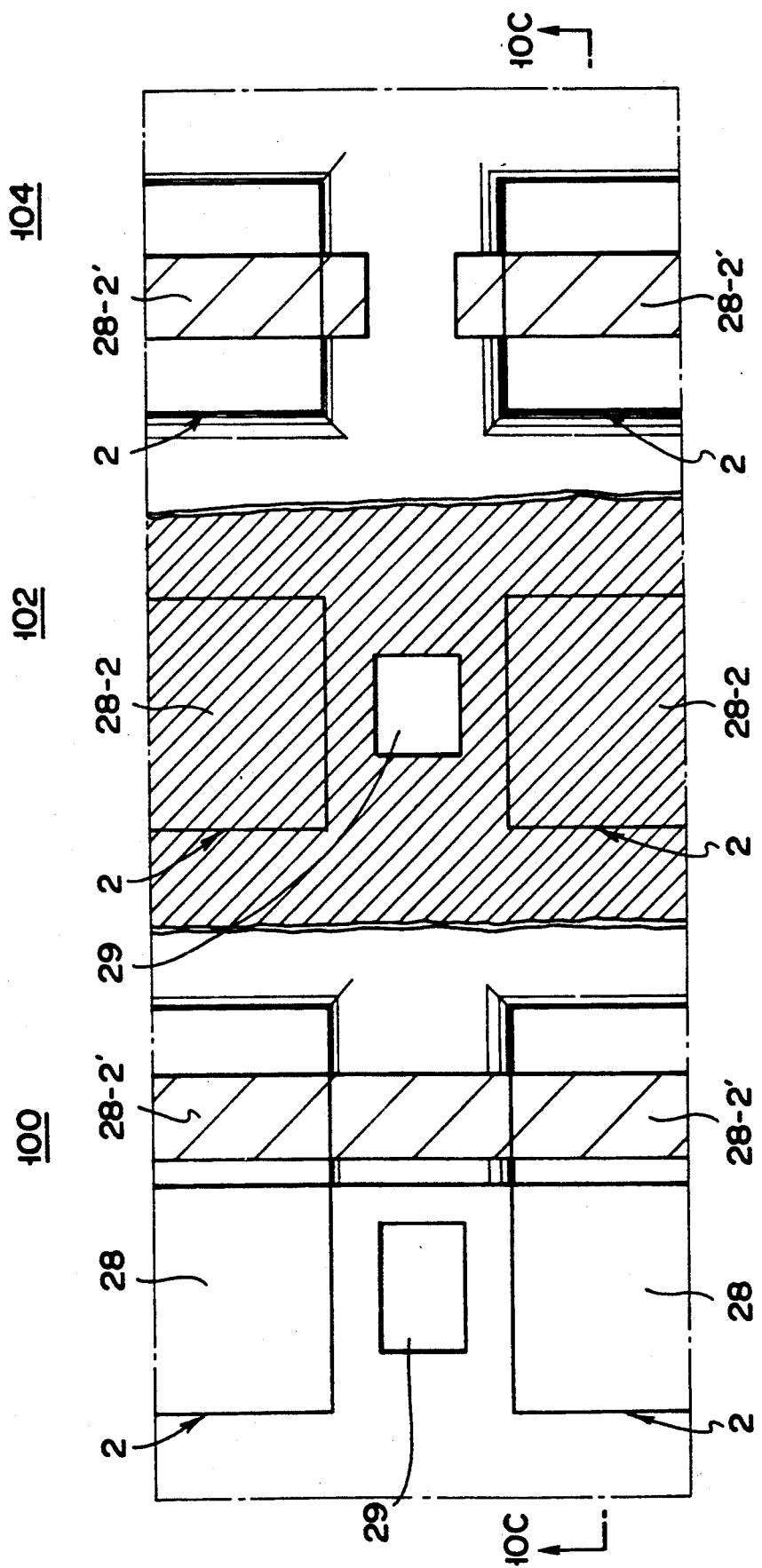
FIG. 11 is a plan view showing the device in the step shown in FIG. 10C.

As shown in FIG. 10C, the first polysilicon layer 28 is selectively etched by, e.g., photoetching. As a result, a select gate pattern and a gate pattern 28-2' are formed. FIG. 11 is a plan view of the resultant structure. FIG. 10C is a sectional view taken along a line 10C—10C in FIG. 11. As shown in FIG. 11, when the first polysilicon layer 28 is selectively etched, cell slits 29 are simultaneously formed.

The subsequent steps are the same as the steps after the steps shown in FIG. 2G.

With the above-described steps, the semiconductor device according to the fourth embodiment is manufactured.

According to such a manufacturing method, the sheet resistances ρs1 and ρs2 of the floating gates 6 and 53 of the E²PROM and EPROM memory cells are set to be different from each other, thereby allowing the E²PROM and the EPROM to be formed on the same substrate.

In the fourth embodiment, if the sheet resistance of the first polysilicon layer is ρsA; the sheet resistance of the first silicon layer in which an impurity is doped, ρsA'; and the sheet resistance of the second polysilicon layer, ρsB, the sheet resistances of the respective conductive members are given as follows:

floating gate 6: ρsA
control gate 10: ρsB
select gate 52: ρsA'
floating gate 53: ρsA'
control gate 18: ρsB
gate 54: ρsA'

Figure 12:
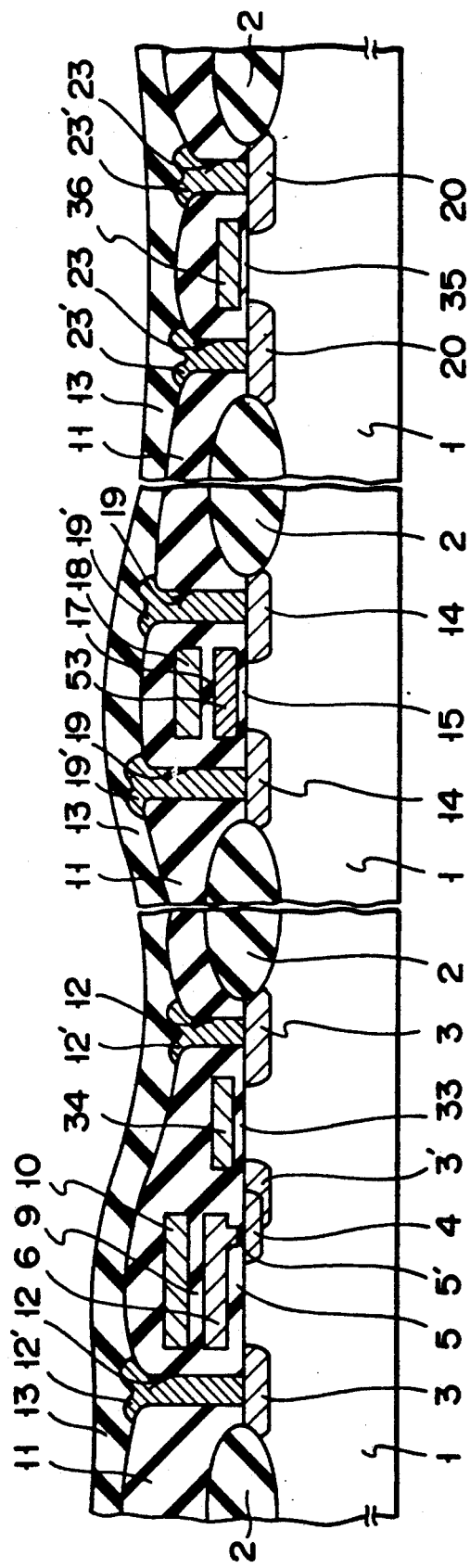
FIG. 12 is a sectional view showing a semiconductor device according to the fifth embodiment of the present invention.

FIG. 12 is a sectional view showing a semiconductor device according to the fifth embodiment of the present invention. The same reference numerals in FIG. 12 denote the same parts as in FIG. 1, and only different portions will be described below.

In the semiconductor device according to the fifth embodiment, if the sheet resistances of the respective gates are:

floating gate 6: ρs1
floating gate 53: ρs2
select gate 34: ρs3
gate 36: ρs4
control gate 10: ρs5
control gate 18: ρs6 the respective sheet resistances have the following relationships:

$$\rho s1 \neq \rho s2 \tag{8}$$

$$\rho s3 = \rho s4 = \rho s5 = \rho s6 \tag{9}$$

$$\rho s1 \neq \rho s3 \tag{10}$$

Furthermore, if the relationship of inequality (8) is defined by:

$$\rho s1 > \rho s2 \tag{9}$$

then, similar to the fourth embodiment, the reliability of the E²PROM memory cell can be improved.

According to the semiconductor device having the above-described arrangement, since each of the select gate 34, the gate 36, and the control gates 10 and 18 has a sheet resistance different from that of the floating gate 6, the resistance of each gate wire can be reduced as described with reference to the second embodiment.

A method of manufacturing the semiconductor device according to the fifth embodiment of the present invention will be described with reference to FIGS. 13A to 13C. FIGS. 13A to 13C are sectional views showing the steps in manufacturing the semiconductor device according to the fifth embodiment of the present invention. The same reference numerals in FIGS. 13A to 13C denote the same parts as in FIGS. 2A to 2H, and only different portions will be described below.

A structure shown in FIG. 13A is obtained through the above-described steps in FIGS. 2A to 2E. The structure shown in FIG. 13A is identical to that shown in FIG. 2E.

Subsequently, as shown in FIG. 13B, a thermal oxide film 55 is formed on the upper surface of a first polysilicon layer 28 in the same step as, e.g., that shown in FIG. 10B. The thermal oxide film 55 is selectively removed by, e.g., photoetching to leave a portion of the thermal oxide film 55 on a surface portion of the first polysilicon layer 28 serving as a floating gate in a region 100. Phosphorus is then diffused in the first polysilicon layer 28 by, e.g., POCl₃ to render it conductive. A portion 28-2 having a high impurity concentration and a portion 28 having a low impurity concentration are formed in the first polysilicon layer 28 by using the thermal oxide film 55 as a mask for controlling impurity diffusion. For example, the impurity concentration of the portion 28 having the high impurity concentration is set to be about 1 to $3 \times 10^{20}$ cm$^{-3}$, and the impurity concentration of the portion 28 having the low impurity concentration is set to be about 4 to $6 \times 10^{20}$ cm$^{-3}$.

Figure 14:
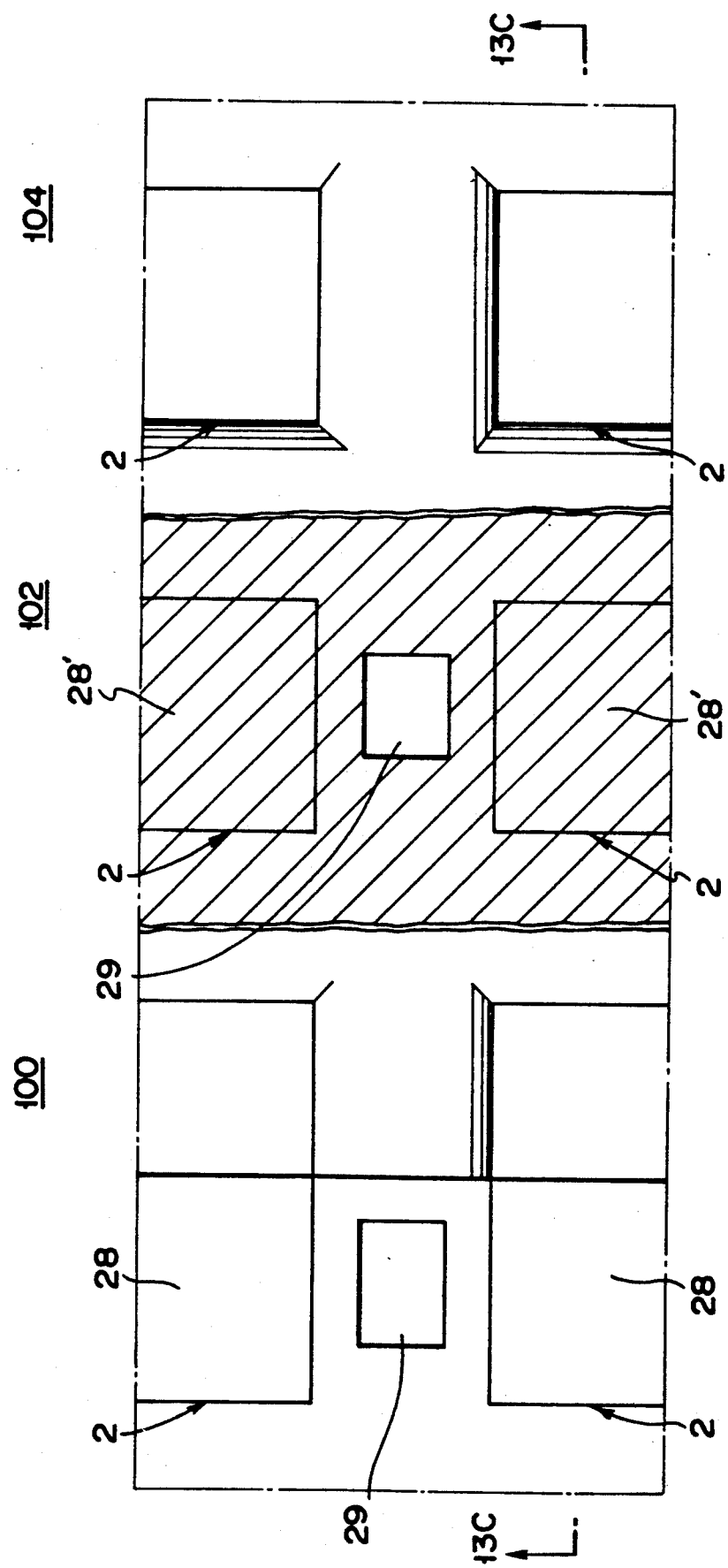
FIG. 14 is a plan view showing the device in the step shown in FIG. 13C.

As shown in FIG. 13C, similar to the above-described step in FIG. 5B, the first polysilicon layer 28 is selectively etched by, e.g., photoetching to remove portions of the first polysilicon layer 28 which are located near the select transistor of the E$^2$PROM and in a region 104. FIG. 14 is a plan view showing the resultant structure. FIG. 13C is a sectional view taken along a line 13C—13C in FIG. 14. As shown in FIG. 13, when the first polysilicon layer 28 is selectively etched, cell slits 29 are simultaneously formed.

The subsequent steps are the same as those after the above-described step in FIG. 5C and a description thereof will be omitted.

With the above-described steps, a semiconductor device according to the fifth embodiment is manufactured.

According to such a manufacturing method, the sheet resistance of the floating gate 6 of the E$^2$PROM memory cell is set to be different from that of the floating gate 53 of the EPROM memory cell so that the E$^2$PROM and the EPROM can be formed on the same substrate. In addition, since the select gate 34 and the gate 36 are constituted by a second polysilicon layer, the sheet resistance of each of the select gate 34 and the gate 36 can be set to be different from that of the floating gate 6 or the floating gate 53.

Figure 15:
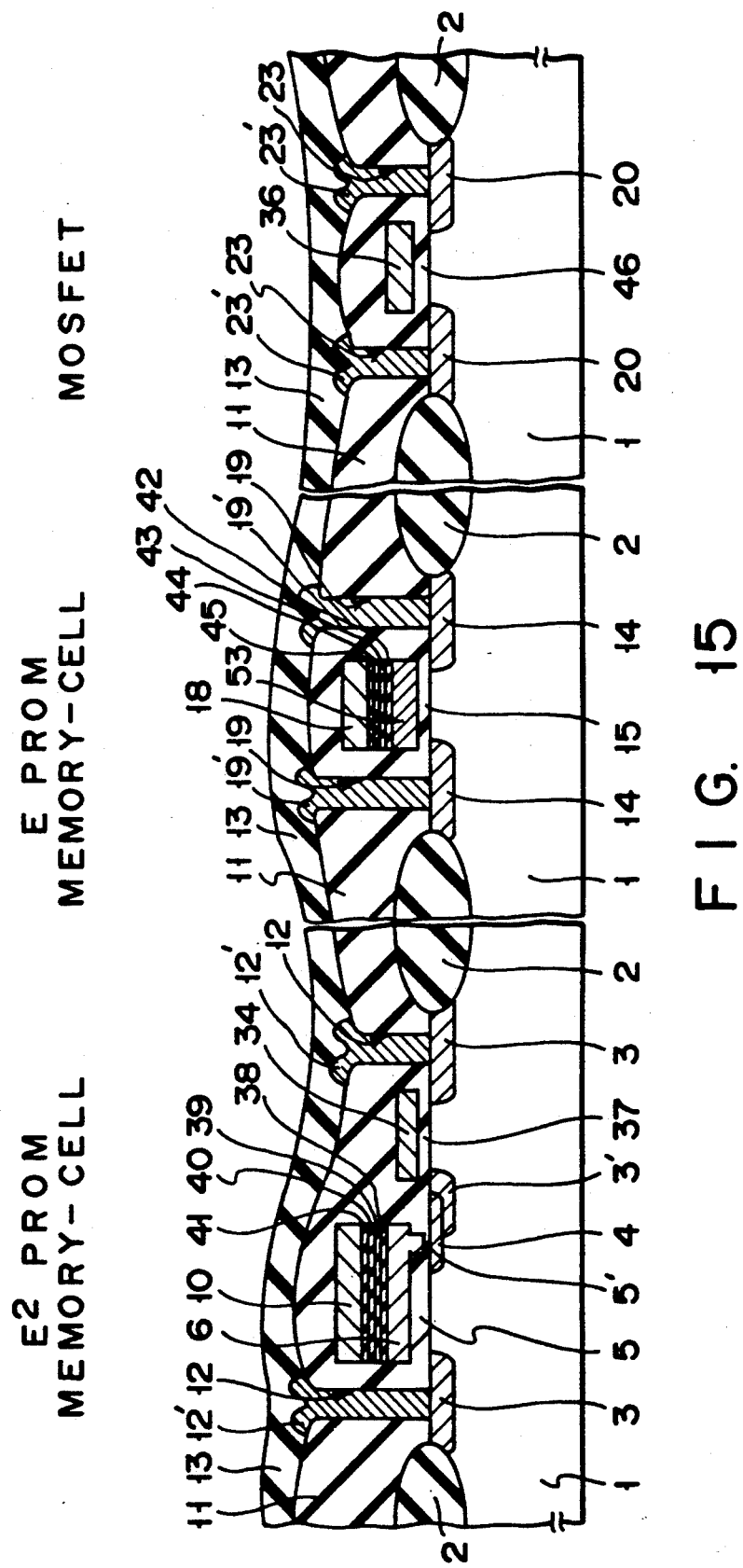
FIG. 15 is a sectional view showing a semiconductor device according to the sixth embodiment of the present invention.

In the fifth embodiment, if the sheet resistance of the first polysilicon layer is represented by $\rho$sA; the sheet resistance of the first polysilicon layer in which an impurity is doped, by $\rho$sA'; and the sheet resistance of the second polysilicon layer, by $\rho$sB, the sheet resistances of the respective conductive members are:

floating gate 6: $\rho$sA
control gate 10: $\rho$sB
select gate 34: $\rho$sB
floating gate 53: $\rho$sA'
control gate 18: $\rho$sB
gate 36: $\rho$sB FIG. 15 is a sectional view showing a semiconductor device according to the sixth embodiment of the present invention. The same reference numerals in FIG. 15 denote the same parts as in FIG. 1, and only different portions will be described below.

As shown in FIG. 5, in the semiconductor device according to the sixth embodiment, the second gate insulating film of the E$^2$PROM memory cell is constituted by a four-layered film consisting of an oxide film 38, a nitride film 39, an oxide film 40, and a nitride film 41, and the second gate insulating film of the EPROM memory cell is also constituted by a four-layered film consisting of an oxide film 42, a nitride film 43, an oxide film 44, and a nitride film 45. In addition, the sheet resistances of the respective conductor layers have the same relationships as those of the sheet resistances in the fifth embodiment.

According to the semiconductor device having the above-described arrangement, as described with reference to the third embodiment, the capacitances between the control gate 10 and the floating gate 6 and between the control gate 18 and the floating gate 53 can be increased. As described with reference to the fifth embodiment, the reliability of the E$^2$PROM memory cell can be improved, and the resistance of each gate wire can be further reduced.

The method of manufacturing the semiconductor device according to the sixth embodiment will be described below with reference to FIGS 16A to 16D. FIGS. 16A to 16D are sectional views showing the steps in manufacturing the semiconductor device according to the sixth embodiment of the present invention. The same reference numerals in FIGS. 16A to 16D denote the same parts as in FIGS. 2A to 2H, and only different portions will be described below.

A structure shown in FIG. 16A is obtained through the above-described steps in FIGS. 2A to 2E. The structure shown in FIG. 16A is identical to that shown in FIG. 2E.

The structure shown in FIG. 16B is obtained as in the step shown in FIG. 13B.

Figure 16C:
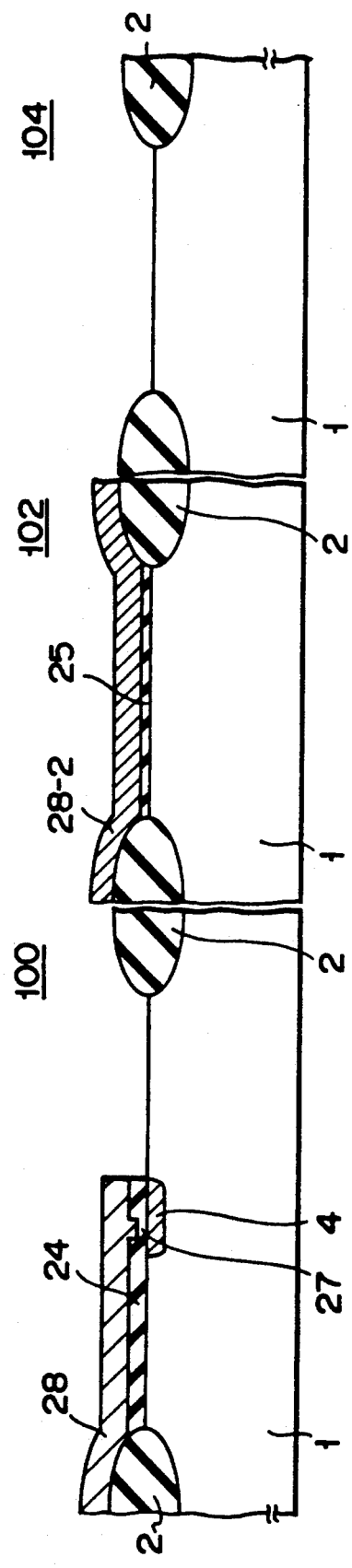

The structure shown in FIG. 16C is obtained as in the step shown in FIG. 13C.

Figure 16D:
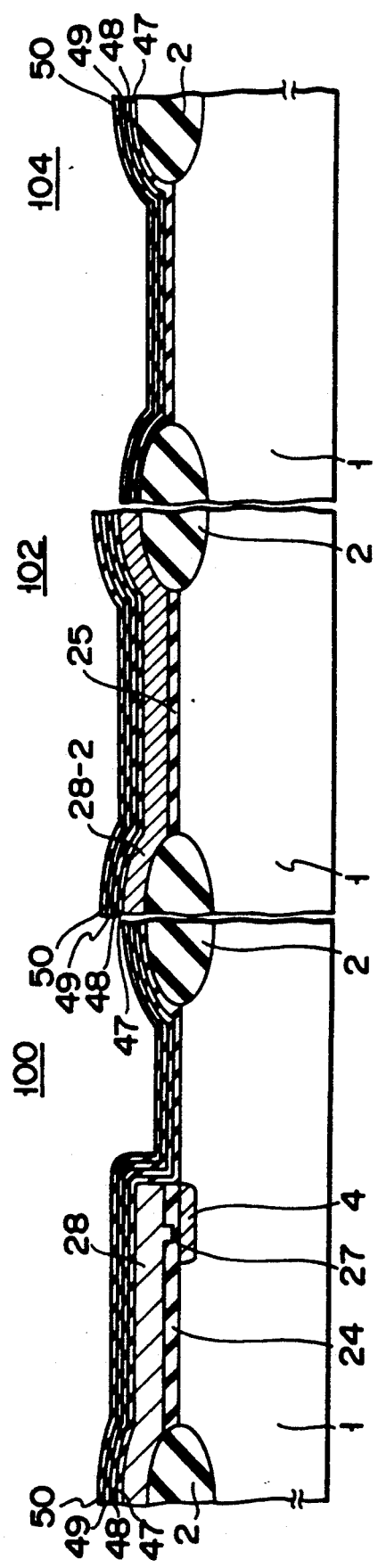

The structure shown in FIG. 16D is obtained as in the step shown in FIG. 8C.

The subsequent steps are the same as those after the step shown in FIG. 8D, and hence a description thereof will be omitted.

With the above-described steps, the semiconductor device according to the sixth embodiment is manufactured.

According to such a manufacturing method, similar to the manufacturing method described with reference to the fifth embodiment, since the sheet resistance of the floating gate 6 of the E$^2$PROM memory cell is set to be different from that of the floating gate 53 of the EPROM memory cell, the E$^2$PROM and the EPROM can be formed on the same substrate. Since a select gate 34 and a gate 36 are composed of a second polysilicon layer, the sheet resistances of the select gate 34 and the gate 36 can be set to be different from those of the floating gates 6 and 53. In addition to these advantages, a second gate insulating film between a control gate and a floating gate can be composed of a stacked layer consisting of oxide films and a nitride films.

Figure 17:
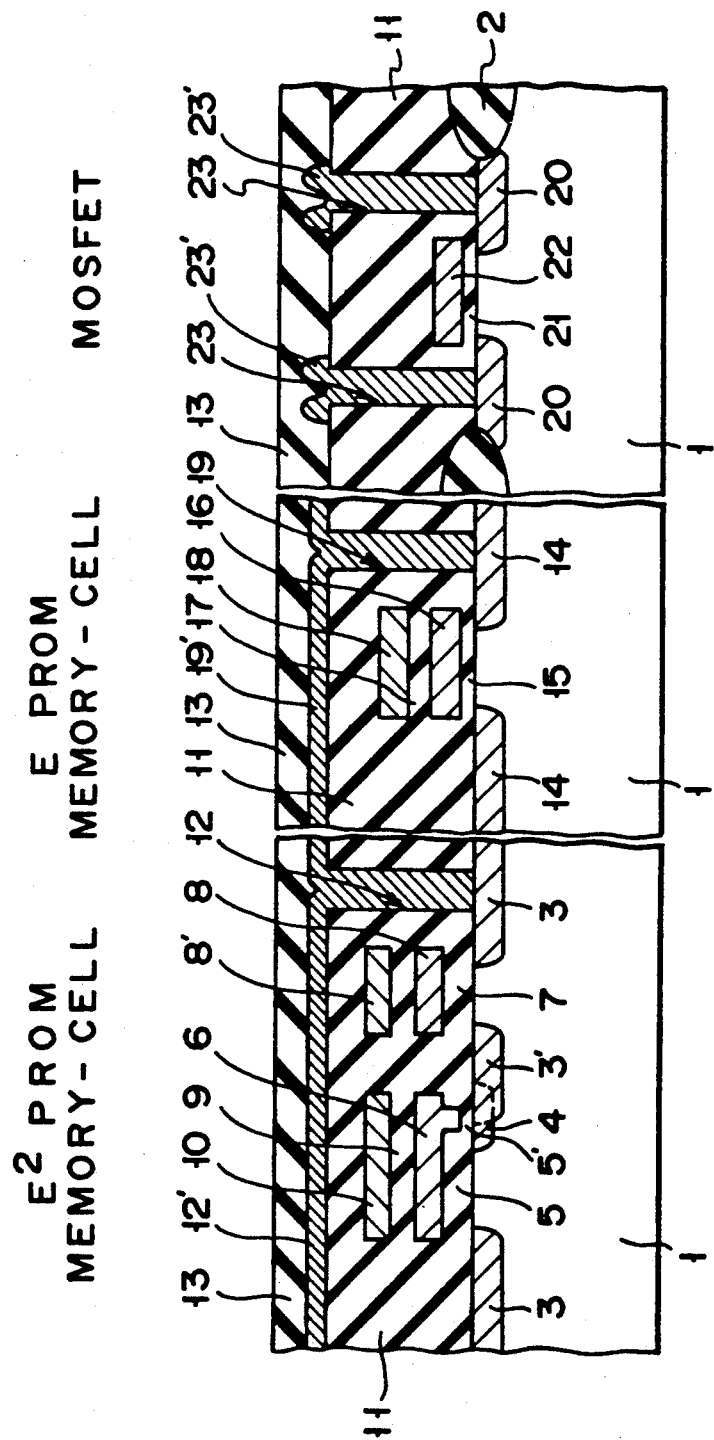
FIG. 17 is a sectional view showing a semiconductor device according to the seventh embodiment of the present invention.

In the sixth embodiment, if the sheet resistance of the first polysilicon layer is represented by $\rho$sA; the sheet resistance of the first polysilicon layer in which an impurity is doped, by $\rho$sA'; and the sheet resistance of the second polysilicon layer, by $\rho$sB, the sheet resistances of the respective conductive members are:

floating gate 6: $\rho$sA
control gate 10: $\rho$sB
select gate 34: $\rho$sB
floating gate 53: $\rho$sA'
control gate 18: $\rho$sB
gate 36: $\rho$sB FIG. 17 is a sectional view showing a semiconductor device according to the seventh embodiment of the present invention. The same reference numerals in FIG. 17 denote the same parts as in FIG. 1, and only different portions will be described below.

As shown in FIG. 17, in the semiconductor device according to the seventh embodiment, a second polysilicon layer 8' is left above a select gate 8. A select gate of this type is generally called a "stacked select gate".

According to the semiconductor device having the "stacked select gate" with the above-mentioned arrangement, a memory cell transistor is constituted by two layers comprising a floating gate 6 and a control gate 10. Similarly, a select transistor is constituted by two layers comprising the select gate 8 and the second polysilicon layer 8'. With this structure, the gate portions of the select and memory cell transistors can be patterned in the same step. Therefore, since the distances from the select gate 8 to the floating gate 6 and to the control gate 10 can be reduced, this embodiment is suitable for micropatterning of a memory cell.

Note that when the "stacked select gate" is used, it is only required that a current be supplied to only the select gate 8 consisting of at least a first polysilicon layer.

A method of manufacturing the semiconductor device according to the seventh embodiment will be described below with reference to FIGS. 18A to 18E. FIGS. 18A to 18E are sectional views showing the steps in manufacturing the semiconductor device according to the seventh embodiment of the present invention. The same reference numerals in FIGS. 18A to 18E denote the same parts as in FIGS. 2A to 2H, and only different portions will be described below.

The structure shown in FIG. 18A is obtained through the above-described steps in FIGS. 2A to 2E. The structure shown in FIG. 18A is identical to that shown in FIG. 2E.

As shown in FIG. 18B, a first polysilicon layer 28 is selectively etched by, e.g., photoethcing. As a result, a gate pattern 28' of the MOSFET constituting a peripheral circuit is formed in a region 104. FIG. 19 is a plan view showing the resultant structure. FIG. 18B is a sectional view taken along a line 18B—18B in FIG. 19. As shown in FIG. 19, in this etching step, cell slits 29 are simultaneously formed.

Figure 18C:
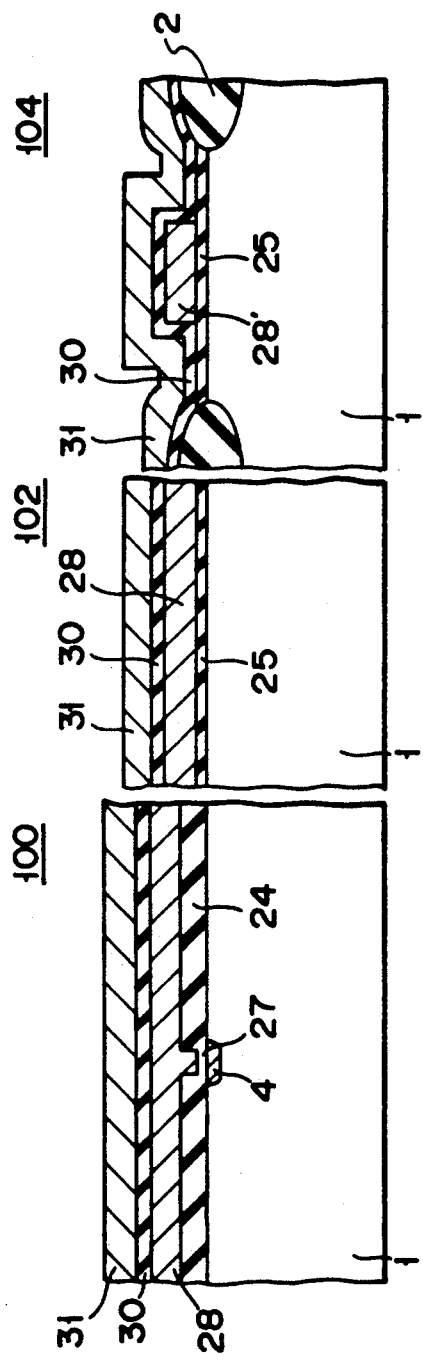
Figure 19:
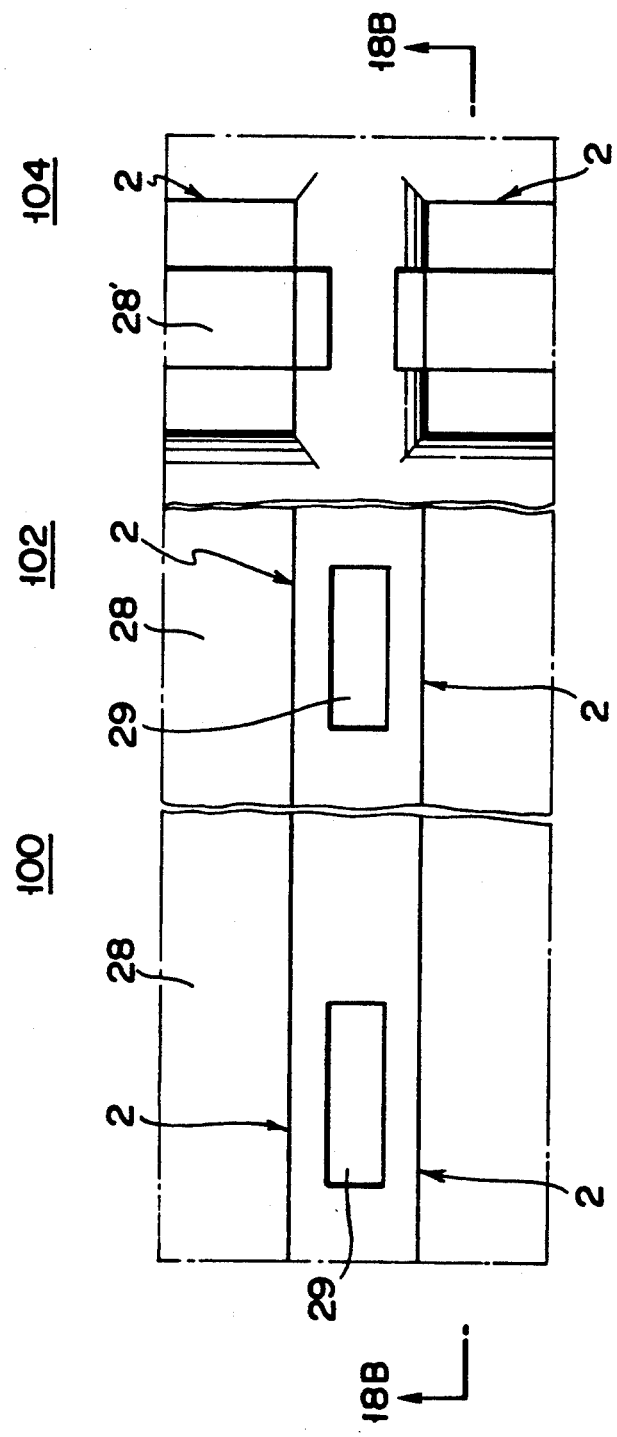
FIG. 19 is a plan view showing the device in the step shown in FIG. 18B.

As shown in FIG. 18C, a fourth thermal oxide film 30 is formed on the upper surfaces of the first polysilicon layer 28 and the gate pattern 28' by, e.g., thermal oxidation. A second polysilicon layer 31 is then formed on the entire surface of the device by, e.g., CVD. Phosphorus is diffused in the second polysilicon layer 31 by, e.g., POCl₃ to render it conductive.

Figure 18D:
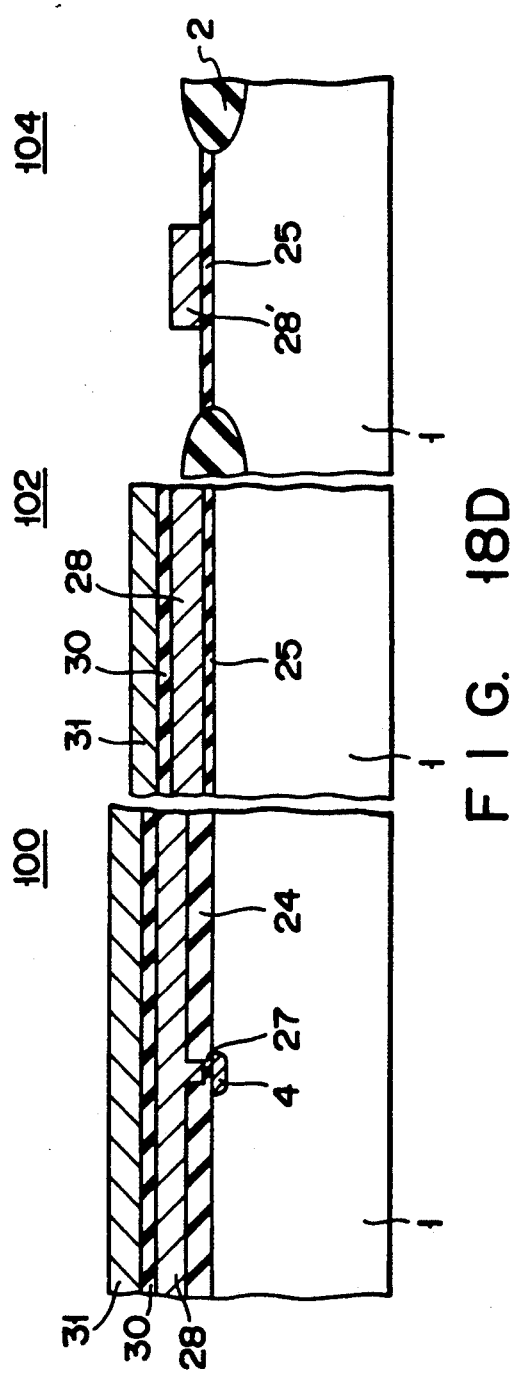

As shown in FIG. 18D, the second polysilicon layer 31 is selectively etched by, e.g., photoethching. With this process, a portion of the second polysilicon layer 31 on the region 104 is removed. At the same time, the second polysilicon layer 31 at an end portion of a select gate (not shown) is selectively removed to form an exposed portion of a first polysilicon layer 28. The portion serves as a region in which a wire is to contact with the gate 8.

Figure 18E:
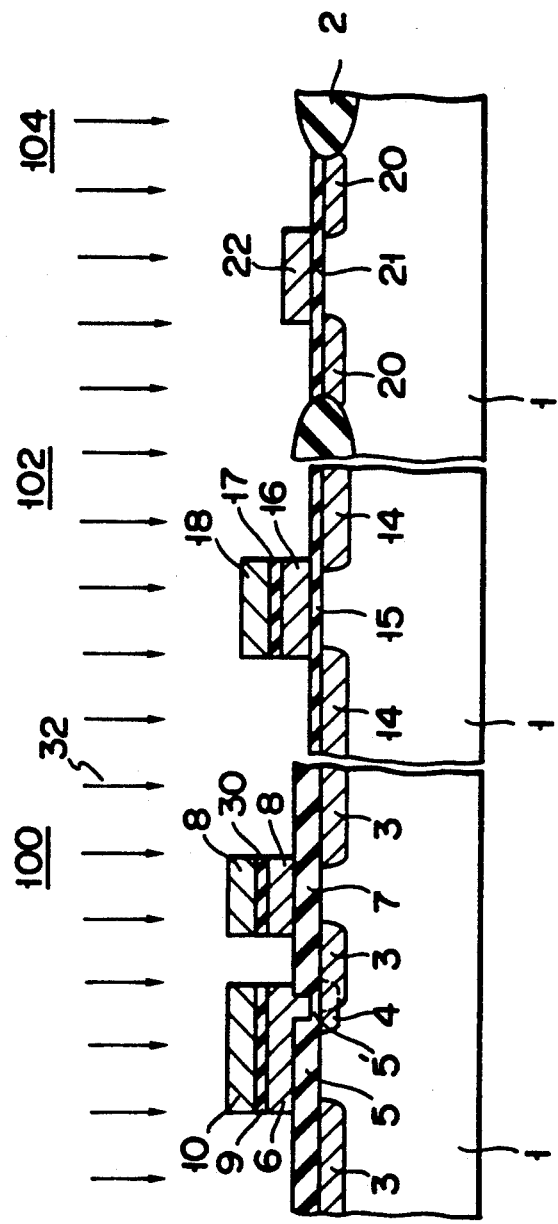

Subsequently, as shown in FIG. 18E, the second polysilicon layer 31, the fourth thermal oxide film 30, and the first polysilicon layer 28 are selectively etched by, e.g., photoetching. As a result, the following films and gates are formed in a region 100: a first insulating film 5 consisting of a first thermal oxide film 24; a tunnel insulating film 5' consisting of a third thermal oxide film 27; the floating gate 6 consisting of the first polysilicon layer 28; a second gate insulating film 9 consisting of fourth thermal oxide film 30; a control gate 10 consisting of the second polysilicon layer 31; ; a gate insulating film 7 consisting of a first thermal oxide film 24; and the select gate 8 consisting of the first polysilicon layer 28. In addition, the second polysilicon layer 8' is formed above the select gate 8. The following films and gates are formed in the region 102: a first gate insulating film 15 consisting of a second thermal oxide film 25; a floating gate 16 consisting of the first polysilicon layer 28; a second gate insulating film 17 consisting of the fourth thermal oxide film 30; and a control gate 18 consisting of the second polysilicon layer 31. A gate insulating film 21 consisting of the second thermal oxide film 25 and a gate 22 consisting of the first polysilicon layer 28 are formed in the region 104.

Since the subsequent steps are the same as those in the manufacturing method described with reference to the first embodiment, a description thereof will be omitted.

With the above-described steps, the semiconductor device according to the seventh embodiment is manufactured.

According to such a manufacturing method, the gate patterns of the select and memory cell transistors can be patterns in the same step.

Figure 20:
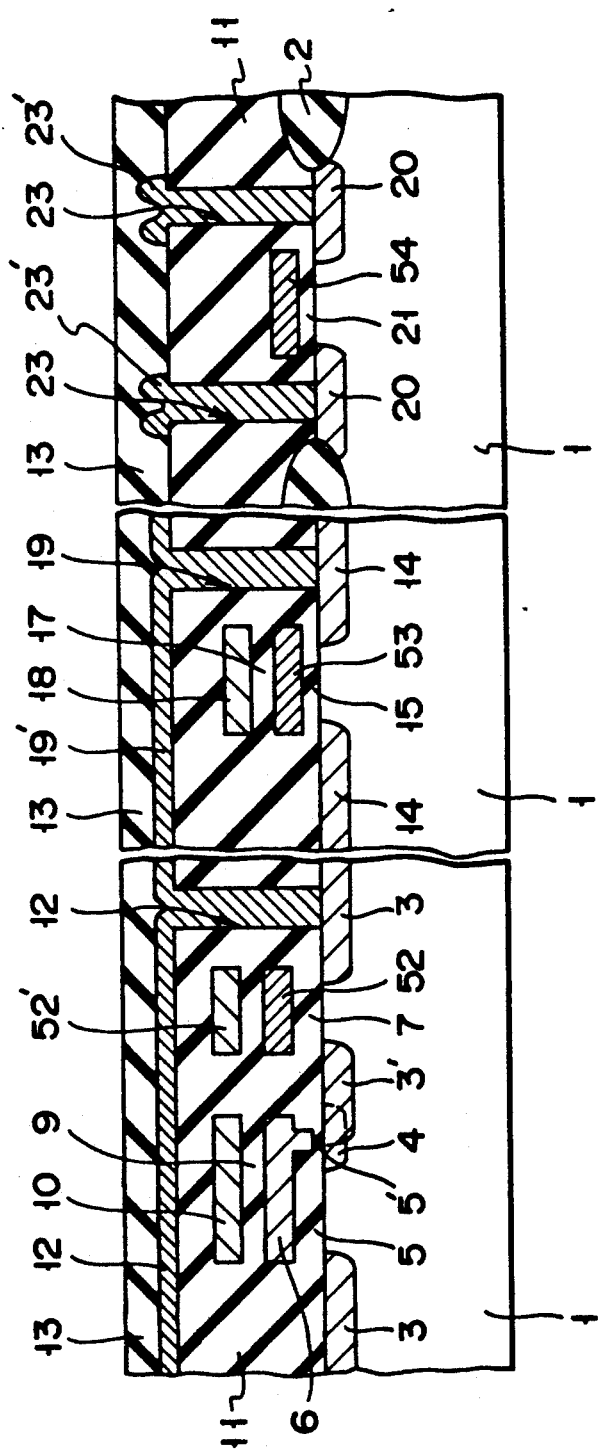
FIG. 20 is a sectional view showing a semiconductor device according to the eighth embodiment of the present invention.

FIG. 20 is a sectional view showing a semiconductor device according to the eighth embodiment of the present invention. The same reference numerals in FIG. 20 denote the same parts as in FIG. 1, and only different portions will be described below.

As shown in FIG. 20, in the semiconductor device according to the eighth embodiment, similar to the seventh embodiment, a second polysilicon layer 52' is left above a select gate 52 to form a stacked select gate. In addition, if the sheet resistances of the respective gates are:

floating gate 6: $\rho s1$
floating gate 53: $\rho s2$
select gate 52: $\rho s3$
gate 54: $\rho s4$
control gate 10: $\rho s5$
control gate 18: $\rho s6$ the respective sheet resistances have the following relationships:

$$\rho s1 \neq \rho s2 \tag{11}$$

$$\rho s2 = \rho s3 = \rho s4 \tag{12}$$

$$\rho s5 = \rho s6 \tag{13}$$

Furthermore, if the relationship of inequality (11) is defined by $$\rho s1 > \rho s2 \tag{14}$$

the reliability of the E²PROM memory cell can be improved as in the fourth embodiment.

A method of manufacturing the semiconductor device according to the eighth embodiment will be described below with reference to FIGS. 21A to 21D. FIGS. 21A to 21D are sectional views showing the steps in manufacturing the semiconductor device according to the eighth embodiment of the present invention. The same reference numerals in FIG. 21A to 21D denote the same parts as in FIGS. 2A to 2H, and only different portions will be described below.

The structure shown in FIG. 21A is obtained through the above-described steps in FIGS. 2A to 2E. The structure shown in FIG. 2A is identical to that shown in FIG. 2E.

As shown in FIG. 21B, a thermal oxide film 55 is formed on the upper surface of a first polysilicon layer 28 by, e.g., thermal oxidation. The thermal oxide film 55 is then selectively removed by, e.g., photoetching. As a result, a portion of the thermal oxide film 55 is left on a surface portion of the first polysilicon layer 28 which serves as a floating gate. Phosphorus is diffused in the first polysilicon layer 28 by, e.g., POCl₃ to render it conductive. At this time, almost no phosphorus is diffused in a portion of the first polysilicon layer 28 under the thermal oxide film 55 because the film 55 serves as a mask for controlling impurity diffusion. With this process, a portion 28-2 having a high impurity concentration and a portion 28 having a low impurity concentration are formed in the first polysilicon layer 28.

Figure 22:
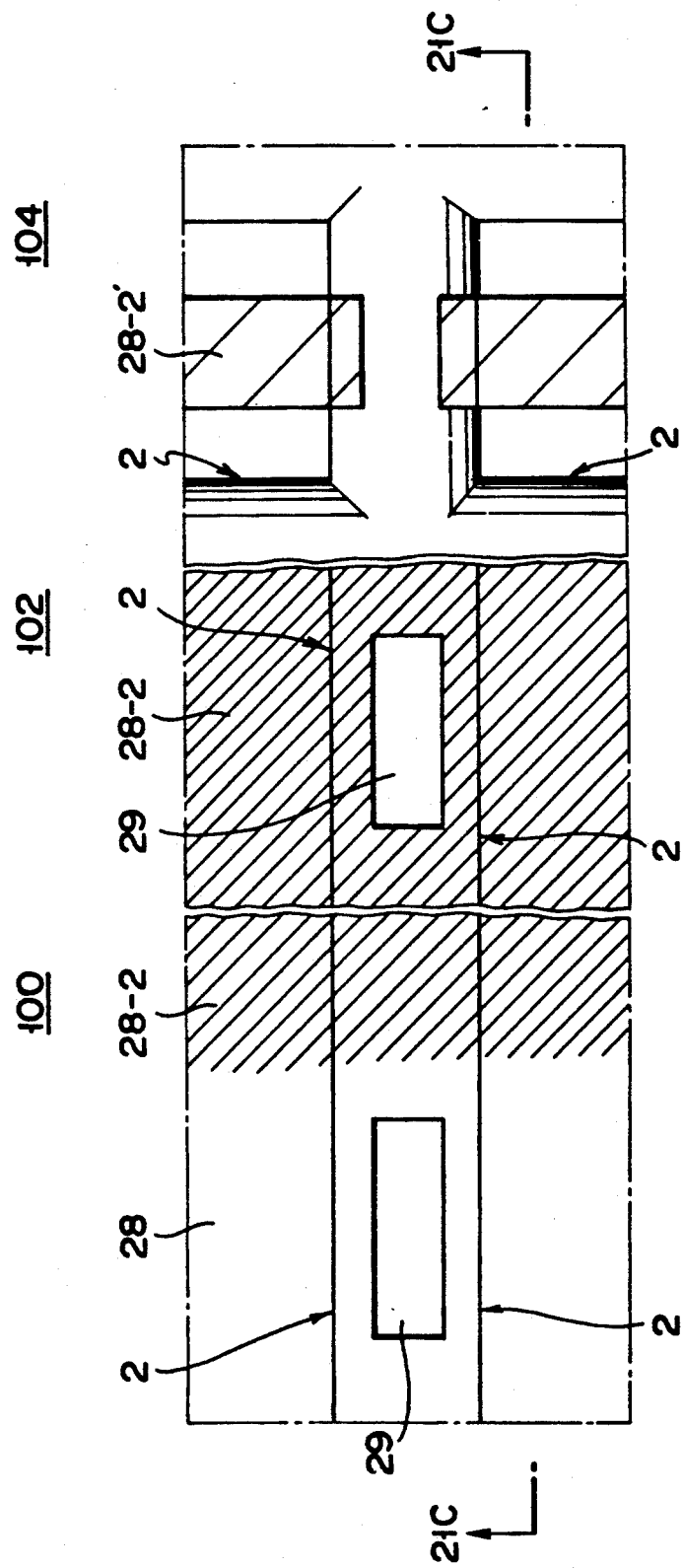
FIG. 22 is a plan view showing the device in the step shown in FIG. 21C.

As shown in FIG. 21C, the first polysilicon layer 28 is selectively etched by, e.g., photoetching. As a result, a gate pattern 28-2' of the MOSFET is formed. FIG. 22 shows the resultant structure. FIG. 21C is a sectional view taken along a line 21C—21C in FIG. 22. When the first polysilicon layer is etched, cell slits 29 are simultaneously formed.

As shown in FIG. 21D, a thermal oxide film 30 is formed on the upper surfaces of the first polysilicon layers 28, 28-2, and 28-2' by, e.g., thermal oxidation. A second polysilicon layer 31 is then formed on the entire upper surface of the device by, e.g., CVD.

Since the subsequent steps are the same as those after the step shown in FIG. 18D, a description thereof will be omitted.

With the above-described steps, the semiconductor device according to the eighth embodiment is manufactured.

According to such a manufacturing method, the gate portions of the select and memory cell transistors can be patterned in the same step. In addition, the sheet resistances of the floating gates 6 and 53 can be set to be different from each other.

Figure 23:
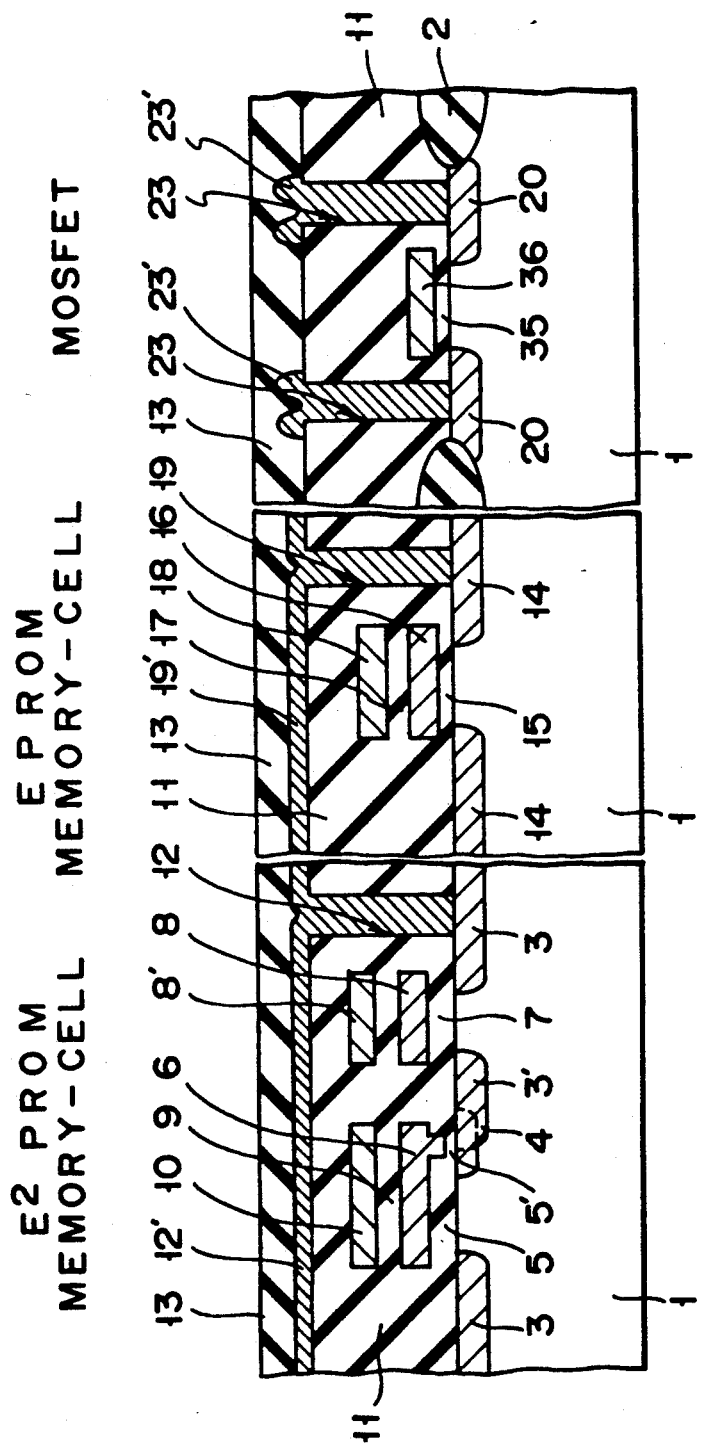
FIG. 23 is a sectional view showing a semiconductor device according to the ninth embodiment of the present invention.

In the eighth embodiment, if the sheet resistance of the first polysilicon layer is represented by $\rho sA$; the sheet resistance of the first polysilicon layer 28-2 in which an impurity is doped is represented by $\rho saA'$; and the sheet resistance of the second polysilicon layer 31 is represented by $\rho sB$, the sheet resistances of the respective conductive members are:

floating gate 6: $\rho sA$
control gate 10: $\rho sB$
select gate 52: $\rho sA'$
floating gate 53: $\rho sA'$
control gate 18: $\rho sB$
gate 54: $\rho sA'$ FIG. 23 is a sectional view showing a semiconductor device according to the ninth embodiment of the present invention. The same reference numerals in FIG. 23 denote the same parts as in FIG. 1, and only different portions will be described below.

As shown in FIG. 23, in the semiconductor device according to the ninth embodiment, similar to the seventh embodiment, a second polysilicon layer 8' is left above a select gate 8 to form a stacked select gate. In addition, if the sheet resistances of the respective gates are:

floating gate 6: $\rho s1$
floating gate 16: $\rho s2$
select gate 8: $\rho s3$
gate 36: $\rho s4$
control gate 10: $\rho s5$
control gate 10: $\rho s5$
control gate 18: $\rho s6$ then, the respective sheet resistances have the following relationships:

$$\rho s1 = \rho s2 = \rho s3 \qquad (14)$$

$$\rho s4 = \rho s5 = \rho s6 \qquad (15)$$

$$\rho s4 \neq \rho s1 \qquad (16)$$

According to the semiconductor device having the above-described arrangement, since a stacked select gate is used, micropatterning of the E²PROM memory cell is facilitated, and the sheet resistance of each of the floating gate 6 and 16 can be set to be smaller than that of the gate 36.

A method of manufacturing the semiconductor device according to the ninth embodiment will be described below with reference to FIGS. 24A to 24E. FIGS. 24A to 24E are sectional views showing the steps in manufacturing the semiconductor device according to the ninth embodiment of the present invention. The same reference numerals in FIGS. 24A to 24E denote the same parts as in FIGS. 2A to 2H, and only different portions will be described below.

A structure shown in FIG. 24A is obtained through the above-described steps in FIGS. 2A to 2E. The structure shown in FIG. 24A is identical to that shown in FIG. 2E.

As shown in FIG. 24B, a first polysilicon layer 28 is selectively etched by, e.g., photoetching. As a result, a portion of the first polysilicon layer 28 on a region 104 is removed. FIG. 25 shows the resultant structure. FIG. 24B is a sectional view taken along a line 24B—24B in FIG. 25. As shown in FIG. 25, when the first polysilicon layer 28 is selectively etched, cell slits 28 are simultaneously formed.

As shown in FIG. 24C, a fourth thermal oxide film 30 is formed on the upper surface of the first polysilicon layer 28 and an exposed surface portion of the substrate 1. The fourth thermal oxide film 30 serves as the second gate insulating films of the E²PROM and EPROM memory cells and the gate insulating film of the MOSFET. A second polysilicon layer 31 is then formed on the entire upper surface of the device by, e.g., CVD. Phosphorus is diffused in the polysilicon layer 31 by, e.g., POCl₃ to render it conductive so as to have a desired sheet resistance $\rho s$.

As shown in FIG. 24D, the second polysilicon layer 31 is selectively etched by, e.g., photoetching. With this process, a gate pattern 31' of the MOSFET is formed in the region 104.

Figure 24E:
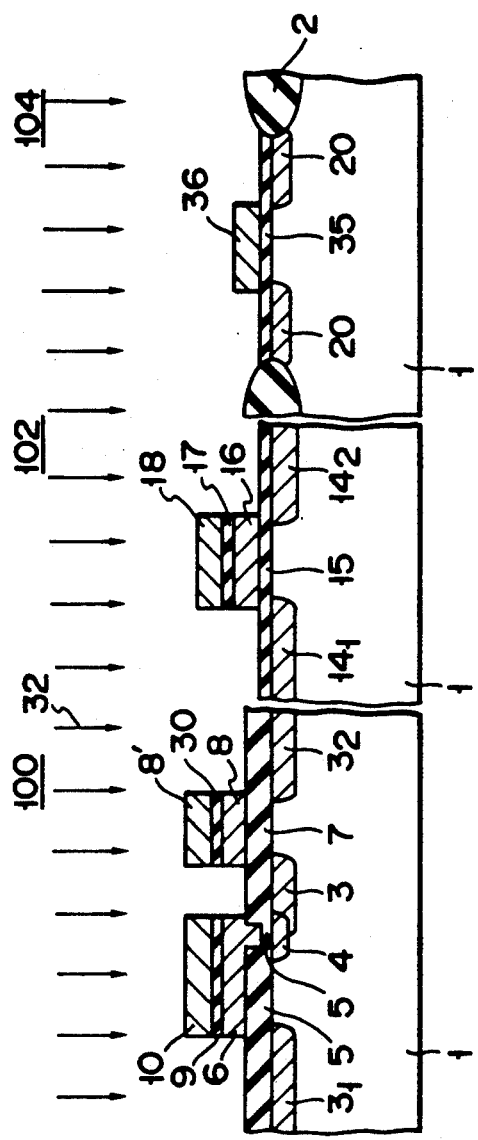
Figure 25:
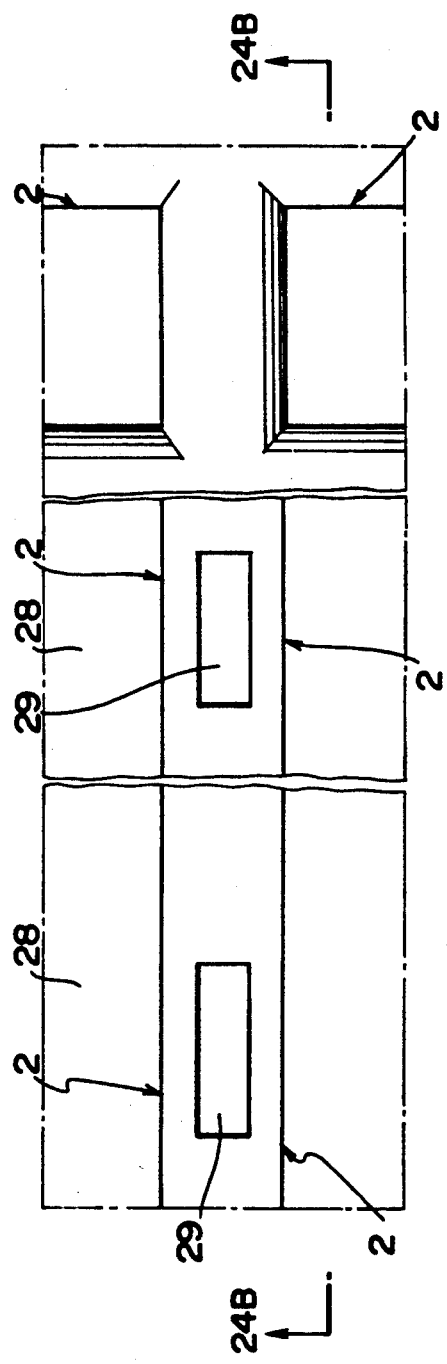
FIG. 25 is a plan view showing the device in the step shown in FIG. 24B.

As shown in FIG. 24E, the second polysilicon layer 31, the fourth thermal oxide film 30, and the first polysilicon layer 28 are selectively etched. As a result, the following films and gates are formed in the region 100: a first gate insulating film 5 consisting of a first thermal oxide film 24; a tunnel insulating film 5' consisting of a third thermal oxide film 27; a floating gate 6 consisting of the first polysilicon layer 28; a second gate insulating film 9 consisting of the fourth thermal oxide film 30; the control gate 10 consisting of the second polysilicon layer 31; a gate insulating film 7 consisting of the first thermal oxide film 24; and the select gate 8 consisting of the first polysilicon layer 28. In addition, the second polysilicon layer 8' is formed above the select gate 8. The following films and gates are formed in the region 102: a first gate insulating film 15 consisting of a second thermal oxide film 25; the floating gate 16 consisting of the first polysilicon layer 28; a second gate insulating film 17 consisting of the fourth thermal oxide film 30; and the control gate 18 consisting of the second polysilicon layer 31. A gate insulating film 35 consisting of the fourth thermal oxide film 30, and the gate 36 consisting of the second polysilicon layer 31' are formed in the region 104.

Since the subsequent steps are the same as those of the manufacturing method described with reference to the first embodiment, a description thereof will be omitted.

With the above-described steps, the semiconductor device according to the ninth embodiment is manufactured.

According to such a manufacturing method, the gate portions of the select and memory cell transistors can be patterned in the same step, and the sheet resistance of each of the floating gates 6 and 16 can be set to be different from that of the gate 36.

Figure 26:
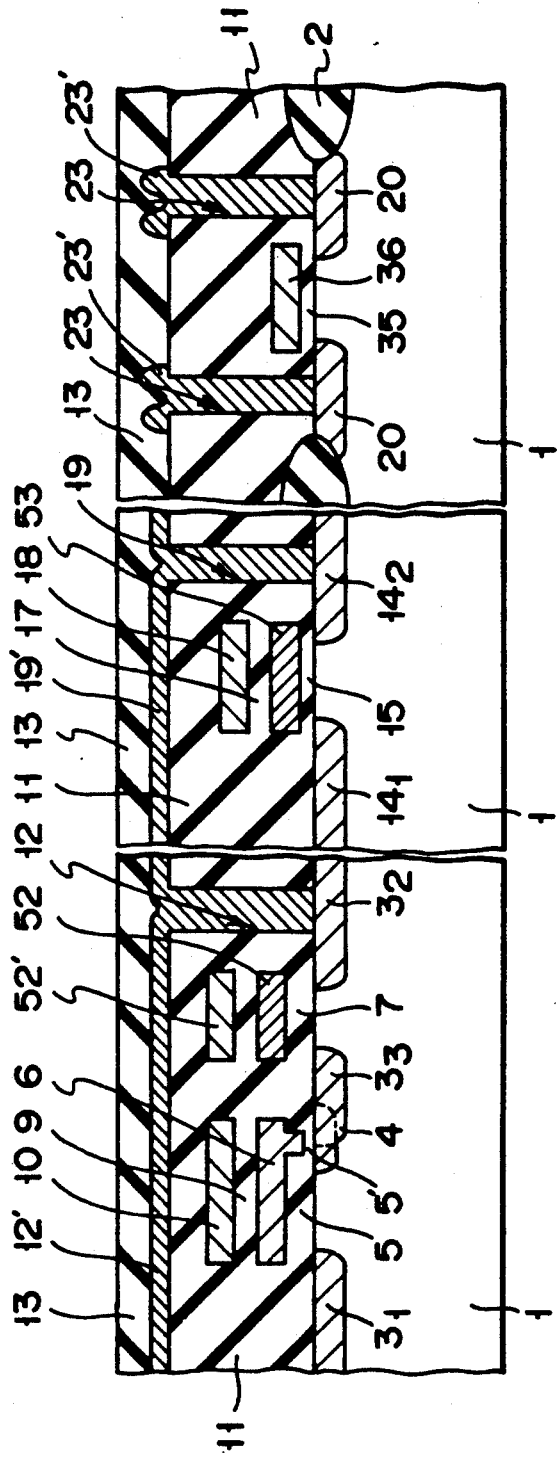
FIG. 26 is a sectional view showing a semiconductor device according to the tenth embodiment of the present invention.

In the ninth embodiment, if the sheet resistances of the first and second polysilicon layers are respectively represented by $\rho sA$ and $\rho sB$, the sheet resistances of the respective conductive layers are:

floating gate 6: $\rho sA$
control gate 10: $\rho sB$
select gate 8: $\rho sA$
floating ate 16: $\rho sA$
control gate 18: $\rho sB$
gate 36: $\rho sB$ FIG. 26 is a sectional view showing a semiconductor device according to the tenth embodiment of the present invention. The same reference numerals in FIG. 26 denote the same parts as in FIG. 1, and only different portions will be described below.

As shown in FIG. 26, in the semiconductor device according to the tenth embodiment, similar to the seventh embodiment, a second polysilicon layer 52' is left above a select gate 52 to form a stacked select gate. In addition, if the sheet resistances of the respective gates are represented as follows:

floating gate g: $\rho s1$
floating gate 53: $\rho s2$
select gate 52: $\rho s3$
gate 36: $\rho s4$
control gate 10: $\rho s5$
control gate 18: $\rho s6$ then, the respective sheet resistances have the following relationships:

$$\rho s1 \neq \rho s2 \quad (17)$$

$$\rho s2 = \rho s3 \quad (18)$$

$$\rho s4 = \rho s5 = \rho s6 \quad (19)$$

Furthermore, if the relationship of inequality (17) is defined by:

$$\rho s1 > \rho s2 \quad (14)$$

then, the reliability of the E²PROM memory cell can be improved as in the fourth embodiment.

A method of manufacturing the semiconductor device according to the tenth embodiment will be described below with reference to FIGS. 27A to 27D. FIGS. 27A to 27D are sectional views showing the steps in manufacturing the semiconductor device according to the tenth embodiment of the present invention. The same reference numerals in FIGS. 27A to 27D denote the same parts as in FIGS. 2A to 2H, and only different portions will be described below.

Figure 27A:
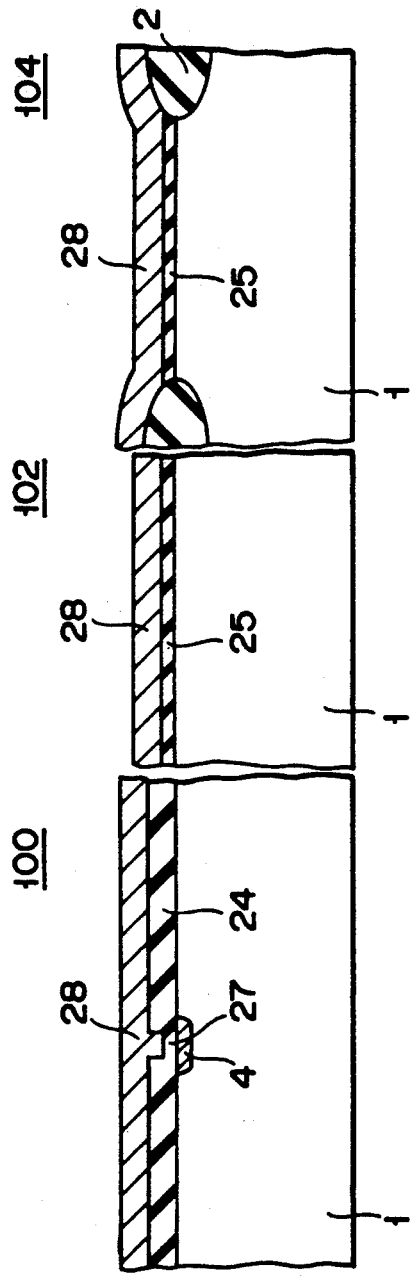

The structure shown in FIG. 27A is obtained through the above-described steps shown in FIGS. 2A to 2E.

The structure shown in FIG. 27A is identical to that shown in FIG. 2E.

Figure 27B:
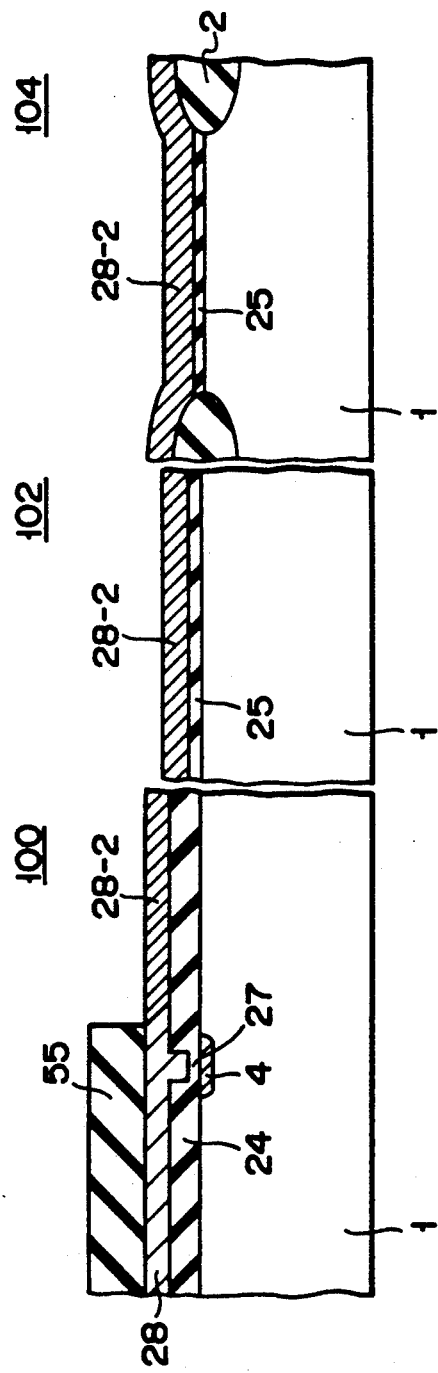

The structure shown in FIG. 27B is obtained through the step shown in FIG. 21B.

Figure 28:
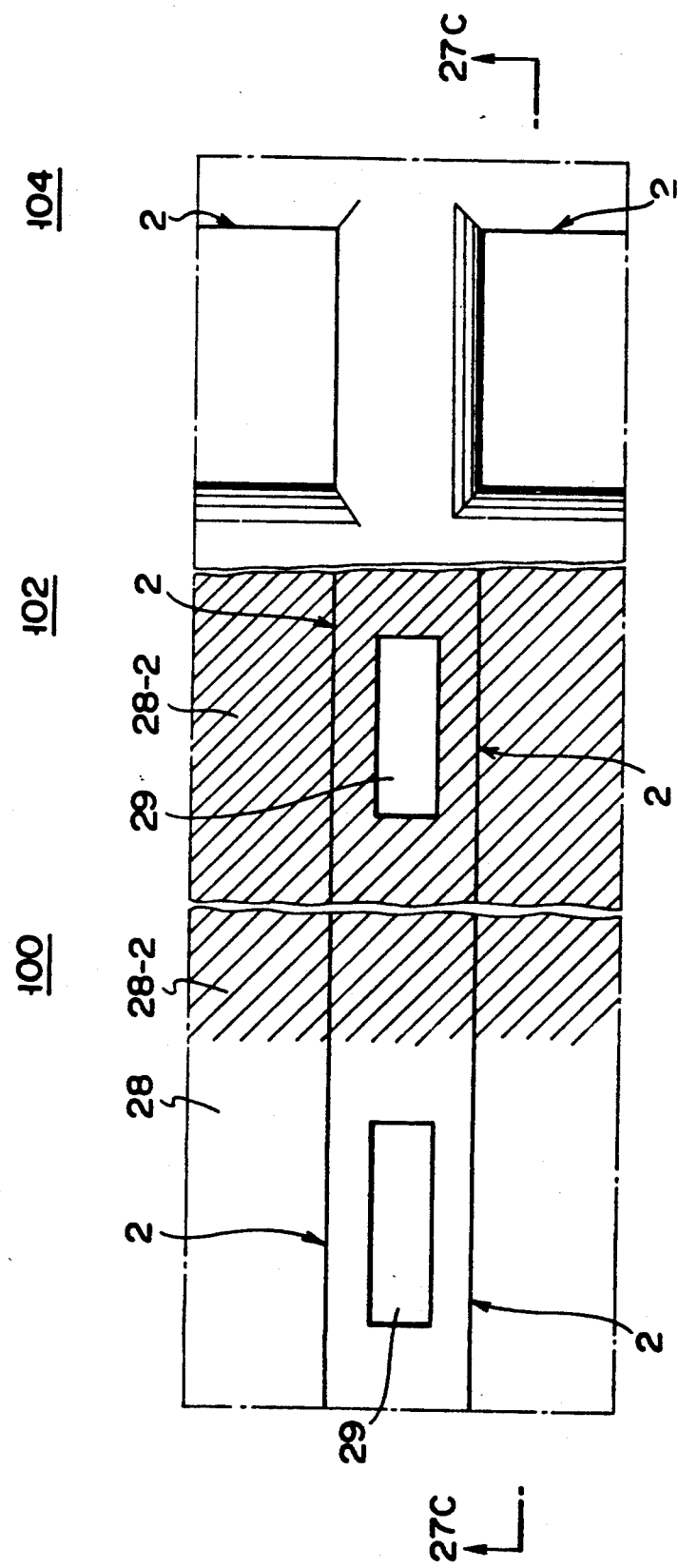
FIG. 28 is a plan view showing the device in the step shown in FIG. 27C.

The structure shown in FIG. 27C is obtained through the step shown in FIG. 24B. FIG. 28 is a plan view showing the resultant structure. FIG. 27C is a sectional view taken along a line 27C—27C in FIG. 28.

The structure shown in FIG. 27D is obtained through the step shown in FIG. 24C.

Since the subsequent steps are the same as those after the step shown in FIG. 21D, a description thereof will be omitted.

With the above-described steps, the semiconductor device according to the tenth embodiment is manufactured.

According to such a manufacturing method, the gate portions of the select and memory cell transistors can be patterned in the same step, and the sheet resistances of the floating gates 6 and 53 can be set to be different from each other. In addition, for example, the sheet resistances of the floating gate 6 and the gate 36 can be set to be different from each other.

Figure 29:
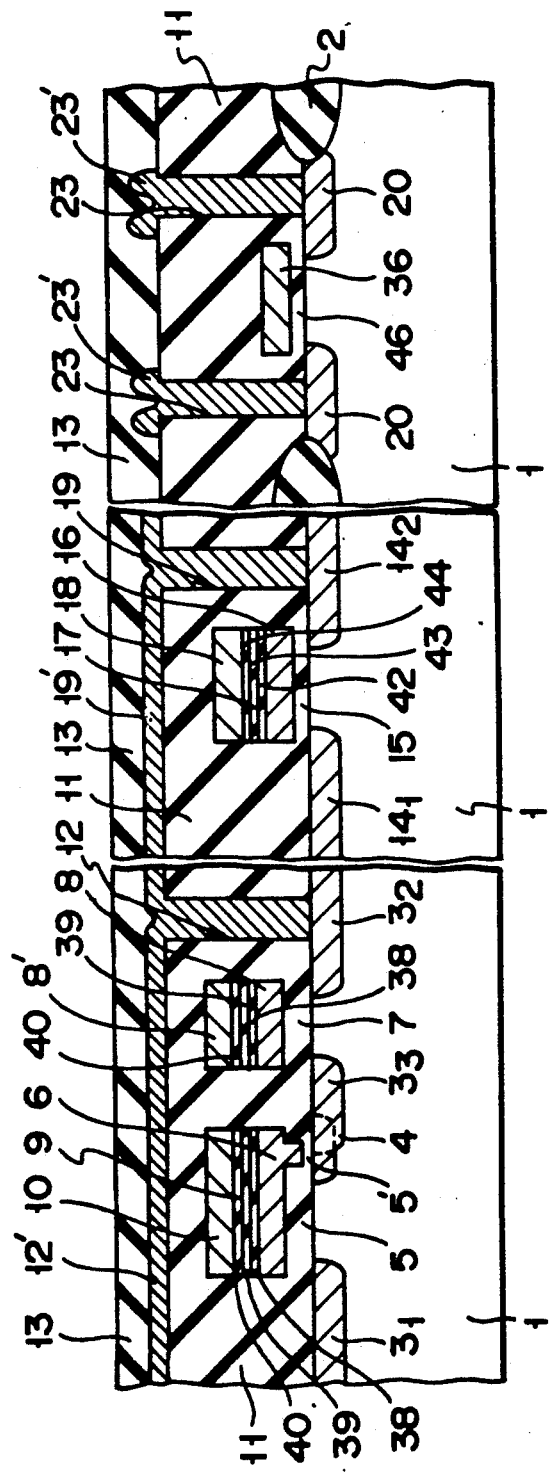
FIG. 29 is a sectional view showing a semiconductor device according to the eleventh embodiment of the present invention.

In the tenth embodiment, if the sheet resistance of the first polysilicon layer is represented by $\rho sA$; the sheet resistance of the first polysilicon layer in which an impurity is doped is represented by $\rho sA'$; and the sheet resistance of the second polysilicon layer is represented by $\rho sB$, the sheet resistances of the respective conductive members are:

floating gate 6: $\rho sA$
control gate 10: $\rho sB$
select gate 52: $\rho sA'$
floating gate 53: $\rho sA'$
control gate 18: $\rho sB$
gate 36: $\rho sB$ FIG. 29 is a sectional view showing a semiconductor device according to the eleventh embodiment of the present invention. The reference numerals in FIG. 29 denote the same parts as in FIG. 1, and only different portions will be described below. As shown in FIG. 29, in the semiconductor device according to the eleventh embodiment, similar to the seventh embodiment, a second polysilicon layer 8' is left above a select gate 8 to form a stacked select gate. In addition, the second gate insulating film of the E²PROM memory cell is constituted by a three-layered film consisting of an oxide film 38, a nitride film 39, and an oxide film 40, and the second gate insulating film of the EPROM memory cell is constituted by a three-layered film consisting of an oxide film 42, a nitride film 43, and an oxide film 44.

Furthermore, in the semiconductor device according to the eleventh embodiment, the sheet resistances of the respective conductive layers have the same relationships as those in the ninth embodiment.

According to the semiconductor device having the above-described arrangement, since the select gate is constituted by the stacked select gate, micropatterning of the E²PROM memory cell is facilitated, and the capacitance between a control gate and a floating gate can be increased.

A method of manufacturing the semiconductor device according to the eleventh embodiment will be described below with reference to FIGS. 30A to 30F. FIGS. 30A to 30F are sectional views showing the steps in manufacturing the semiconductor device according to the eleventh embodiment of the present invention.

The same reference numerals in FIGS. 30A to 30F denote the same parts as in FIG. 2A to 2H, and only different portions will be described below.

The structure shown in FIG. 30A is obtained through the above-described steps shown in FIGS. 2A to 2E. The structure shown in FIG. 30A is identical to that shown in FIG. 2E.

The structure shown in FIG. 30B is obtained through the step shown in FIG. 24B.

As shown in FIG. 30C, a fifth thermal oxide film 47 is formed on the upper surface of the first polysilicon layer 28 and an exposed surface portion of the substrate 1 by, e.g., thermal oxidation. A first nitride film 48 is formed on the entire upper surface of the device. A sixth thermal oxide film 49 is formed on the upper surface of the first nitride film 48 by, e.g., thermal oxidation.

As shown in FIG. 30D, the fifth thermal oxide film 47, the first nitride film 48, and the sixth thermal oxide film 49 are selectively and sequentially etched by, e.g., photoetching. As a result, portions of the fifth thermal oxide film 47, the first nitride film 48, and the sixth thermal oxide film 49 located in the region 104 are removed. Thereafter, a seventh thermal oxide film 51 is formed on the exposed surface portion of the substrate 1 by, e.g., thermal oxidation. The seventh thermal oxide film 51 serves as the gate insulating film of the MOSFET.

As shown in FIG. 30E, a second polysilicon layer 31 is formed on the entire upper surface of the device by, e.g., CVD.

A structure shown in FIG. 30F is obtained through the above-described steps shown in FIGS. 24D to 24E. As a result, the following films and gates are formed in the region 100: a first gate insulating film 5 consisting of a first thermal oxide film 24; a tunnel insulating film 5' consisting of a third thermal oxide film 27; a floating gate 6 consisting of a first polysilicon layer 28; the second gate insulating film consisting of the three-layered film 38, 39, 40; a control gate 10 consisting of a second polysilicon layer 31; a gate insulating film 7 consisting of the first thermal oxide film 24; and the select gate 8 consisting of the first polysilicon layer 28. In addition, the second polysilicon layer 8' is formed above the select gate 8. The following films and gates are formed in the region 102: a first gate insulating film 15 consisting of a second thermal oxide film 25; a floating gate 16 consisting of the first polysilicon layer 28; the second gate insulating film consisting of the three-layered film 38, 39, 40; and a control gate 18 consisting of the second polysilicon layer 31. A gate insulating film 46 consisting of the seventh thermal oxide film 51, and a gate 36 consisting of the second polysilicon layer 31 are formed in the region 104.

Since the subsequent steps are the same as those of the manufacturing method described with reference to the first embodiment, a description thereof will be omitted.

With the above-described steps, the semiconductor device according to the eleventh embodiment is manufactured.

According to such a manufacturing method, the gate portions of the select and memory cell transistors can be patterned in the same step. In addition, the E²PROM and the EPROM can be formed on the same substrate by using, i.e., a three-layered film consisting of oxide and nitride films as a second insulating film between a control gate and a floating gate.

Figure 31:
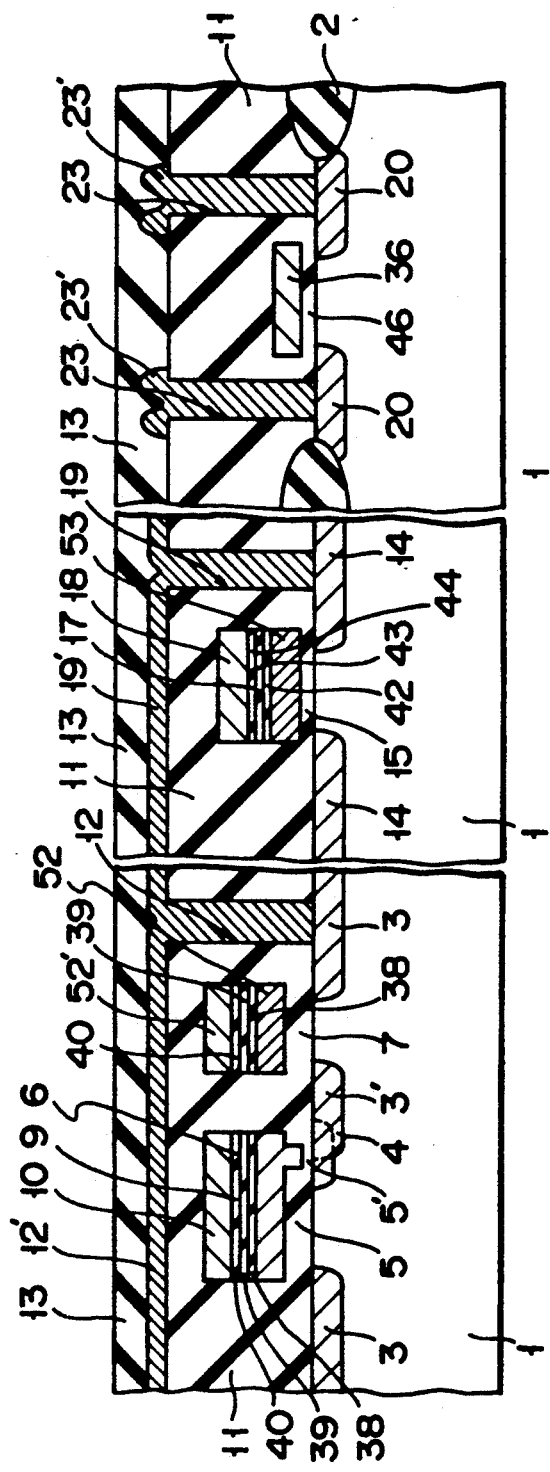
FIG. 31 is a sectional view showing a semiconductor device according to the twelfth embodiment of the present invention.

In the eleventh embodiment, if the sheet resistances of the first and second polysilicon layers are respectively represented by $\rho sA$ and $\rho sB$, the sheet resistances of the respective conductive layers are:
floating gate 6: $\rho sA$
control gate 10: $\rho sB$
select gate 8: $\rho sA$
floating gate 16: $\rho sA$
control gate 18: $\rho sB$
gate 36: $\rho sB$ FIG. 31 is a sectional view showing a semiconductor device according to the twelfth embodiment of the present invention. The same reference numerals in FIG. 31 denote the same parts as in FIG. 1, and only different portions will be described below.

As shown in FIG. 31, similar to the seventh embodiment, in the semiconductor device according to the twelfth embodiment, a second polysilicon layer 52' is left above a select gate 52 to form a stacked select gate. In addition, the second gate insulating film of the E²PROM memory cell is constituted by a three-layered film consisting of an oxide film 38, a nitride film 39, and an oxide film 40, and the second gate insulating film of the EPROM memory cell is constituted by a three-layered film consisting of an oxide film 42, a nitride film 43, and an oxide film 44.

In the semiconductor device according to the twelfth embodiment, the sheet resistances of the respective conductive layers have the same relationships as those in the tenth embodiment.

According to the semiconductor device having the above-described arrangement, in addition to the advantage that micropatterning of the E²PROM memory cell is facilitated, the capacitance between a control gate and a floating gate can be increased. By setting the sheet resistance of a floating gate 53 to be larger than that of a floating gate 6, the reliability of the E²PROM memory cell can be improved as in the fourth embodiment.

A method of manufacturing the semiconductor device according to the twelfth embodiment will be described below with reference to FIGS. 32A to 32D. FIGS. 32A to 32D are sectional views showing the steps for manufacturing the semiconductor device according to the twelfth embodiment of the present invention. The same reference numerals in FIGS. 32A to 32D denote the same parts as in FIGS. 2A to 2H, and only different portions will be described below.

Figure 32A:
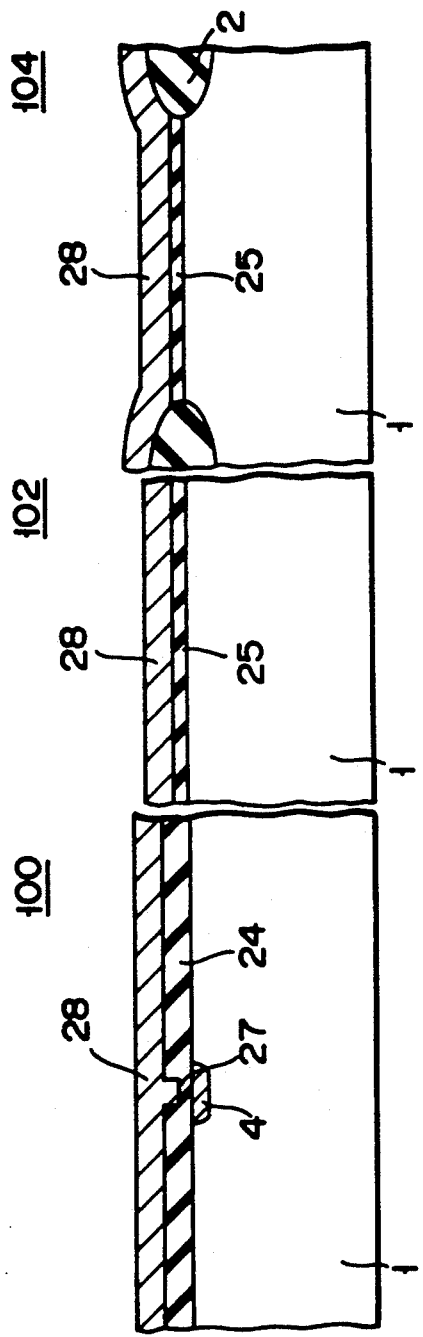

The structure shown in FIG. 32A is obtained through the above-described steps in FIGS. 2A to 2E. The structure shown in FIG. 32A is identical to that shown in FIG. 2E.

Figure 32B:
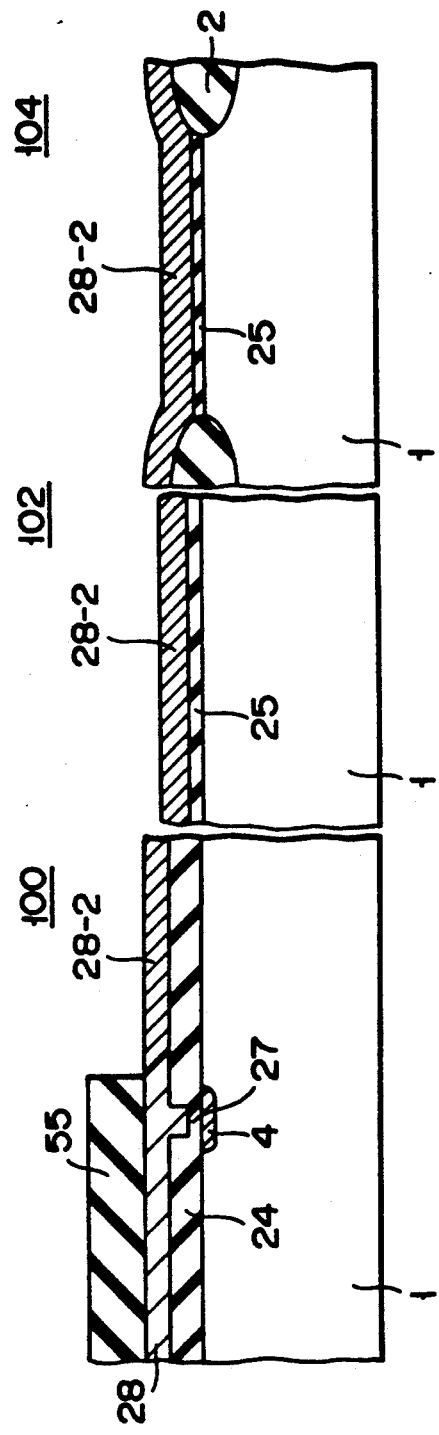

The structure shown in FIG. 32B is obtained through the step shown in FIG. 27B.

The structure shown in FIG. 32C is obtained through the step in FIG. 30B.

The structure shown in FIG. 32D is obtained through the step shown in FIG. 30C.

Since the subsequent steps are the same as those after the step in FIG. 30D, a description thereof will be omitted.

With the above-described steps, the semiconductor device according to the twelfth embodiment is manufactured.

According to such a manufacturing method, the gate portions of the select and memory cell transistors can be patterned in the same step. In addition, the E²PROM and EPROM can be formed on the same substrate by using, e.g., a three-layered film consisting of oxide and nitride films as a second gate insulating film between a control gate and a floating gate. Moreover, the sheet resistances of a floating gate 6 and of a gate 36 can be set to be different from each other.

In the twelfth embodiment, if the sheet resistance of the first polysilicon layer is represented by $psA$; the sheet resistance of the first polysilicon layer in which an impurity is doped is represented by $psA'$; and the sheet resistance of the second polysilicon layer is represented by $psB$, the sheet resistances of the respective conductive members are:

floating gate 6: $psA$
control gate 10: $psB$
select gate 52: $psA'$
floating gate 53: $psA'$
control gate 18: $psB$
gate 36: $psB$ Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type having a major surface;
   first, second, third, and fourth semiconductor regions of a second conductivity type which are separately formed in the major surface of said substrate;
   first carrier storage means, formed above said substrate between said first and second semiconductor regions, for storing carriers;
   first insulating means, formed between said first carrier storage means and said substrate, for electrically insulating said first carrier storage means from said substrate;
   a first conductive layer formed above said first carrier storage means and having a sheet resistance of $psA$;
   second insulating means, formed between said first conductive layer and said first carrier storage means, for insulating said first conductive layer from said first carrier storage means;
   second carrier storage means, formed above said substrate between said third and fourth semiconductor regions and formed above said fourth semiconductor region so as to partly overlap said fourth semiconductor region, for storing carriers;
   third insulating means, formed between said second carrier storage means, said substrate, and said fourth semiconductor region, for electrically insulating said second carrier storage means from said substrate and from said fourth semiconductor region;
   a second conductive layer formed above said second carrier storage means and having a sheet resistance of $psB$;
   fourth insulating means, formed between said second conductive layer and said second carrier storage means, for insulating said second conductive layer from said second carrier storage means; and
   tunneling means, formed between said fourth semiconductor region and said second carrier storage means, for causing carriers to tunnel between said second carrier storage means and said fourth semiconductor region,
   wherein said first carrier storage means consists of a third conductive layer having a sheet resistance of $psC$, and said second carrier storage means consists of a fourth conductive layer having a sheet resistance of $psD$, wherein a relationship between the sheet resistance $psC$ and the sheet resistance $psD$ is presented by $$psC \neq psD.$$

2. A device according to claim 1, wherein each of said first, second, third, and fourth insulating means consists of an insulating film, and said tunneling means consists of an insulating film having a thickness smaller than that of an insulating film constituting said third insulating means.

3. A device according to claim 2, wherein an insulating film constituting said second and fourth insulating means is an insulating film obtained by stacking an oxide film and a nitride film.

4. A device according to claim 1, wherein a relationship between the sheet resistance $psA$ and the sheet resistance $psB$ is represented by $$psA = psB.$$

5. A device according to claim 1, wherein a relationship between the sheet resistance $psC$ and the sheet resistance $psD$ is represented by $$psC < psD.$$

6. A device according to claim 1, further comprising:
   a fifth semiconductor region of the second conductivity type arranged near said fourth semiconductor region and formed in the major surface region of said substrate so as to be separated from said fourth semiconductor region;
   a fifth conductive layer formed above said substrate between said fourth and fifth semiconductor regions and having a sheet resistance of $psE$; and
   fifth insulating means, formed between said fifth conductive layer and said substrate, for electrically insulating said fifth conductive layer from said substrate.

7. A device according to claim 6, wherein said fifth insulating means consists of an insulating film.

8. A device according to claim 6,
   wherein a relationship between the sheet resistance $psA$, the sheet resistance $psB$, and the sheet resistance $psE$ is represented by $$psA = psB = psE.$$

9. A device according to claim 6,
   wherein a relationship between the sheet resistance $psC$, and the sheet resistance $psD$ is represented by $$psC < psD.$$

10. A device according to claim 9,
    wherein a relationship between the sheet resistance $psC$ and the sheet resistance $psE$ is represented by $$psC = psE.$$

11. A device according to claim 6, further comprising:

sixth and seventh semiconductor regions of the second conductivity type formed in the major surface of said substrate and separated from each other;

a sixth conductive layer formed above said substrate between said sixth and seventh semiconductor regions and having a sheet resistance of $\rho sF$; and sixth insulating means, formed between said sixth conductive layer and said substrate, for insulating said sixth conductive layer from said substrate.

12. A device according to claim 11, wherein said sixth insulating means consists of an insulating film.

13. A device according to claim 11,
wherein a relationship between the sheet resistance $\rho sA$, the sheet resistance $\rho sB$, the sheet resistance $\rho sE$, and the sheet resistance $\rho sF$ is represented by $$\rho sA = \rho sB = \rho sE = \rho sF.$$

14. A device according to claim 11,
wherein a relationship between the sheet resistance $\rho sC$ and the sheet resistance $\rho sD$ is represented by $$\rho sC < \rho sD.$$

15. A device according to claim 14,
wherein a relationship between the sheet resistance $\rho sC$, the sheet resistance $\rho sE$, and the sheet resistance $\rho sF$ is represented by $$\rho sC = \rho sE = \rho sF.$$

16. A semiconductor device comprising:
a semiconductor substrate of a first conductivity type having a major surface;
first, second, third, and fourth semiconductor regions of a second conductivity type which are separately formed in the major surface of said substrate;
first carrier storage means, formed above said substrate between said first and second semiconductor regions for storing carriers, said first carrier storage means comprising a first conductive layer having a sheet resistance of $\rho sA$;
first insulating means, formed between said first carrier storage means and said substrate, for electrically insulating said first carrier storage means from said substrate;
a second conductive layer formed above said first carrier storage means and having a sheet resistance of $\rho sB$;
second insulating means, formed between said second conductive layer and said first carrier storage means, for insulating said second conductive layer from said first carrier storage means;
second carrier storage means, formed above said substrate, between said third and fourth semiconductor regions and above said fourth semiconductor region to partly overlap said fourth semiconductor region, for storing carriers, said second carrier storage means comprising a third conductive layer having a sheet resistance of $\rho sC$;
third insulating means, formed between said second carrier storage means, said substrate, and said fourth semiconductor region, for electrically insulating said second carrier storage means from said substrate and said fourth semiconductor region;
a fourth conductive layer formed above said second carrier storage means and having a sheet resistance of $\rho sD$;

fourth insulating means, formed between said fourth conductive layer and said second carrier storage means, for insulating said fourth conductive layer from said second carrier storage means;
tunneling means, formed between said fourth semiconductor region and said second carrier storage means, for causing carriers to tunnel between said second carrier storage means and said fourth semiconductor region;
a fifth semiconductor region of the second conductivity type arranged near said fourth semiconductor region and formed in the major surface of said semiconductor substrate so as to be separated from said fourth semiconductor region;
a fifth conductive layer formed above said substrate between said fourth and fifth semiconductor regions and having a sheet resistance of $\rho sE$;
fifth insulating means, formed between said fifth conductive layer and said substrate, for electrically insulating said fifth conductive layer from said substrate;
a sixth conductive layer formed above said fifth conductive layer; and
a sixth insulating means, formed between said fifth conductive layer and said sixth conductive layer for insulating said sixth conductive layer from said fifth conductive layer,
wherein said sixth conductive layer has the same sheet resistance as each of the sheet resistances of said second conductive layer and said fourth conductive layer.

17. A device according to claim 16, wherein each of said first, second, third, fourth, fifth, and sixth insulating means consists of an insulating film, and said tunneling means consists of an insulating film having a thickness smaller than a thickness of the insulating film comprising said third insulating means.

18. A device according to claim 17, wherein the insulating film comprising said second, fourth, and sixth insulating means is an insulating film obtained by stacking an oxide film and a nitride film.

19. A device according to claim 16, wherein a relationship between the sheet resistance $\rho sA$ and the sheet resistance $\rho sC$ is represented by $$\rho sA \neq \rho sC.$$

20. A device according to claim 19, wherein a relationship between the sheet resistance $\rho sA$ and the sheet resistance $\rho sC$ is represented by $$\rho sA < \rho sC.$$

21. A device according to claim 20,
wherein a relationship between the sheet resistance $\rho sA$ and the sheet resistance $\rho sE$ is represented by $$\rho sA = \rho sE.$$

22. A device according to claim 16, further comprising:
sixth and seventh semiconductor regions of the second conductivity type formed in the major surface of said substrate to be separated from each other;
a seventh conductive layer formed above said substrate between said sixth and seventh semiconductor regions and having a sheet resistance of $\rho sF$; and seventh insulating means, formed between said seventh conductive layer and said substrate, for insulating said seventh conductive layer from said substrate.

23. A device according to claim 22, wherein said seventh insulating means comprises an insulating film.

24. A device according to claim 22, wherein a relationship between the sheet resistance $\rho sA$ and the sheet resistance $\rho sC$ is represented by $$\rho sA \neq \rho sC.$$

25. A device according to claim 24, wherein a relationship between the sheet resistance $\rho sB$, the sheet resistance $\rho sD$, and the sheet resistance $\rho sF$ is represented by $$\rho sB = \rho sD = \rho sF.$$

26. A device according to claim 24, wherein a relationship between the sheet resistance $\rho sA$ and the sheet resistance $\rho sC$ is represented by $$\rho sA < \rho sC.$$

27. A device according to claim 26, wherein a relationship between the sheet resistance $\rho sA$, the sheet resistance $\rho sE$, and the sheet resistance $\rho sF$ is represented by $$\rho sA = \rho sE = \rho sF.$$

* * * * *

UNITED STATES PATENT AND TRADEMARK OFFICE
CERTIFICATE OF CORRECTION

PATENT NO. : 5,200,636
DATED : April 06, 1993
INVENTOR(S) : Teru Uemura et al.

It is certified that error appears in the above-indentified patent and that said Letters Patent is hereby corrected as shown below:

Claim 1, column 26, line 7, change "presented" to --represented--.

Signed and Sealed this

Nineteenth Day of April, 1994

BRUCE LEHMAN

Attest:

Attesting Officer

Commissioner of Patents and Trademarks